United States Patent
Hudson et al.

(10) Patent No.: US 12,400,161 B2
(45) Date of Patent: Aug. 26, 2025

(54) FIELD DEVELOPMENT SYSTEM

(71) Applicant: Schlumberger Technology Corporation, Sugar Land, TX (US)

(72) Inventors: Nicholas Hudson, Winchester (GB); Krzysztof Sitkowski, Abingdon (GB); Daniel Lucas-Clements, Faringdon (GB); Patricia Alejandra Fleitas Calzadilla, Abingdon (GB); Gary W. Sams, Spring, TX (US); Hooi Hong Pearl Kuan, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 18/469,197

(22) Filed: Sep. 18, 2023

(65) Prior Publication Data

US 2024/0095429 A1   Mar. 21, 2024

Related U.S. Application Data

(60) Provisional application No. 63/407,697, filed on Sep. 18, 2022.

(51) Int. Cl.
*G06Q 10/0631* (2023.01)
*G06Q 10/06* (2023.01)
(Continued)

(52) U.S. Cl.
CPC ....... *G06Q 10/06313* (2013.01); *G06Q 10/06* (2013.01); *G06Q 10/067* (2013.01); *G06Q 50/02* (2013.01); *G06F 30/28* (2020.01)

(58) Field of Classification Search
CPC .......... G06Q 10/06313; G06Q 10/067; G06Q 50/02; G06Q 10/06; G06F 30/28
See application file for complete search history.

(56) References Cited

U.S. PATENT DOCUMENTS

2015/0368566 A1* 12/2015 Young .................... C10L 3/106
700/273
2016/0321756 A1* 11/2016 Vreeburg ............... G06Q 40/02
(Continued)

OTHER PUBLICATIONS

Gravdal, et al., A New Approach to Development and Validation of Artificial Intelligence Systems for Drilling, 2020 15th IEEE Conference on Industrial Electronics and Applications (ICIEA), pp. 302-307 (2020) (Year: 2020).*
(Continued)

*Primary Examiner* — Charles Guiliano
(74) *Attorney, Agent, or Firm* — Jeffrey D. Frantz

(57) ABSTRACT

A method can include generating equipment specifications for a facility project at a field site by simulating physical phenomena using one or more computational simulators; using the equipment specifications and a computational facility planner system, generating a work breakdown structure for the facility project, where the work breakdown structure represents activities to be performed to deliver a defined scope of the facility project within a defined time; rendering a graphical user interface to a display that includes graphical controls for dependencies of the activities and equipment characterized by the equipment specifications; responsive to input received via one or more of the graphical controls, automatically updating at least durations of the activities; and, based at least in part on the updating, generating an optimal scenario for the facility project.

19 Claims, 39 Drawing Sheets

(51) Int. Cl.
*G06Q 10/067* (2023.01)
*G06Q 50/02* (2024.01)
*G06F 30/28* (2020.01)

(56) References Cited

U.S. PATENT DOCUMENTS

| | | | | |
|---|---|---|---|---|
| 2019/0390547 | A1* | 12/2019 | Pietrzyk | G05B 15/02 |
| 2020/0202060 | A1* | 6/2020 | Thakur | E21B 43/16 |
| 2022/0276222 | A1* | 9/2022 | Beal | G01N 33/0031 |
| 2022/0341309 | A1* | 10/2022 | Braniff | E21B 44/00 |
| 2023/0077807 | A1* | 3/2023 | Chidambaram | H02J 3/14 |
| | | | | 700/295 |

OTHER PUBLICATIONS

Allen, David T., et al., "Methane Emissions from Process Equipment at Natural Gas Production Sites in the United States: Pneumatic Controllers." Environmental Science & Technology. 2015. vol. 49, pp. 633-640.

R.E.H. Sims, R.N. Schock, A. Adegbululgbe, J. Fenhann, I. Konstantinaviciute, W. Moomaw, H.B. Nimir, B. Schlamadinger, J. Torres-Martinez, C. Turner, Y. Uchiyama, S.J.V. Vuori, N. Wamukonya, X. Zhang, 2007: Energy supply. In Climate Change 2007: Mitigation. Contribution of Working Group III to the Fourth Assessment Report of the Intergovernmental Panel on Climate Change [B. Metz, O.R. Davidson, P.R. Bosch, R. Dave, L.A. Meyer (eds)], Cambridge University Press, Cambridge, United Kingdom and New York, NY, USA.

"Market Snapshot: How much CO2 do electric vehicles, hybrids and gasoline vehicles emit?" Canada Energy Regulator. Available at: https://www.cer-rec.gc.ca/en/data-analysis/energy-markets/market-snapshots/2018/market-snapshot-how-much-co2-do-electric-vehicles-hybrids-gasoline-vehicles-emit.html.

Greenhouse Gases Equivalencies Calculator—Calculations and References. US Environmental Protection Agency. Dec. 5, 2024. Available at: https://www.epa.gov/energy/greenhouse-gas-equivalencies-calculator-calculations-and-references.

GRI 305: Emissions 2016. Available at: https://transparencylab.org/Documentation/Advocacy,%20Monitoring,%20Sustainable%20-%20Responsible%20Initiatives/Global%20Reporting%20Initiative/GRI%20305%20Emissions_2016.pdf.

"Scope 1 & 2 GHG Inventory Guidance." Innovation Center for U.S. Dairy. Nov. 2019. Available at: https://www.usdairy.com/getmedia/06f5bc66-ed7a-416f-90aa-ce2944711d9d/scope-1-2-guidance_handbook_2019_final.pdf?ext=.pdf.

Thoma, E.D., Deshmukh, P., Logan, R., Stovern, M., Dresser, C. and Brantley, H.L. (2017) Assessment of Uinta Basin Oil and Natural Gas Well Pad Pneumatic Controller Emissions. Journal of Environmental Protection, 8, 394-415. https://doi.org/10.4236/jep.2017.84029.

SLB, Brochure, Facility Planner on Delfi, (2023), 23-MPS-1605575 (1 page).

* cited by examiner

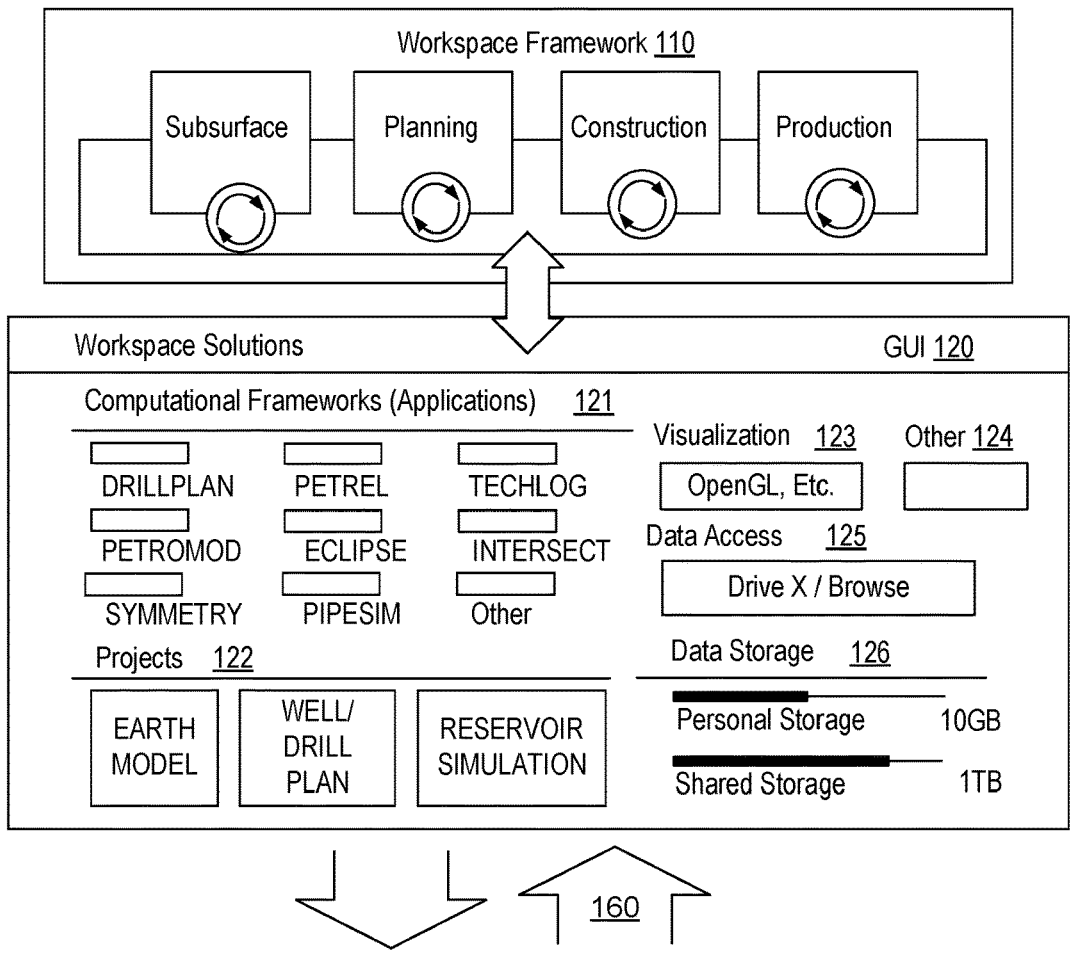
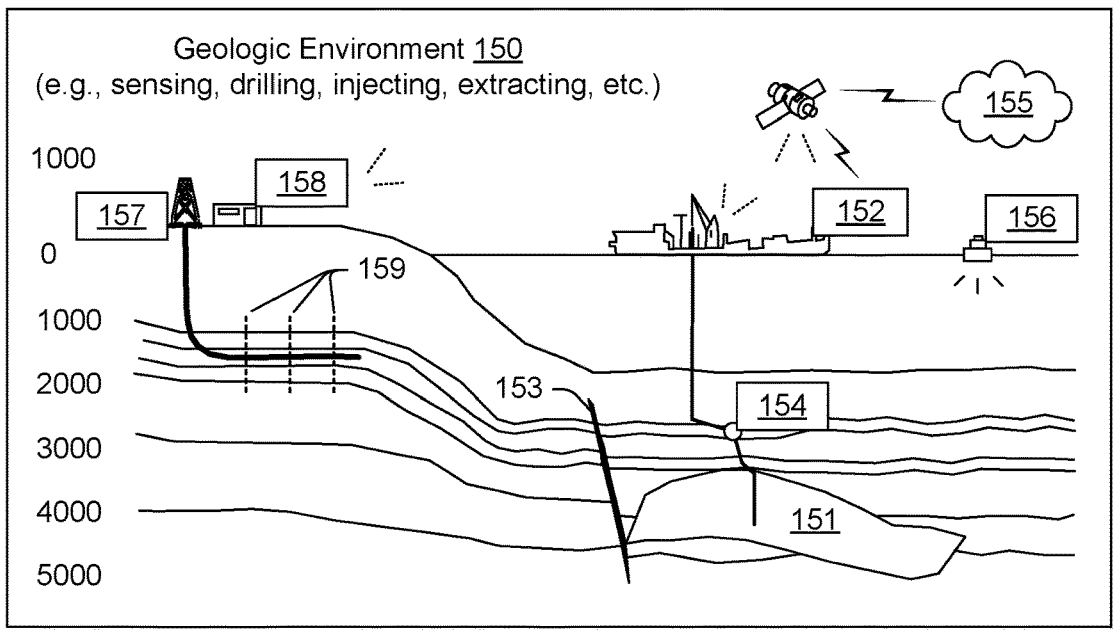
FIG. 1

FIG. 6

710
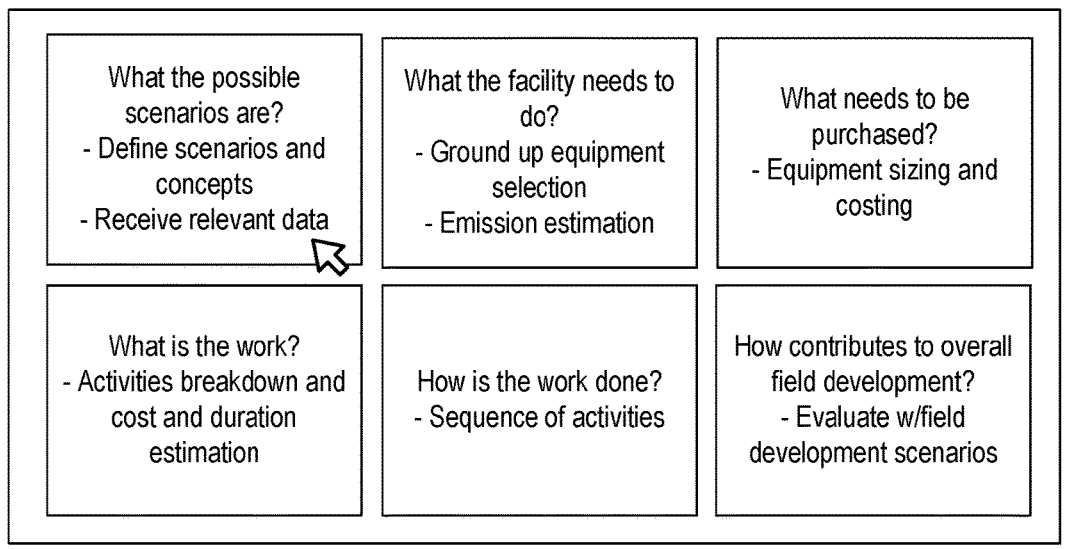
720
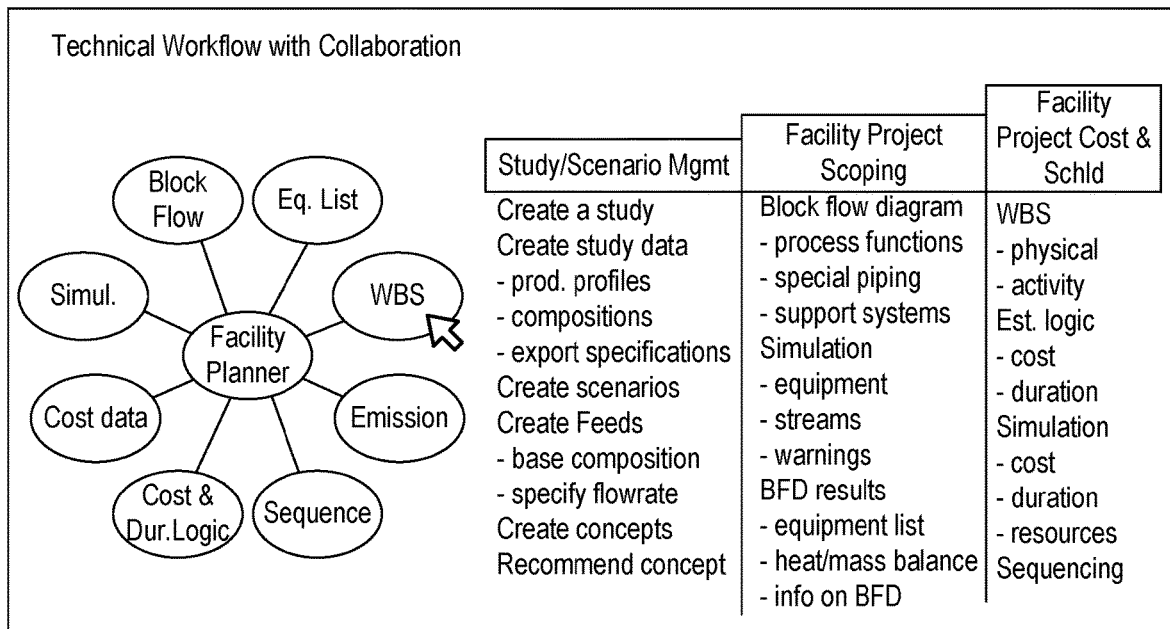
FIG. 7

Edit Cost Logic - Construction 1200 ✕

Activity Type: Construction
Location: Brazil

All Inclusive◯⬤Bulks and Labor

All Inclusive Cost
⦿ % of dependency
[ 267.5                                    % ]
◯ Specify Cost
[                                        USD ]

Cost Factors                                                 ⌄

Activity Cost Breakdown          Labor Cost Parameters
                                                ⓘ
| Bulk Materials | 43.6 % | ⓘ | 🗑 |         Cost per resource hour (Brazil) ⓘ  [ 90 ]
| Direct Labor | 41.3 % | ⓘ | 🗑 |                                           Default
| All inclusive rates | 6 % | ⓘ | 🗑 |       Productivity factor (Brazil) ⓘ  [ 1 ]
| General costs | 2.8 % | ⓘ | 🗑 |                                           Default
| Indirect Labor | 3.7 % | ⓘ | 🗑 |          Resource hours (Brazil) ⓘ  [ 4603229 ]
| Land based plant and eq... | 2.6 % | ⓘ | 🗑 |   Run the calculation to populated results
[                              ▽ ]
Normalize         [ 100 % ]

[Cancel] [Save]

| | Type to search | Cost USD | Duration Weeks |
|---|---|---|---|
| | ∧ Onshore Facility | 117,859,623.6 | 104 |
| | Management | 4,940,000 | 104 |
| | Engineering and procurement | 12,340,000 | 45 |
| | ∧ Equipment and Bulk Supply | 42,304,100 | 52 |
| | Bulk | 22,304,100 | 52 |
| | Equipment | 20,000,000 | 52 |
| | Construction | 31,077,148.9 | 47 |
| | Contingency | 27,198,374.7 | 17 |

FIG. 13

Edit Cost Logic - Construction   1700                                                      ✕

Activity Type: Construction
Location: Brazil

All Inclusive ◯ Bulks and Labor

---

All Inclusive Cost
- ◉ % of dependency
  - 267.5 %
- ◯ Specify Cost
  - USD

---

Cost Factors                                                                    ⌄

Activity Cost Breakdown          Labor Cost Parameters

| Bulk Materials | 43.6 % | 🗑 |
| Direct Labor | 41.3 % | 🗑 |
| All inclusive rates | 6 % | 🗑 |
| General costs | 2.8 % | 🗑 |
| Indirect Labor | 3.7 % | 🗑 |
| Land based plant and eq... | 2.6 % | 🗑 |

▽

Normalize 100 %

Cost per resource hour (Brazil) — 90
Default
Productivity factor (Brazil) — 1
Default
Resource hours (Brazil) — 4603229
Run the calculation to populated results

[Cancel] [Save]

FIG. 17

| | Description | All inclusive | Bulks and Labor |
|---|---|---|---|
| % of dependency | Used when the cost is updated dynamically, depending on the dependency. | Changes the total activity cost. | Changes the cost of bulks and labor separately. Total activity cost is determined by the activity cost breakdown. |
| Specify Cost | Used when the cost is known, for example, detailed quotations are available. Activities are to be updated manually. | Changes the total activity cost. | Changes the cost of bulks and labor separately. Total activity cost is redetermined by the activity cost breakdown. |

| Type to search | Cost USD | Duration Weeks |
|---|---|---|
| ∧ Onshore Facility | 117,859,623.6 | 104 |
| Management | 4,940,000 | 104 |
| Engineering and procurement | 12,340,000 | 45 |
| ∧ Equipment and Bulk Supply | 42,304,100 | 52 |
| Bulk | 22,304,100 | 52 |
| Equipment | 20,000,000 | 52 |
| Construction | 31,077,148.9 | 47 |
| Contingency | 27,198,374.7 | 17 |

FIG. 19

Edit Cost Logic-Construction                                    ✕    ›

Cost Factors

Activity Cost Breakdown         Labor Cost Paramaters

⊖ Duration is calculated based on direct labor

| Bulk Materials | 40.6 % | ⊖ |
| Direct Labor | 44 % | ⊖ |
| All Inclusive rates | 10 % | ⊖ |    Productivity factor (Australia) ⊖    [24.0] USD/hr
| General costs | 2.80 % | ⊖ |                                              Default
| Indirect Labor | 3.80 % | ⊖ |      Resource hours (Australia) ⊖    [ 1 ]
| Land based Plans and eg... | 2.70 % | ⊖ |                                 Default
|  ›  |                                                             [973096]

[Cancel] [Save]

Process Design
Facility Location
● Onshore
○ Offshore

Site environmental conditions ›

Power Supply
Power Supply Source ⊙
[Both ▼]
Imported from Grid ⊙  Generated on-site
[80] %                  [20] %
                        Calculate automatically as 100% minus
                        Imported grid usage.

Imported from the grid Electricity Mix ›

| Fuel Type | Fuel CO2 Equivalence kg/(kW.h) ▼ | Plant Efficiency % | Mix % |
|---|---|---|---|
| Biodiesel | 0.01 | 36 | |
| Lignite | 0.36 | 35 | |
| Hard coal | 0.34 | 34 | |
| Fuel oil | 0.28 | 38 | |
| Diesel | 0.27 | 38 | |
| Crude Oil | 0.26 | 38 | |
| Kerosene | 0.26 | 38 | |
| Gasoline | 0.25 | 39 | |
| Refinery gas | 0.24 | 40 | |
| LPG | 0.23 | 40 | |
| Natural gas | 0.2 | 60 | 100 |
| Fuel-to-Power | 0.01 | 40 | |
| Nuclear | 0.01 | 45 | |
| PV Solar | 0.01 | 42 | |
| Wind | 0.01 | 42 | |
| Hydro | 0.01 | 50 | |
| Total | | | 0 |

Electricity Emission Intensity Factor ⊙ 0.33 kg/(kW.h)

Availability
Availability ⊙
[94] %

Emissions
Fugitive emissions ⊙
[0.2] %
% of inlet gas feed

Methane GWP ⊙
GWP 20y
☑ [84] kg/kg ▼
GWP 100y
☐ [28] kg/kg ▼
GWP 500y
☐ [15] kg/kg ▼

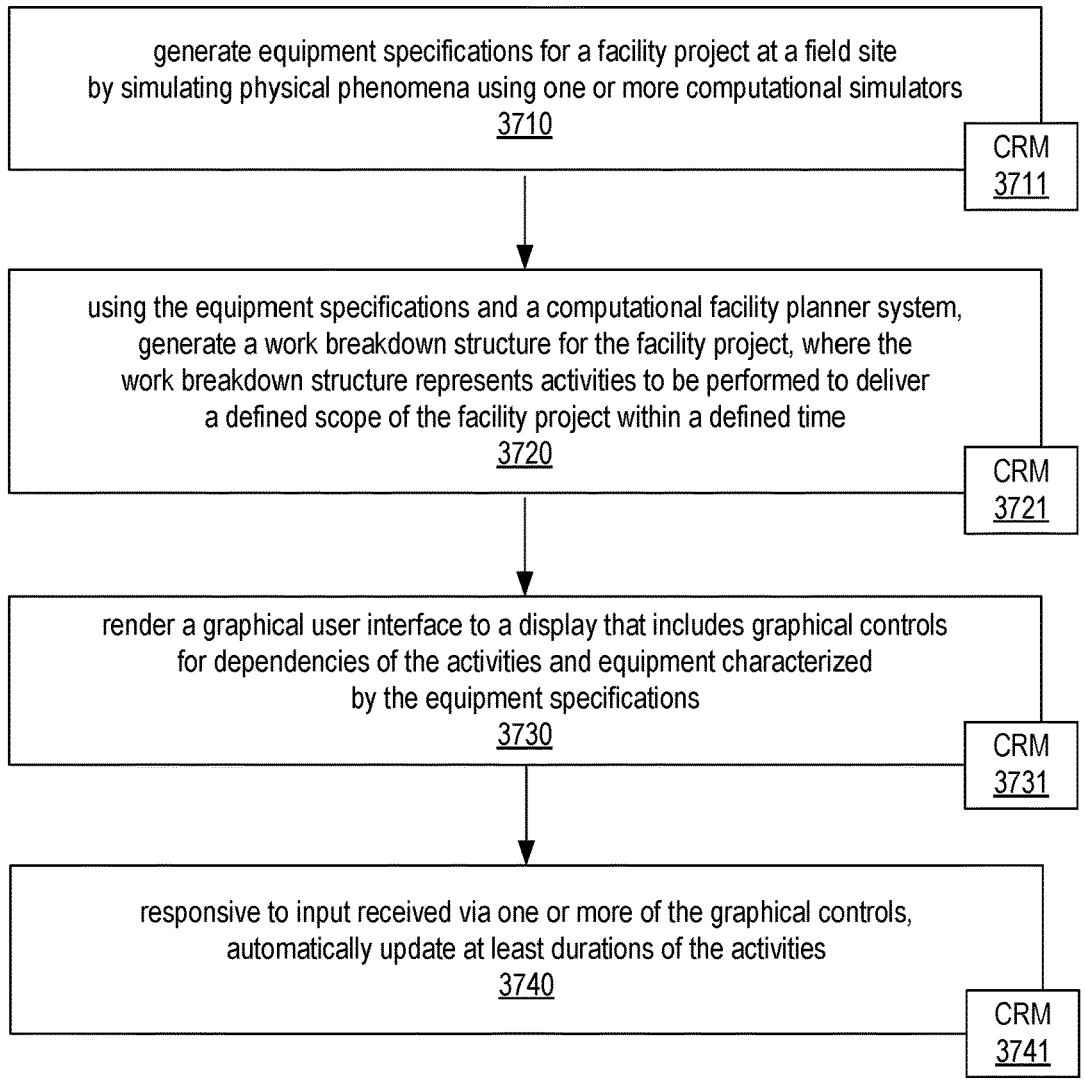
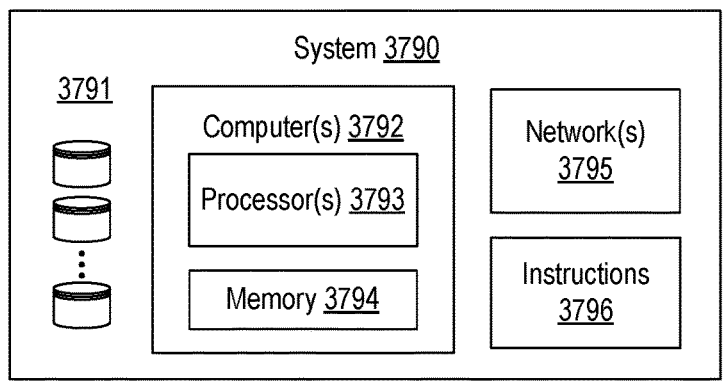
FIG. 37

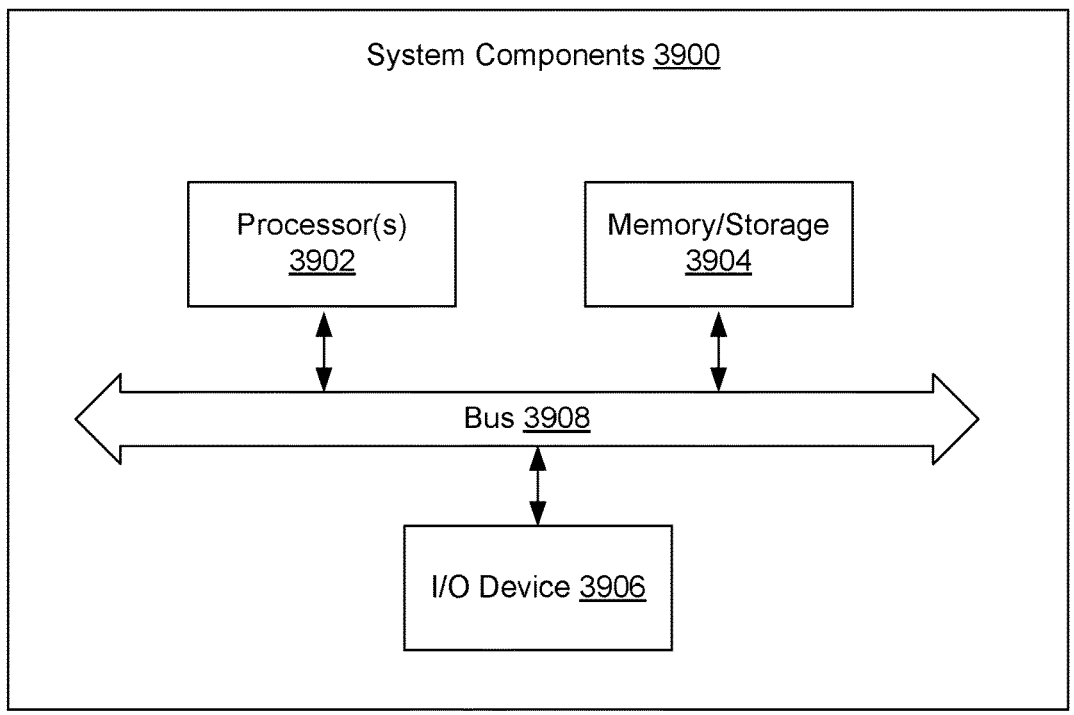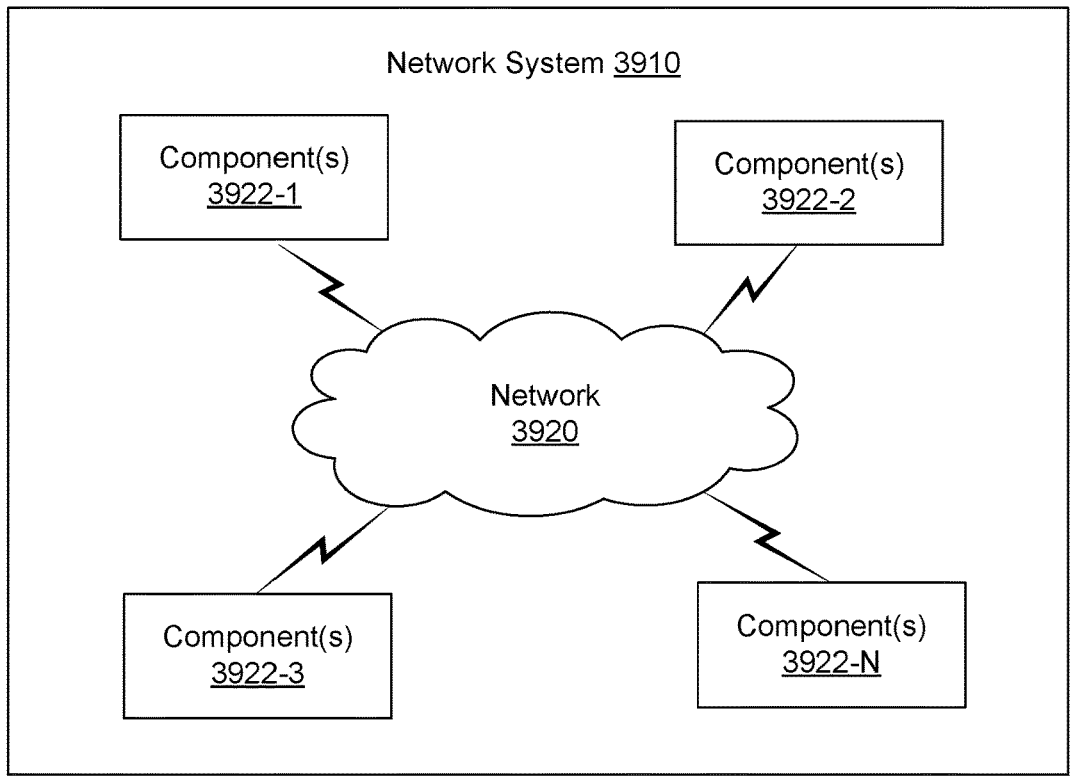
FIG. 39

FIELD DEVELOPMENT SYSTEM

RELATED APPLICATIONS

This application claims priority to and the benefit of a US Provisional Application having Ser. No. 63/407,697, filed 18 Sep. 2022, which is incorporated by reference herein in its entirety.

BACKGROUND

A reservoir can be a subsurface formation that can be characterized at least in part by its porosity and fluid permeability. As an example, a reservoir may be part of a basin such as a sedimentary basin. A basin can be a depression (e.g., caused by plate tectonic activity, subsidence, etc.) in which sediments accumulate. As an example, where hydrocarbon source rocks occur in combination with appropriate depth and duration of burial, a petroleum system may develop within a basin, which may form a reservoir that includes hydrocarbon fluids (e.g., oil, gas, etc.).

In oil and gas exploration, interpretation is a process that involves analysis of data to identify and locate various subsurface structures (e.g., horizons, faults, geobodies, etc.) in a geologic environment. Various types of structures (e.g., stratigraphic formations) may be indicative of hydrocarbon traps or flow channels, as may be associated with one or more reservoirs (e.g., fluid reservoirs). In the field of resource extraction, enhancements to interpretation can allow for construction of a more accurate model of a subsurface region, which, in turn, may improve characterization of the subsurface region for purposes of resource extraction. Characterization of one or more subsurface regions in a geologic environment can guide, for example, performance of one or more operations (e.g., field operations, etc.). As an example, a more accurate model of a subsurface region may make a drilling operation more accurate as to a borehole's trajectory where the borehole is to have a trajectory that penetrates a reservoir, etc., where fluid may be produced via the borehole (e.g., as a completed well, etc.). As an example, one or more workflows may be performed using one or more computational frameworks and/or one or more pieces of equipment that include features for one or more of analysis, acquisition, model building, control, etc., for exploration, interpretation, drilling, fracturing, production, etc.

SUMMARY

A method can include generating equipment specifications for a facility project at a field site by simulating physical phenomena using one or more computational simulators; using the equipment specifications and a computational facility planner system, generating a work breakdown structure for the facility project, where the work breakdown structure represents activities to be performed to deliver a defined scope of the facility project within a defined time; rendering a graphical user interface to a display that includes graphical controls for dependencies of the activities and equipment characterized by the equipment specifications; responsive to input received via one or more of the graphical controls, automatically updating at least durations of the activities; and, based at least in part on the updating, generating an optimal scenario for the facility project.

A system can include a processor; a memory accessible to the processor; processor-executable instructions stored in the memory and executable by the processor to instruct the system to: generate equipment specifications for a facility project at a field site by simulating physical phenomena using one or more computational simulators; using the equipment specifications and a computational facility planner system, generate a work breakdown structure for the facility project, where the work breakdown structure represents activities to be performed to deliver a defined scope of the facility project within a defined time; render a graphical user interface to a display that includes graphical controls for dependencies of the activities and equipment characterized by the equipment specifications; responsive to input received via one or more of the graphical controls, automatically update at least durations of the activities; and, based at least in part on the update, generate an optimal scenario for the facility project.

One or more computer-readable media can include computer-executable instructions executable by a system to instruct the system to: generate equipment specifications for a facility project at a field site by simulating physical phenomena using one or more computational simulators; using the equipment specifications and a computational facility planner system, generate a work breakdown structure for the facility project, where the work breakdown structure represents activities to be performed to deliver a defined scope of the facility project within a defined time; render a graphical user interface to a display that includes graphical controls for dependencies of the activities and equipment characterized by the equipment specifications; responsive to input received via one or more of the graphical controls, automatically update at least durations of the activities; and, based at least in part on the update, generate an optimal scenario for the facility project.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 1 illustrates an example system that includes various framework components associated with one or more geologic environments;

FIG. 6 illustrates an example of a graphical user interface;

FIG. 7 illustrates examples of graphical user interfaces;

FIG. 12 illustrates an example of a graphical user interface;

FIG. 13 illustrates an example of a graphical user interface;

FIG. 17 illustrates an example of a graphical user interface;

FIG. 18 illustrates an example of a graphical user interface;

FIG. 19 illustrates an example of a graphical user interface;

FIG. 27 illustrates an example of a graphical user interface;

FIG. 32 illustrates examples of graphical user interfaces;

FIG. 34 illustrates examples of graphical user interfaces;

FIG. 36 illustrates an example of a graphical user interface;

FIG. 37 illustrates an example of a method and an example of a system;

FIG. 39 illustrates example components of a system and a networked system.

DETAILED DESCRIPTION

Figure 2:
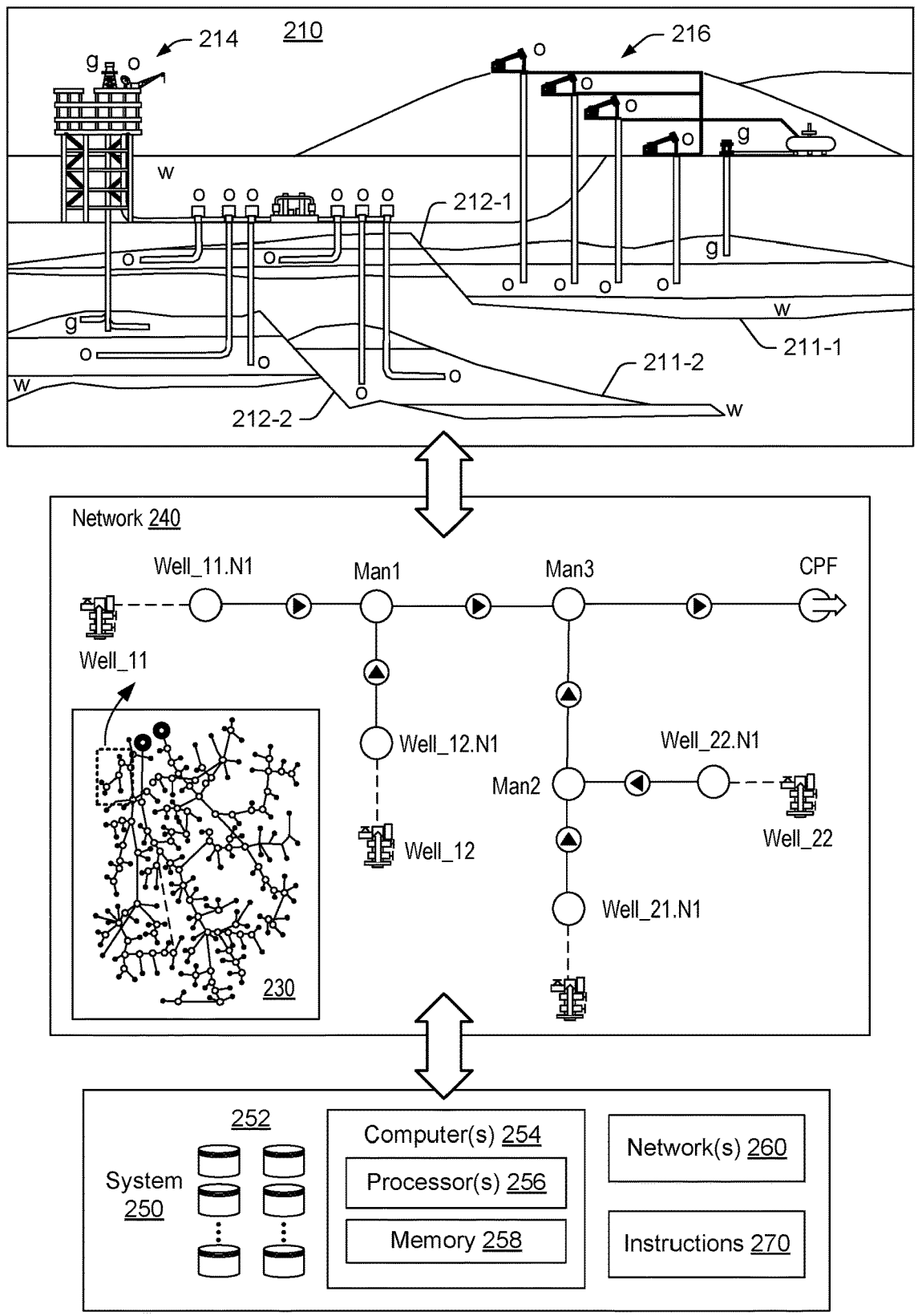
FIG. 2 illustrates examples of systems.

This description is not to be taken in a limiting sense, but rather is made merely for the purpose of describing the general principles of the implementations. The scope of the described implementations should be ascertained with reference to the issued claims.

FIG. 1 shows an example of a system 100 that includes a workspace framework 110 that can provide for instantiation of, rendering of, interactions with, etc., a graphical user interface (GUI) 120. In the example of FIG. 1, the GUI 120 can include graphical controls for computational frameworks (e.g., applications) 121, projects 122, visualization 123, one or more other features 124, data access 125, and data storage 126.

In the example of FIG. 1, the workspace framework 110 may be tailored to a particular geologic environment such as an example geologic environment 150. For example, the geologic environment 150 may include layers (e.g., stratification) that include a reservoir 151 and that may be intersected by a fault 153. As an example, the geologic environment 150 may be outfitted with a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a wellsite and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

In the example of FIG. 1, the GUI 120 shows some examples of computational frameworks, including the DRILLPLAN, PETREL, TECHLOG, PETROMOD, ECLIPSE, INTERSECT, SYMMETRY and PIPESIM frameworks (SLB, Houston, Texas).

The DRILLPLAN framework provides for digital well construction planning and includes features for automation of repetitive tasks and validation workflows, enabling improved quality drilling programs (e.g., digital drilling plans, etc.) to be produced quickly with assured coherency.

The PETREL framework can be part of the DELFI cognitive E&P environment (SLB, Houston, Texas) for utilization in geosciences and geoengineering, for example, to analyze subsurface data from exploration to production of fluid from a reservoir.

The TECHLOG framework can handle and process field and laboratory data for a variety of geologic environments (e.g., deepwater exploration, shale, etc.). The TECHLOG framework can structure wellbore data for analyses, planning, etc.

The PETROMOD framework provides petroleum systems modeling capabilities that can combine one or more of seismic, well, and geological information to model the evolution of a sedimentary basin. The PETROMOD framework can predict if, and how, a reservoir has been charged with hydrocarbons, including the source and timing of hydrocarbon generation, migration routes, quantities, and hydrocarbon type in the subsurface or at surface conditions.

The ECLIPSE framework provides a reservoir simulator (e.g., as a computational framework) with numerical solutions for fast and accurate prediction of dynamic behavior for various types of reservoirs and development schemes.

The INTERSECT framework provides a high-resolution reservoir simulator for simulation of detailed geological features and quantification of uncertainties, for example, by creating accurate production scenarios and, with the integration of precise models of the surface facilities and field operations, the INTERSECT framework can produce reliable results, which may be continuously updated by realtime data exchanges (e.g., from one or more types of data acquisition equipment in the field that can acquire data during one or more types of field operations, etc.). The INTERSECT framework can provide completion configurations for complex wells where such configurations can be built in the field, can provide detailed chemical-enhanced-oil-recovery (EOR) formulations where such formulations can be implemented in the field, can analyze application of steam injection and other thermal EOR techniques for implementation in the field, advanced production controls in terms of reservoir coupling and flexible field management, and flexibility to script customized solutions for improved modeling and field management control. The INTERSECT framework, as with the other example frameworks, may be utilized as part of the DELFI cognitive E&P environment, for example, for rapid simulation of multiple concurrent cases. For example, a workflow may utilize one or more of the DELFI on demand reservoir simulation features.

The SYMMETRY framework provides for modeling process workflows, including integrating facilities, process units with pipelines, networks and flare, safety systems models, while ensuring consistent thermodynamics and fluid characterization across a system. The SYMMETRY framework includes components for optimizing processes in upstream, midstream and downstream sectors, maximizing profits and minimizing CAPEX. The SYMMETRY framework provides for oil pseudo-component characterization techniques. For example, a paraffin, isoparaffin, olefin, naphthene, aromatic (PIONA) based fluid characterization uses chemical family structures to enable accurate physical property estimation in one or more of blending, separation, and reactive systems to be more accurately simulated. Such an approach helps to ensure consistent thermodynamics and component tracking across a system. The SYMMETRY framework provides a simulation engine for performing various simulations of physical phenomena. Various frameworks can share compositional data, for example, consider sharing of data between the PIPESIM framework steady-state multiphase flow simulator and the SYMMETRY process framework. Compositional models can be integrated to evaluate and maintain fluid description fidelity and behavior, which can extend beyond capabilities of black-oil simulations. The SYMMETRY framework includes components that provide for assessments that align with the United Nations Sustainable Development Goals 12 and 13, that can optimize drilling CO2 footprint, and that can provide for emissions reductions. For example, the SYMMETRY framework can establish a baseline performance and evaluate different options for reducing emissions, including reduced routine flaring, alternatives to flaring, fuel gas minimization through energy management, and feedstock management (hydrogen or bio-feed blending). As to electrification, various scenarios can be modeled to, for example, select or optimize energy sources suitable for electrification of one or more processes, pieces of equipment, etc. As an example, simulations can be performed that aim to reduce energy consumption, optionally while considering energy sources (e.g., on-site from produced fluids, from solar, from wind, from geothermal, etc.). As an example, a workflow can include applying total site energy management models to support reduction in energy consumption in facilities at one or more scales, for example, from rotating equipment to various plants. The SYMMETRY framework can provide for simulations that aim to reduce fuel consumption, generate power from waste heat (e.g., energy integration), and optimizing applications of renewable power. The SYMMETRY framework provides for modeling of natural gas liquid (NGL) recovery optimization, sulfur plants, liquefied natural gas (LNG) train mixed refrigerant optimization, multisided heat exchangers, compressor train optimization, acid gas removal with amines, membrane separation, etc. Such features allow for modeling complex processes more effectively, predicting performance for proactive controls, and accelerating performance while maintaining trust in rigorous modeling. As to separators, the SYMMETRY framework can enhance separation modeling capabilities; noting that performance of a separator can be one of the largest factors in overall operational performance of an asset. Components include steady state and dynamics engines, which allow for evaluation and understanding of impacts on an overall system. Separation process analysis can aim perform more accurate rating and troubleshooting of separation using steady state and/or dynamics simulations and gain a better understanding of how transient behaviors can impact a separation process.

The PIPESIM simulator includes solvers that may provide simulation results such as, for example, multiphase flow results (e.g., from a reservoir to a wellhead and beyond, etc.), flowline and surface facility performance, etc. The PIPESIM simulator may be integrated, for example, with the AVOCET production operations framework (SLB, Houston Texas). As an example, a reservoir or reservoirs may be simulated with respect to one or more enhanced recovery techniques (e.g., consider a thermal process such as steam-assisted gravity drainage (SAGD), etc.). As an example, the PIPESIM simulator may be an optimizer that can optimize one or more operational scenarios at least in part via simulation of physical phenomena.

The DRILLOPS framework (SLB, Houston, Texas) may be operatively coupled to one or more other frameworks, optionally within the DELFI environment. The DRILLOPS framework may execute a digital drilling plan (e.g., generated by the DRILLPLAN framework, etc.) and ensure plan adherence, while delivering goal-based automation. The DRILLOPS framework may generate activity plans automatically individual operations, whether they are monitored and/or controlled on the rig or in town. Automation may utilize data analysis and learning systems to assist and optimize tasks, such as, for example, setting ROP to drilling a stand. A preset menu of automatable drilling tasks may be rendered, and, using data analysis and models, a plan may be executed in a manner to achieve a specified goal, where, for example, measurements may be utilized for calibration. The DRILLOPS framework provides flexibility to modify and replan activities dynamically, for example, based on a live appraisal of various factors (e.g., equipment, personnel, and supplies). Well construction activities (e.g., tripping, drilling, cementing, etc.) may be continually monitored and dynamically updated using feedback from operational activities. The DRILLOPS framework may provide for various levels of automation based on planning and/or re-planning (e.g., via the DRILLPLAN framework), feedback, etc.

The aforementioned DELFI environment provides various features for workflows as to subsurface analysis, planning, construction and production, for example, as illustrated in the workspace framework 110. Such an environment may be referred to as a process operations environment that can include a variety of frameworks (e.g., applications, etc.). As shown in FIG. 1, outputs from the workspace framework 110 can be utilized for directing, controlling, etc., one or more processes in the geologic environment 150 and, feedback 160, can be received via one or more interfaces in one or more forms (e.g., acquired data as to operational conditions, equipment conditions, environment conditions, etc.).

In the example of FIG. 1, the visualization features 123 may be implemented via the workspace framework 110, for example, to perform tasks as associated with one or more of subsurface regions, planning operations, constructing wells and/or surface fluid networks, and producing from a reservoir.

As an example, a visualization process can implement one or more of various features that can be suitable for one or more web applications. For example, a template may involve use of the JAVASCRIPT object notation format (JSON) and/or one or more other languages/formats. As an example, a framework may include one or more converters. For example, consider a JSON to PYTHON converter and/or a PYTHON to JSON converter. Such an approach can provide for compatibility of devices, frameworks, etc., with respect to one or more sets of instructions.

As an example, visualization features can provide for visualization of various earth models, properties, etc., in one or more dimensions. As an example, visualization features can provide for rendering of information in multiple dimensions, which may optionally include multiple resolution rendering. In such an example, information being rendered may be associated with one or more frameworks and/or one or more data stores. As an example, visualization features may include one or more control features for control of equipment, which can include, for example, field equipment that can perform one or more field operations. As an example, a workflow may utilize one or more frameworks to generate information that can be utilized to control one or more types of field equipment (e.g., drilling equipment, wireline equipment, fracturing equipment, etc.).

As to a reservoir model that may be suitable for utilization by a simulator, consider acquisition of seismic data as acquired via reflection seismology, which finds use in geophysics, for example, to estimate properties of subsurface formations. As an example, reflection seismology may provide seismic data representing waves of elastic energy (e.g., as transmitted by P-waves and S-waves, in a frequency range of approximately 1 Hz to approximately 100 Hz). Seismic data may be processed and interpreted, for example, to understand better composition, fluid content, extent and geometry of subsurface rocks. Such interpretation results can be utilized to plan, simulate, perform, etc., one or more operations for production of fluid from a reservoir (e.g., reservoir rock, etc.).

Field acquisition equipment may be utilized to acquire seismic data, which may be in the form of traces where a trace can include values organized with respect to time and/or depth (e.g., consider 1D, 2D, 3D or 4D seismic data). For example, consider acquisition equipment that acquires digital samples at a rate of one sample per approximately 4 ms. Given a speed of sound in a medium or media, a sample rate may be converted to an approximate distance. For example, the speed of sound in rock may be on the order of around 5 km per second. Thus, a sample time spacing of approximately 4 ms would correspond to a sample "depth" spacing of about 10 meters (e.g., assuming a path length from source to boundary and boundary to sensor). As an example, a trace may be about 4 seconds in duration; thus, for a sampling rate of one sample at about 4 ms intervals, such a trace would include about 1000 samples where latter acquired samples correspond to deeper reflection boundaries. If the 4 second trace duration of the foregoing example is divided by two (e.g., to account for reflection), for a vertically aligned source and sensor, a deepest boundary depth may be estimated to be about 10 km (e.g., assuming a speed of sound of about 5 km per second).

As an example, a model may be a simulated version of a geologic environment. As an example, a simulator may include features for simulating physical phenomena in a geologic environment based at least in part on a model or models. A simulator, such as a reservoir simulator, can simulate fluid flow in a geologic environment based at least in part on a model that can be generated via a framework that receives seismic data. A simulator can be a computerized system (e.g., a computing system) that can execute instructions using one or more processors to solve a system of equations that describe physical phenomena subject to various constraints. In such an example, the system of equations may be spatially defined (e.g., numerically discretized) according to a spatial model that that includes layers of rock, geobodies, etc., that have corresponding positions that can be based on interpretation of seismic and/or other data. A spatial model may be a cell-based model where cells are defined by a grid (e.g., a mesh). A cell in a cell-based model can represent a physical area or volume in a geologic environment where the cell can be assigned physical properties (e.g., permeability, fluid properties, etc.) that may be germane to one or more physical phenomena (e.g., fluid volume, fluid flow, pressure, etc.). A reservoir simulation model can be a spatial model that may be cell-based.

A simulator can be utilized to simulate the exploitation of a real reservoir, for example, to examine different productions scenarios to find an optimal one before production or further production occurs. A reservoir simulator does not provide an exact replica of flow in and production from a reservoir at least in part because the description of the reservoir and the boundary conditions for the equations for flow in a porous rock are generally known with an amount of uncertainty. Certain types of physical phenomena occur at a spatial scale that can be relatively small compared to size of a field. A balance can be struck between model scale and computational resources that results in model cell sizes being of the order of meters; rather than a lesser size (e.g., a level of detail of pores). A modeling and simulation workflow for multiphase flow in porous media (e.g., reservoir rock, etc.) can include generalizing real micro-scale data from macro scale observations (e.g., seismic data and well data) and upscaling to a manageable scale and problem size. Uncertainties can exist in input data and solution procedure such that simulation results too are to some extent uncertain. A process known as history matching can involve comparing simulation results to actual field data acquired during production of fluid from a field. Information gleaned from history matching, can provide for adjustments to a model, data, etc., which can help to increase accuracy of simulation.

As an example, a simulator may utilize various types of constructs, which may be referred to as entities. Entities may include earth entities or geological objects such as wells, surfaces, reservoirs, etc. Entities can include virtual representations of actual physical entities that may be reconstructed for purposes of simulation. Entities may include entities based on data acquired via sensing, observation, etc. (e.g., consider entities based at least in part on seismic data and/or other information). As an example, an entity may be characterized by one or more properties (e.g., a geometrical pillar grid entity of an earth model may be characterized by a porosity property, etc.). Such properties may represent one or more measurements (e.g., acquired data), calculations, etc.

As an example, a simulator may utilize an object-based software framework, which may include entities based on pre-defined classes to facilitate modeling and simulation. As an example, an object class can encapsulate reusable code and associated data structures. Object classes can be used to instantiate object instances for use by a program, script, etc. For example, borehole classes may define objects for representing boreholes based on well data. A model of a basin, a reservoir, etc. may include one or more boreholes where a borehole may be, for example, for measurements, injection, production, etc. As an example, a borehole may be a wellbore of a well, which may be a completed well (e.g., for production of a resource from a reservoir, for injection of material, etc.).

While several simulators are illustrated in the example of FIG. 1, one or more other simulators may be utilized, additionally or alternatively. For example, consider the VISAGE geomechanics simulator (SLB, Houston Texas). The VISAGE simulator includes finite element numerical solvers that may provide simulation results such as, for example, results as to compaction and subsidence of a geologic environment, well and completion integrity in a geologic environment, cap-rock and fault-seal integrity in a geologic environment, fracture behavior in a geologic environment, thermal recovery in a geologic environment, CO2 disposal, etc. The MANGROVE simulator (SLB, Houston, Texas) provides for optimization of stimulation design (e.g., stimulation treatment operations such as hydraulic fracturing) in a reservoir-centric environment. The MANGROVE framework can combine scientific and experimental work to predict geomechanical propagation of hydraulic fractures, reactivation of natural fractures, etc., along with production forecasts within 3D reservoir models (e.g., production from a drainage area of a reservoir where fluid moves via one or more types of fractures to a well and/or from a well). The MANGROVE framework can provide results pertaining to heterogeneous interactions between hydraulic and natural fracture networks, which may assist with optimization of the number and location of fracture treatment stages (e.g., stimulation treatment(s)), for example, to increased perforation efficiency and recovery.

The PETREL framework provides components that allow for optimization of exploration and development operations. The PETREL framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes (e.g., with respect to one or more geologic environments, etc.). Such a framework may be considered an application (e.g., executable using one or more devices) and may be considered a data-driven application (e.g., where data is input for purposes of modeling, simulating, etc.).

As mentioned, a framework may be implemented within or in a manner operatively coupled to the DELFI cognitive exploration and production (E&P) environment (SLB, Houston, Texas), which is a secure, cognitive, cloud-based collaborative environment that integrates data and workflows with digital technologies, such as artificial intelligence and machine learning. As an example, such an environment can provide for operations that involve one or more frameworks. The DELFI environment may be referred to as the DELFI framework, which may be a framework of frameworks. As an example, the DELFI framework can include various other frameworks, which can include, for example, one or more types of models (e.g., simulation models, etc.).

As an example, data can include geochemical data. For example, consider data acquired using X-ray fluorescence (XRF) technology, Fourier transform infrared spectroscopy (FTIR) technology and/or wireline geochemical technology.

As an example, one or more probes may be deployed in a bore via a wireline or wirelines. As an example, a probe may emit energy and receive energy where such energy may be analyzed to help determine mineral composition of rock surrounding a bore. As an example, nuclear magnetic resonance may be implemented (e.g., via a wireline, downhole NMR probe, etc.), for example, to acquire data as to nuclear magnetic properties of elements in a formation (e.g., hydrogen, carbon, phosphorous, etc.).

As an example, lithology scanning technology may be employed to acquire and analyze data. For example, consider the LITHO SCANNER technology marketed by SLB (Houston, Texas). As an example, a LITHO SCANNER tool may be a gamma ray spectroscopy tool.

As an example, a tool may be positioned to acquire information in a portion of a borehole. Analysis of such information may reveal vugs, dissolution planes (e.g., dissolution along bedding planes), stress-related features, dip events, etc. As an example, a tool may acquire information that may help to characterize a fractured reservoir, optionally where fractures may be natural and/or artificial (e.g., hydraulic fractures). Such information may assist with completions, stimulation treatment, etc. As an example, information acquired by a tool may be analyzed using a framework such as the aforementioned TECHLOG framework.

As an example, a workflow may utilize one or more types of data for one or more processes (e.g., stratigraphic modeling, basin modeling, completion designs, drilling, production, injection, etc.). As an example, one or more tools may provide data that can be used in a workflow or workflows that may implement one or more frameworks (e.g., PETREL, TECHLOG, PETROMOD, ECLIPSE, SYMMETRY, etc.).

FIG. 2 shows an example of a geologic environment 210 that includes reservoirs 211-1 and 211-2, which may be faulted by faults 212-1 and 212-2, an example of a network of equipment 230, an enlarged view of a portion of the network of equipment 230, referred to as network 240, and an example of a system 250. FIG. 2 shows some examples of offshore equipment 214 for oil and gas operations related to the reservoir 211-2 and onshore equipment 216 for oil and gas operations related to the reservoir 211-1.

In the example of FIG. 2, the various equipment 214 and 216 can include drilling equipment, wireline equipment, production equipment, etc. For example, consider the equipment 214 as including a drilling rig that can drill into a formation to reach a reservoir target where a well can be completed for production of hydrocarbons. In such an example, one or more features of the system 100 of FIG. 1 may be utilized. For example, consider utilizing a drilling or well plan framework, a drilling execution framework, etc., to plan, execute, etc., one or more drilling operations.

In FIG. 2, the network 240 can be an example of a relatively small production system network. As shown, the network 240 forms somewhat of a tree like structure where flowlines represent branches (e.g., segments) and junctions represent nodes. As shown in FIG. 2, the network 240 provides for transportation of oil and gas fluids from well locations along flowlines interconnected at junctions with final delivery at a central processing facility.

In the example of FIG. 2, various portions of the network 240 may include conduit. For example, consider a perspective view of a geologic environment that includes two conduits which may be a conduit to Man1 and a conduit to Man3 in the network 240.

As shown in FIG. 2, the example system 250 includes one or more information storage devices 252, one or more computers 254, one or more networks 260 and instructions 270 (e.g., organized as one or more sets of instructions). As to the one or more computers 254, each computer may include one or more processors (e.g., or processing cores) 256 and a memory 258 for storing the instructions 270 (e.g., one or more sets of instructions), for example, executable by at least one of the one or more processors. As an example, a computer may include one or more network interfaces (e.g., wired or wireless), one or more graphics cards, a display interface (e.g., wired or wireless), etc. As an example, imagery such as surface imagery (e.g., satellite, geological, geophysical, etc.) may be stored, processed, communicated, etc. As an example, data may include SAR data, GPS data, etc. and may be stored, for example, in one or more of the storage devices 252. As an example, information that may be stored in one or more of the storage devices 252 may include information about equipment, location of equipment, orientation of equipment, fluid characteristics, etc.

As an example, the instructions 270 can include instructions (e.g., stored in the memory 258) executable by at least one of the one or more processors 256 to instruct the system 250 to perform various actions. As an example, the system 250 may be configured such that the instructions 270 provide for establishing a framework, for example, that can perform network modeling (see, e.g., the PIPESIM framework of the example of FIG. 1, etc.). As an example, one or more methods, techniques, etc. may be performed using one or more sets of instructions, which may be, for example, the instructions 270 of FIG. 2.

Figure 3:
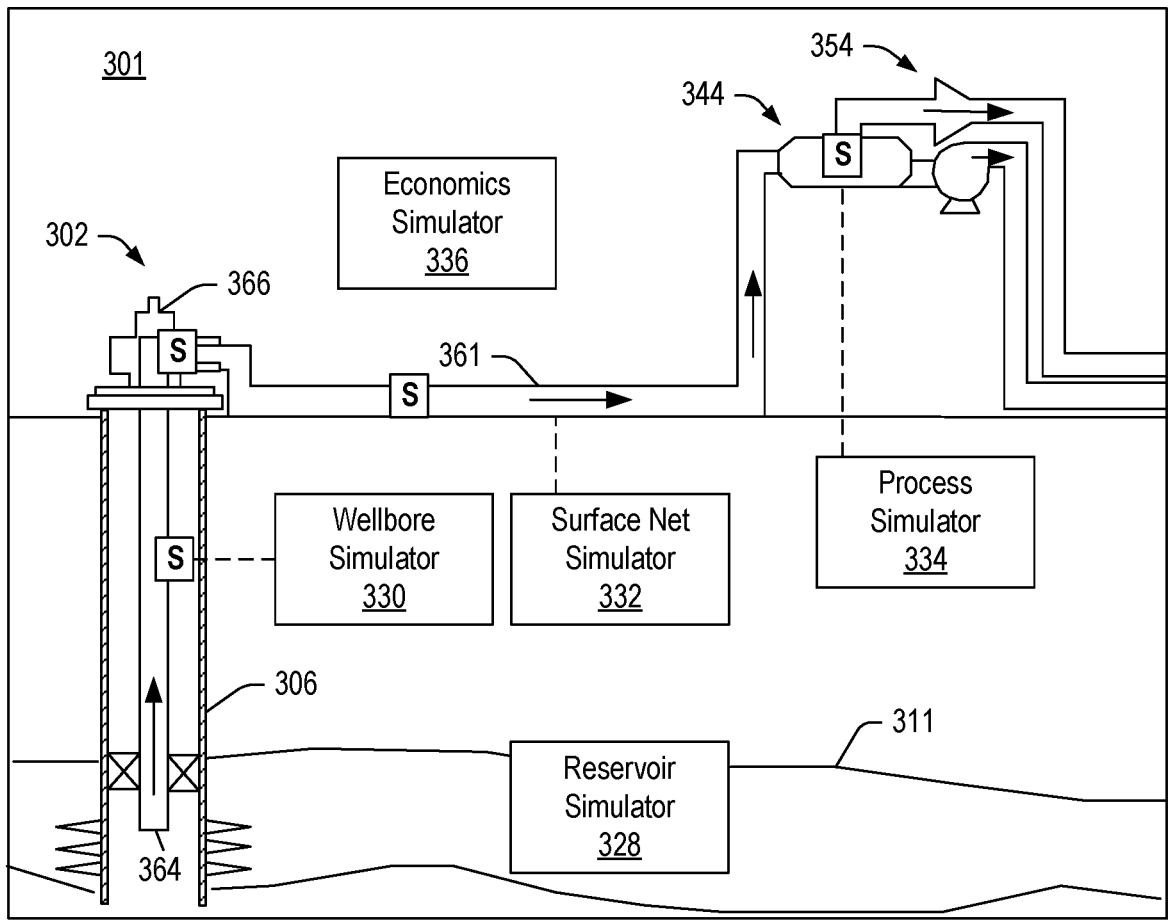
FIG. 3 illustrates an example of a system.

FIG. 3 shows a schematic view of an example of a portion of a geologic environment 301 that can include various types of equipment. As shown in FIG. 3, the environment 301 can include a wellsite 302 and a fluid network 344. In the example of FIG. 3, the wellsite 302 includes a wellbore 306 extending into earth as completed and prepared for production of fluid from a reservoir 311 (e.g., one of the reservoirs 311-1 or 311-2).

In the example of FIG. 3, wellbore production equipment 364 extends from a wellhead 366 of the wellsite 302 and to the reservoir 311 to draw fluid to the surface. As shown, the wellsite 302 is operatively connected to the fluid network 344 via a transport line 361. As indicated by various arrows, fluid can flow from the reservoir 311, through the wellbore 306 and onto the fluid network 344. Fluid can then flow from the fluid network 344, for example, to one or more fluid processing facilities.

In the example of FIG. 3, sensors (S) are located, for example, to monitor various parameters during operations. The sensors (S) may measure, for example, pressure, temperature, flowrate, composition, and other parameters of the reservoir, wellbore, gathering network, process facilities and/or other portions of an operation. As an example, the sensors (S) may be operatively connected to a surface unit (e.g., to instruct the sensors to acquire data, to collect data from the sensors, etc.).

In the example of FIG. 3, a surface unit can include computer facilities, such as a memory device, a controller, one or more processors, and a display unit (e.g., for managing data, visualizing results of an analysis, etc.). As an example, data may be collected in the memory device and processed by the processor(s) (e.g., for analysis, etc.). As an example, data may be collected from the sensors (S) and/or by one or more other sources. For example, data may be supplemented by historical data collected from other operations, user inputs, etc. As an example, analyzed data may be used to in a decision making process.

As an example, a transceiver may be provided to allow communications between a surface unit and one or more pieces of equipment in the environment 301. For example, a controller may be used to actuate mechanisms in the environment 301 via the transceiver, optionally based on one or more decisions of a decision making process. In such a manner, equipment in the environment 301 may be selectively adjusted based at least in part on collected data. Such adjustments may be made, for example, automatically based on computer protocol, manually by an operator or both. As an example, one or more well plans may be adjusted (e.g., to select optimum operating conditions, to avoid problems, etc.).

To facilitate data analyses, one or more simulators may be implemented (e.g., optionally via the surface unit or other unit, system, etc.). As an example, data fed into one or more simulators may be historical data, real time data or combinations thereof. As an example, simulation through one or more simulators may be repeated or adjusted based on the data received.

In the example of FIG. 3, simulators can include a reservoir simulator 328, a wellbore simulator 330, a surface network simulator 332, a process simulator 334 and an economics simulator 336. As an example, the reservoir simulator 328 may be configured to solve for hydrocarbon flow rate through a reservoir and into one or more wellbores. As an example, the wellbore simulator 330 and surface network simulator 332 may be configured to solve for hydrocarbon flow rate through a wellbore and a surface gathering network of pipelines. As to the process simulator 334, it may be configured to model a processing plant where fluid containing hydrocarbons is separated into its constituent components (e.g., methane, ethane, propane, etc.), for example, and prepared for further distribution (e.g., transport via road, rail, pipe, etc.) and optionally sale. As an example, the economics simulator 336 may be configured to model costs associated with at least part of an operation. For example, consider MERAK framework (SLB, Houston, Texas), which may provide for economic analyses.

As an example, a system can include and/or be operatively coupled to one or more of the simulators 328, 330, 332, 334 and 336 of FIG. 3. As an example, such simulators may be associated with frameworks and/or may be considered tools (see, e.g., the system 100 of FIG. 1, etc.). Various pieces of equipment in the example geologic environment 301 of FIG. 3 may be operatively coupled to one or more systems, one or more frameworks, etc. As an example, one or more of the sensors (S) may be operatively coupled to one or more networks (e.g., wired and/or wireless) for transmission of data, which, as explained, may include data indicative of production. As shown, a sensor (S) may be utilized for acquisition of downhole data and/or surface data, which can include data relevant to production (e.g., flow rate, temperature, pressure, composition, etc.). Such data may be utilized in a system such as, for example, the system 100 of FIG. 1 for operational decision making, etc.

While various examples of field equipment are illustrated for hydrocarbon related production operations, as explained, field equipment may be for one or more other types of operations where such field equipment can acquire data (e.g., field equipment data) that can be utilized for operation decision making and/or one or more other purposes. As to wind energy production equipment, data can include meteorological data associated with a site or sites, turbine blade data, turbine performance data, orientation control data, energy conversion data, etc. As to solar energy production equipment, data can include meteorological data associated with a site or sites, solar cell data, solar panel performance data, orientation control data, energy conversion data, etc.

As explained, field equipment data may be suitable for use with one or more frameworks, one or more workflows, etc. Uses of field equipment data can involve transfers such as, for example, inter-framework transfers where one or more types of data related issues may arise due to formatting, unit conversions, coordinate reference system (CRS) conversions, etc. Use of field equipment data can be enhanced through automated or semi-automated processes that can perform tasks such as identifying data (e.g., data types, etc.) and/or assessing quality of data.

Figure 4:
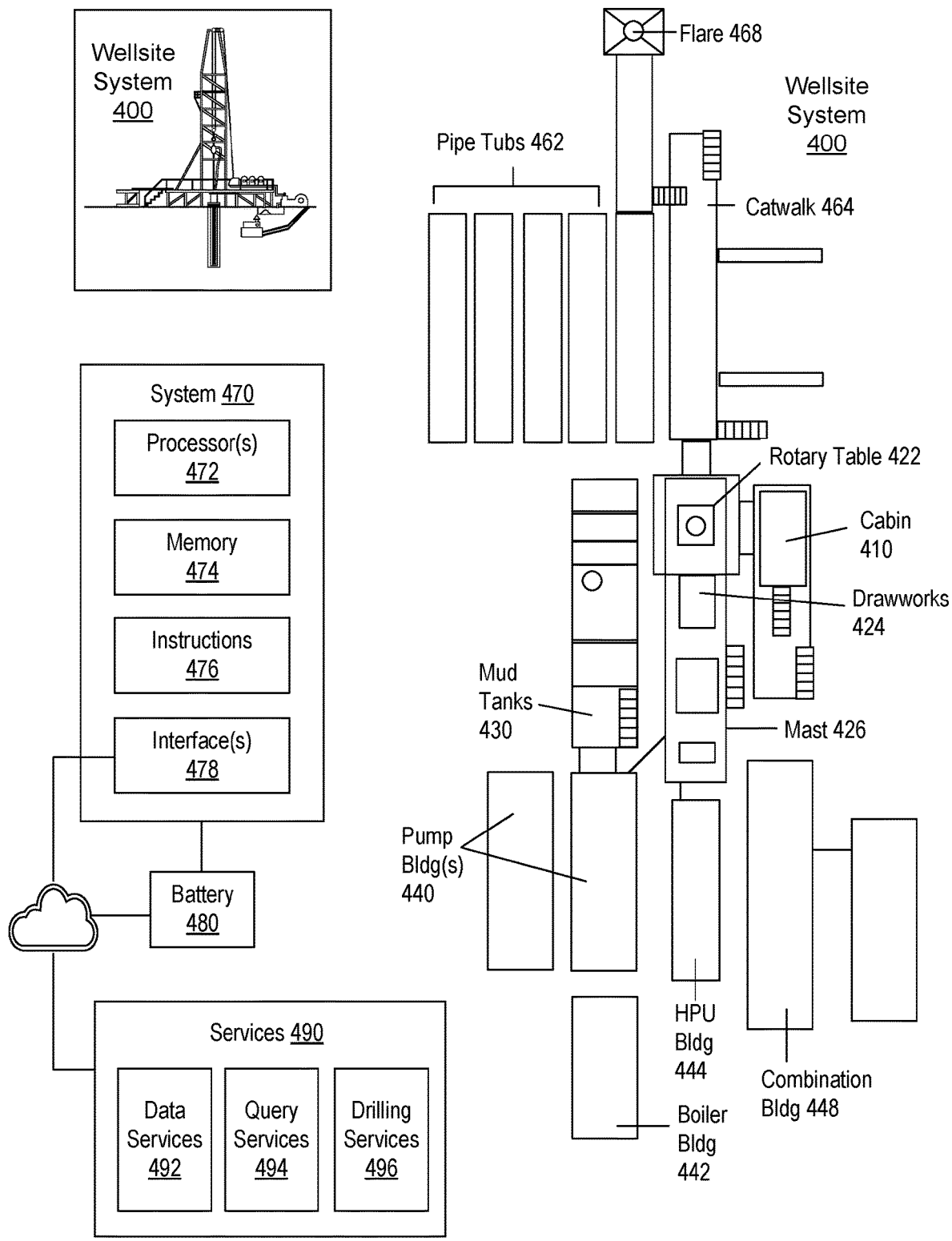
FIG. 4 illustrates an example of a system.

FIG. 4 shows an example of a wellsite system 400, specifically, FIG. 4 shows the wellsite system 400 in an approximate side view and an approximate plan view along with a block diagram of a system 470.

In the example of FIG. 4, the wellsite system 400 can include a cabin 410, a rotary table 422, drawworks 424, a mast 426 (e.g., optionally carrying a top drive, etc.), mud tanks 430 (e.g., with one or more pumps, one or more shakers, etc.), one or more pump buildings 440, a boiler building 442, an HPU building 444 (e.g., with a rig fuel tank, etc.), a combination building 448 (e.g., with one or more generators, etc.), pipe tubs 462, a catwalk 464, a flare 468, etc. Such equipment can include one or more associated functions and/or one or more associated operational risks, which may be risks as to time, resources, and/or humans.

As shown in the example of FIG. 4, the wellsite system 400 can include a system 470 that includes one or more processors 472, a memory 474 operatively coupled to at least one of the one or more processors 472, instructions 476 that can be, for example, stored in the memory 474, and one or more interfaces 478. As an example, the system 470 can include one or more processor-readable media that include processor-executable instructions executable by at least one of the one or more processors 472 to cause the system 470 to control one or more aspects of the wellsite system 400. In such an example, the memory 474 can be or include the one or more processor-readable media where the processor-executable instructions can be or include instructions. As an example, a processor-readable medium can be a computer-readable storage medium that is not a signal and that is not a carrier wave.

FIG. 4 also shows a battery 480 that may be operatively coupled to the system 470, for example, to power the system 470. As an example, the battery 480 may be a back-up battery that operates when another power supply is unavailable for powering the system 470. As an example, the battery 480 may be operatively coupled to a network, which may be a cloud network. As an example, the battery 480 can include smart battery circuitry and may be operatively coupled to one or more pieces of equipment via a SMBus or other type of bus.

In the example of FIG. 4, services 490 are shown as being available, for example, via a cloud platform. Such services can include data services 492, query services 494 and drilling services 496. As an example, the services 490 may be part of a system such as the system 300 of FIG. 3.

As an example, the system 470 may be utilized to generate one or more rate of penetration drilling parameter values, which may, for example, be utilized to control one or more drilling operations.

Figure 5:
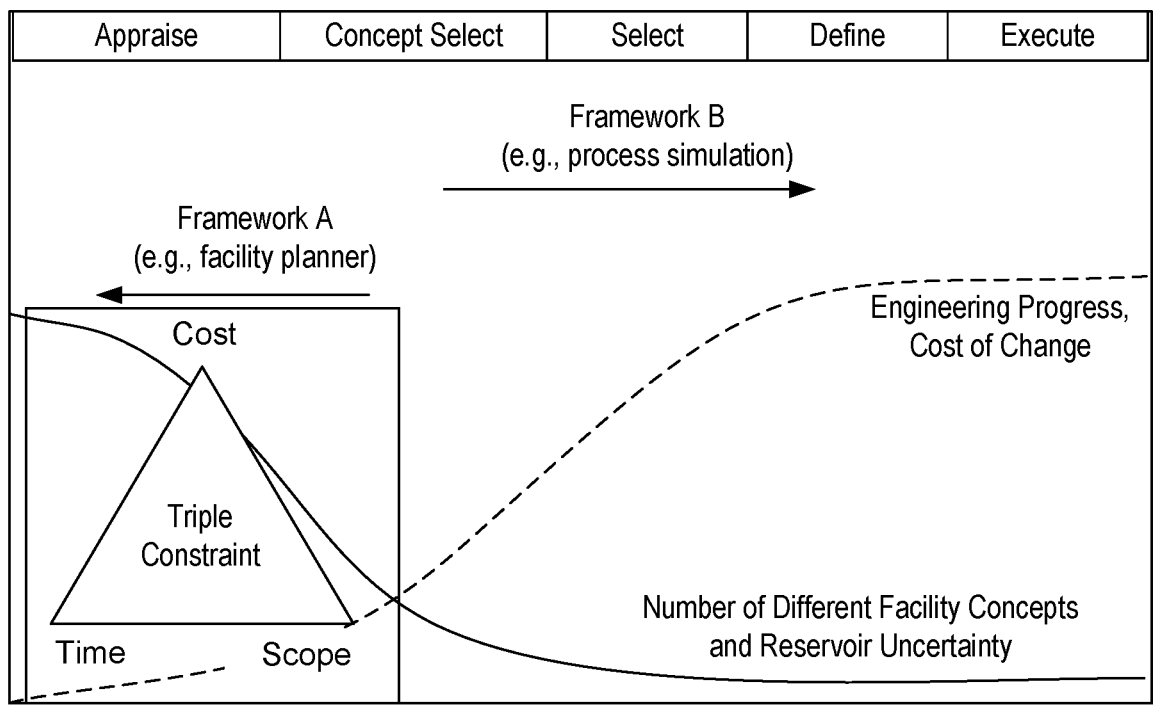
FIG. 5 illustrates an example of a system.

FIG. 5 shows an example of a field development system (FDS) 500 that can include and/or be operatively coupled to one or more frameworks, which may be hosted by an environment such as, for example, the DELFI environment. In the example of FIG. 5, the FDS 500 includes components for appraisal, concept selection, selection, definition, and execution. As shown, the SYMMETRY framework may be integrated into the FDS 500 for one or more purposes such as, for example, facilities planning.

Facilities include equipment such as, for example, one or more of the types of equipment shown in the examples of FIG. 1, FIG. 2, FIG. 3 and FIG. 4. Field development planning is a complex process of evaluating multiple scenarios for a field and selecting the best scenario based on assessing trade-offs among multiple factors. As shown in the example of FIG. 5, factors can include cost, time, and scope. As to cost, it can be account for equipment procurement, equipment building, equipment transportation, equipment maintenance, equipment energy consumption, equipment operations, equipment emissions, equipment decommissioning, etc. As such, materials, energy, and labor can be included in cost. As an example, a systems approach may be taken as to cost, which may involve a life-cycle analysis, cradle-to-grave and/or cradle-to-cradle assessment.

Cradle-to-cradle design (also referred to as 2CC2, C2C, cradle 2 cradle, or regenerative design) is a biomimetic approach to the design of products and systems where materials can be viewed as nutrients circulating in healthy, safe metabolisms. C2C can consider protection of and even enriching ecosystems while maintaining a safe, productive technical metabolism for high-quality use and circulation of organic and technical nutrients. C2C is a holistic, economic, industrial, and social framework that seeks to create systems that are not only efficient but also essentially waste free (e.g., LEAN, etc.). C2C can extend beyond industrial design and manufacturing and account for aspects of human civilization such as urban environments, buildings, economics, and social systems.

As shown in the example of FIG. 5, cost, time, and scope can be referred to as the triple constraint or three constraints. A facility may have an operational lifetime that ranges from less than a year to decades. Further, a facility may be designed for replacement or upgrade depending on one or more factors such as, for example, changes in demand for a natural resource, decline in reservoir pressure that can facilitate natural resource production, incentives for reduction in utilization of one or more types of energy, incentives for use of one or more types of energy, etc. In the example of FIG. 5, the FDS 500 can operate in a window where a crossover exists between engineering progress and cost of change and number of different facility concepts and reservoir uncertainty. The FDS 500 can provide for optimized facilities development, for example, using a limited number of scenarios. In such an approach, a number of scenarios can be generated where feedback can provide for honing in on an optimal scenario using a selected focus, which can be for one or more of cost, time and scope. For example, the FDS 500 can direct a user to focus on cost, time, or scope in a constructive manner that aims to keep facility development within a constrained domain.

In various examples, to compare and evaluate different options, a FDS can provide for performing an economic evaluation of a field development scenario. As mentioned, the term "cost", as with the term "economic", can account for factors that may be present in a C2C assessment. Hence, costs or economics can be technical and involve technical analyses, including simulations as to how equipment interacts with an environment, whether during building, use or post-use phases of such equipment. In various examples, equipment can be selected based on physical realities of an asset, which can be a reservoir that includes hydrocarbon fluids. At a base level, an assessment can determine whether energy input to produce hydrocarbon fluid is greater than or lesser than the energy content of the produced hydrocarbon fluid. At a more refined level, energy input can be optimized with respect to energy content produced, optionally in a manner that accounts for a variety of factors as in a time dependent systems approach.

As an example, a FDS may include components to perform economic screening using one or more cost versus time profiles for capital expenditure (CAPEX). As an example, a profile can be generated based on cost, duration and start time of activities to be completed as part of a project. Normal practice is for the steps to create a cost versus time profile to be handled by different teams, using different tools to complete the necessary steps in a workflow, which may include: technical feasibility of a project using domain tools (e.g., facilities, drilling, subsea); estimation costs of major equipment; cost estimation (e.g., expert opinion, parametric estimate or three point estimate); duration estimation (e.g., expert opinion, parametric estimate or three point estimate); sequencing of activities to define a plan (e.g., using a scheduling tool); and economics (e.g., via an economist).

Currently, the foregoing steps are performed using different tools and by different teams. As such, the triple constraint may be violated without even knowing it has been violated. In particular, it is hard to make sure that information from each step remains coherent and therefore enables a holistic trade-off of cost, time and scope. Where an iteration is desired, a team may be already assigned to another project and/or scenarios of a team deleted. Such an approach can readily violate constraints and result in wasted resources and time. Often iterations tend to be performed in linearly in a waterfall fashion, which can consume excessive amounts of time and limit options that can be examined within the time available.

To track outputs of teams, a spreadsheet application may be utilized such as EXCEL (Microsoft Corporation, Redmond, Washington). Use of spreadsheets has down-sides, as they can become quite complicated, with many embedded formulae. Further, a cost methodology may be difficult to re-use on a future project, unless the data are input in a way that is prescribed by the spreadsheet. Such a methodology can be hard to understand because it is buried in many formulae, or in some cases contained in a macro. To address issues that can arise when team members, different teams, etc., utilize different tools, various embodiments are herein described where a FDS can respond to input from a number of users to generate output that becomes available in real-time for projects that may be subject to various constraints (e.g., consider projects subject to a triple constraint).

As an example, a FDS can utilize a parametric approach to enable a quick and easy trade-off of time, cost, and scope (e.g., a triple constraint), thereby greatly improving the ability to set realistic expectations for projects. As an example, a FDS can respond to changes such that if one of the three aspects is changed, the FDS can generate impacts on the other two aspects. In such an approach, the FDS can facilitate honing in on an optimal scenario, for example, through rapid iterations that can define a realistic compromise of these three aspects.

A FDS can include components for balancing scope, time, and cost considerations via a collaborative workflow, whereby if one or more aspects of the triple constraint are altered, the FDS can generate graphics as to trade-offs against one or more other aspects. Such an approach can provide a better starting point for projects, increase the quality of decision making at early project stages and therefore the chance of project success within agreed constraints (e.g., time, budget, etc.).

As to scope of a project, it can be represented by equipment to be acquired together with tasks to be performed to deliver the project. An equipment list can be generated through simulation of one or more processes, together with supporting systems (e.g., utilities) to carry out the one or more process. As an example, a workflow can include re-simulating with different inputs to re-generate an equipment list, which, if the equipment differs, can change the scope of a project. As mentioned, one or more frameworks can include simulators (e.g., simulation engines) to perform simulations, which can include simulation of equipment operations where such equipment may provide for drilling, completing, pumping, separating, etc. For example, consider simulating drilling of a well to access an oil and gas reservoir, simulating one or more completion operations for completing a well, simulating pumping of one or more fluids of an oil and gas reservoir, simulating separating of water and/or gas from oil, simulating compressing of gas for injection as part of an artificial lift technique, simulating flaring of gas, simulating transport of one or more fluids, simulating energy generating using at least a portion of one or more fluids, simulating operation of one or more generators, simulating operation of solar power equipment, simulating operation of wind power equipment, simulating generation of emissions, simulating transport of emissions (e.g., by wind, water, etc.), etc.

As to cost, major equipment can represent about 20 to 30 percent of an overall project cost where the remainder may be associated largely with labor and materials, noting that various systems costs may be taken into account (e.g., consider C2C costs, etc.). The cost of the labor and materials may be built up based on the cost of procured equipment, which may include costs for building, maintenance, operations, decommissioning, etc. An intrinsic link exists between scope and cost.

As to time, it can include time to complete activities as may depend upon resources required to carry out each of the activities. In the case of activities which depend on labor of some form, the total cost of resources and resource cost per unit of time can be known and therefore converted into a time duration of an activity. As an example, activities with cost and duration can be sequenced in order to determine a total project duration. Time can include some uncertainties. For example, behavior of a reservoir can impact time. As an example, consider a reservoir that has an associated production decline curve where production in fluid volume per unit time can decline over a period of weeks, months, or years. Additionally, various changes in technology may occur over time, which can impact operations. For example, consider more efficient solar panels and/or lower cost solar panels where certain types of energy generated at a site may be changed from one source to another source. If one source is from energy embodied in hydrocarbons of reservoir fluid, the reservoir fluid may be produced differently via a fluid flow network. For example, rather than diverting a portion of gas to a generator for producing electrical power, that portion of gas may be compressed for storage and/or transport as a commodity. In such an example, one or more portions of a fluid flow network may operate differently with respect to time. As such, time can be a factor driven by physical factors, whether in technology, reservoir behavior, regulations, etc.

Figure 6:
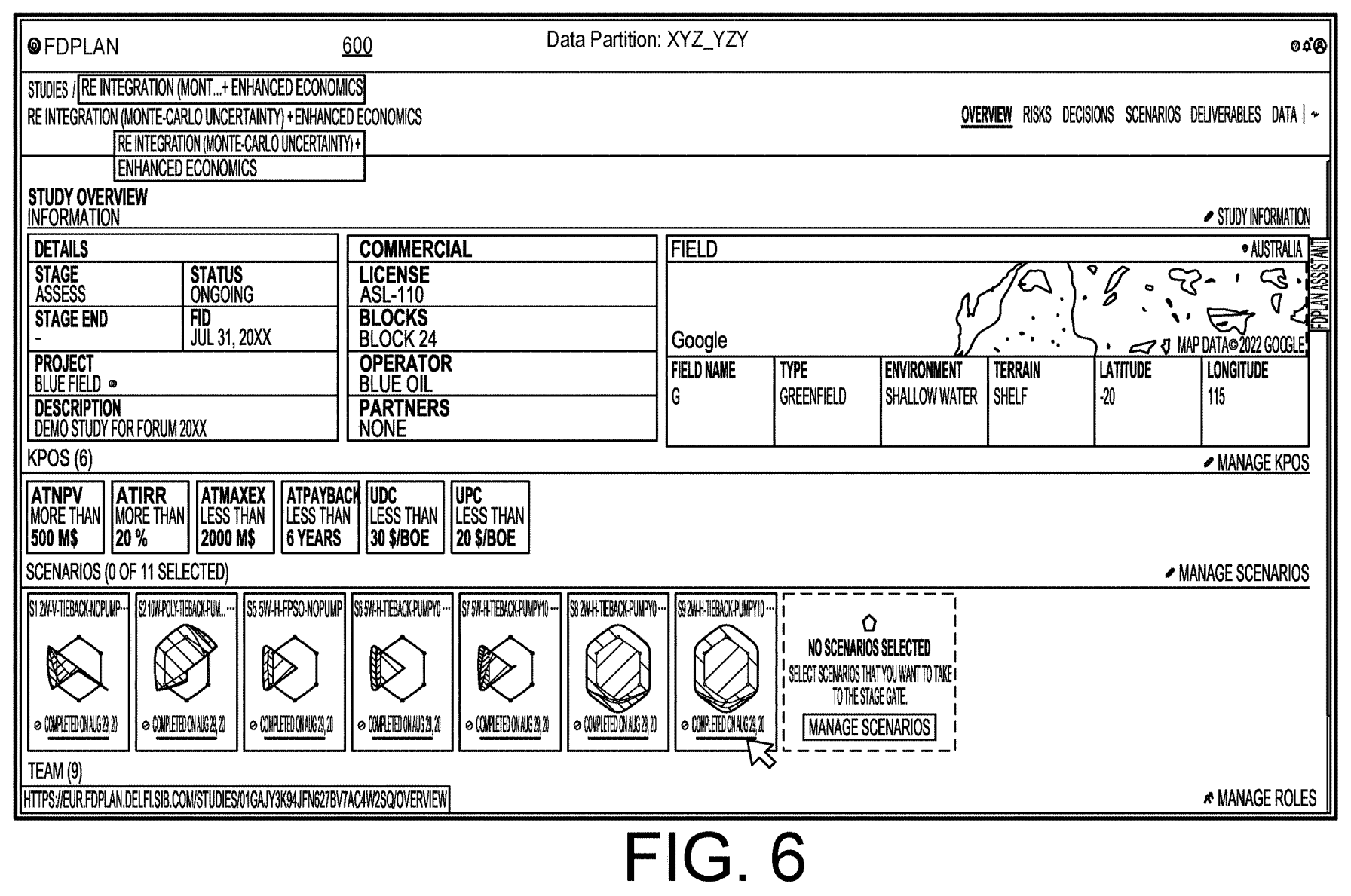

FIG. 6 shows an example of a graphical user interface (GUI) 600 of a framework, which may be a part of a FDS and/or operatively coupled to a FDS. In the example GUI 600, various performance indicators (PIs) can be assessed with respect to a project, which may involve assessing a number of scenarios. As shown, a study overview can be presented for a project at a particular location associated with fluid handling, which can include one or more of fluid production, fluid injection, fluid separation, fluid disposal, fluid compression, etc. In the example of FIG. 6, the project is associated with a reservoir that includes hydrocarbon fluid. As shown, various scenarios can be assessed with respect to performance indicators using spider charts. In the example of FIG. 6, eleven scenarios are shown, which include constraints such as completion dates. In such an example, a FDS can provide for revising one or more of the scenarios and/or generating a new scenario in an expeditious manner, which can include directing a user to adjust one or more of scope, cost and time in an informed manner. Such an approach can bypass a spreadsheet approach. As explained, a FDS can harness one or more simulators and/or other types of frameworks, which may be executed in a foreground mode and/or a background mode. For example, for a particular scenario, a FDS may recognize that scope may be adjusted and provide for recommendation of a simulation that aims to generate an equipment list that may provide for a better balance between scope, cost, and time. As an example, a FDS may automatically execute such a simulation and/or generate a recommendation for a user to execute such a simulation.

As an example, a FDS can be part of a loop that can operate intelligently in an iterative manner to expeditiously arrive at an optimal scenario. Such a loop can include a human (e.g., a human in the loop (HITL)) or may operate according to one or more parameters, which may optionally be set by a user). As an example, parameters may include parameters from a selectable set of parameters, for example, as to whether or not to include various factors that may be part of a complete set of C2C types of factors. Through selection of factors, a user may tailor a FDS to operate within a tailored domain to generate an optimal scenario. In the example of FIG. 6, the scenario S9 (see cursor arrow) may be more optimal than the others based on area coverage and extent of meeting target performance indicators.

As an example, a FDS may include one or more features of a facilities planner framework such as the FDPLAN framework (SLB, Houston, Texas). The FDPLAN framework is a collaborative facility design, costing and planning solution for conceptual engineering, used to mature and de-risk the facilities scope. It places teams within a common workspace, enhancing collaboration with concurrent engineering. It has facility modeling features, appropriate for early project phases, which enables iterations to analyze a wide range of facility options. It enables continuous improvement of facility engineering estimates, by managing data and information to reduce subjectivity. It provides high quality deliverables to validate the estimates produced by the team and enables comparative evaluation of scenarios involving different facility designs, reservoir feeds, export specifications, and execution strategies.

FIG. 7 shows example GUIs 710 and 720 as associated with a facilities planner framework (e.g., the FDPLAN framework, etc.). As shown in the GUI 720, a workflow with collaboration can be relatively complex. In particular, various factors are shown, which may be inputs to a facilities planner framework (e.g., or simply facilities planner). As explained, simulations may be performed where outputs thereof may be directed to a facilities planner. As an example, one or more simulation frameworks may be interoperable with a facilities planner.

Figure 8:
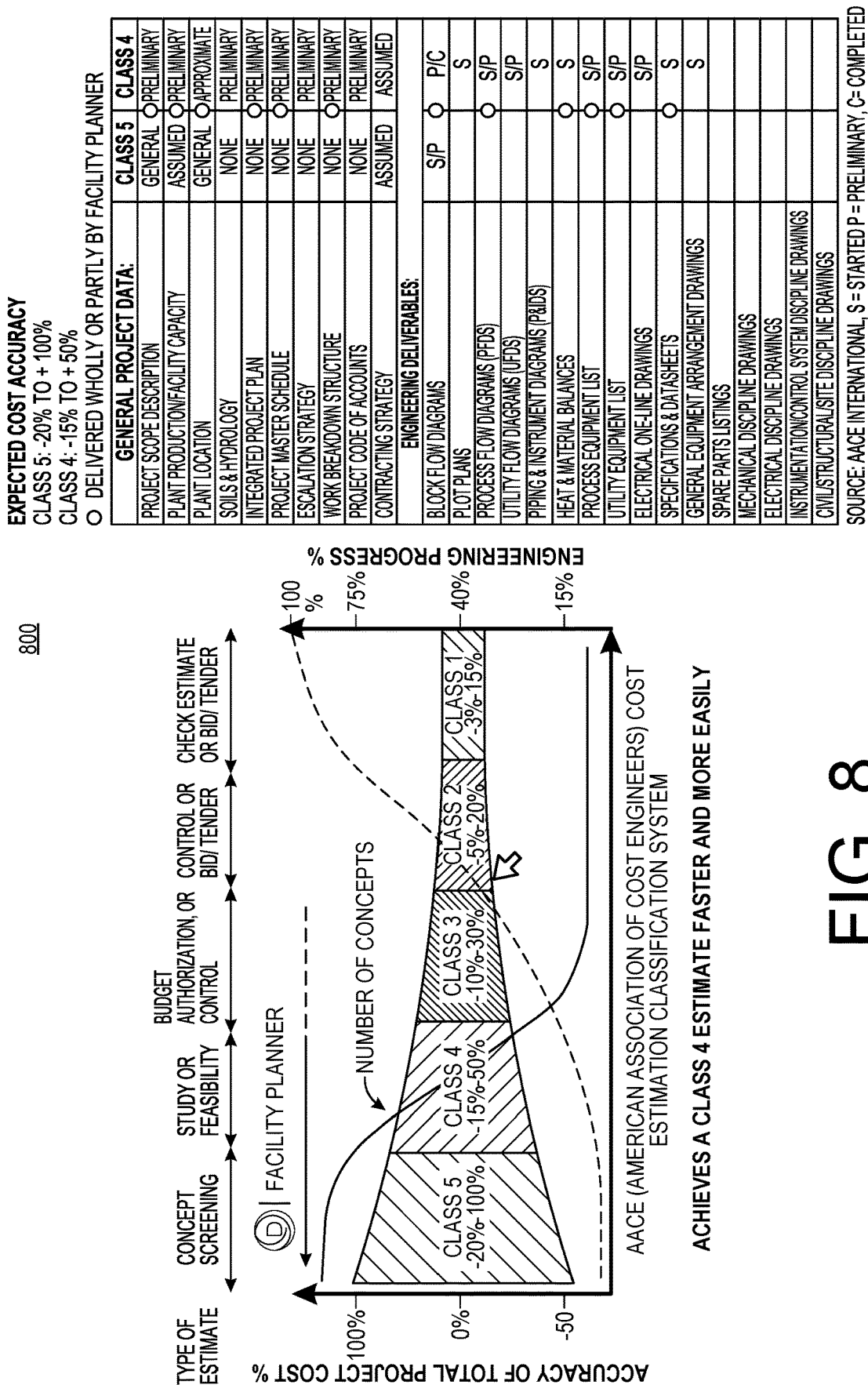
FIG. 8 illustrates an example of a graphical user interface.

FIG. 8 shows an example GUI 800 that includes various features, noting a plot of number of concepts and accuracy of total project demands along with engineering progress. The GUI 800 also includes a table of expected cost accuracy. As shown, a class system may be utilized such as, for example, a standardized class system (see, e.g., AACE International Recommended Practice No. 56R-08 as to building and general construction industries). For example, a class 4 estimate may be defined as being prepared based on limited information, which may result in relatively wide accuracy ranges. As an example, a class 4 estimate may be utilized for screening, determining feasibility, concept evaluation, etc. As an example, a system may provide for rapid output of a class 4 estimate with a high level of accuracy, which may be characterized in one or more manners. As to accuracy, a class 4 estimate may range to approximately 20 percent to 30 percent on a hide side when characterized at an 80 percent confidence interval; whereas, for example, a class 3 estimate may be 10 percent to 20 percent, a class 2 estimate may be 5 percent to 15 percent, and a class 1 estimate may be from 3 percent to 10 percent on the high side. As indicated, achieving accuracy for a number of concepts can take a considerable amount of time. As an example, a system may reduce the amount of time while also improving accuracy.

Figure 9:
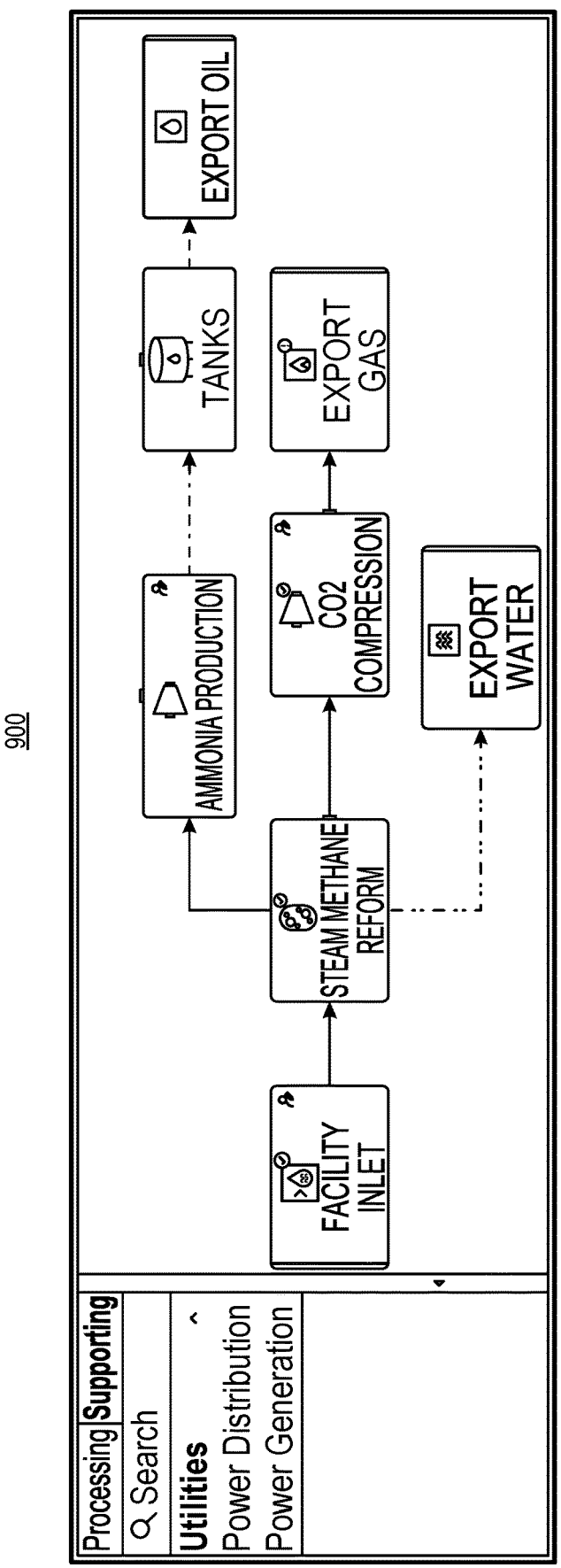
FIG. 9 illustrates an example of a graphical user interface.

FIG. 9 shows an example GUI 900 that includes various drag and drop items for building a field system with various types of equipment that can be part of a fluid network. The GUI 900 may be utilized as part of a model building process for scope of a project. In the GUI 900, a block flow diagram can be generated to define the scope of a facility project, represented by functional systems and their relationship to each other. In the example of FIG. 9, graphics are included for export of oil, export of gas, and export of water. As explained, field equipment may provide for separation of various fluids present in reservoir fluid where, for example, one or more of such fluids may provide an energy source for driving one or more operations using one or more pieces of field equipment. In such an approach, a cycle may exist where a change in output of a particular fluid may impact energy, emissions, etc., as to one or more processes.

Figure 10:
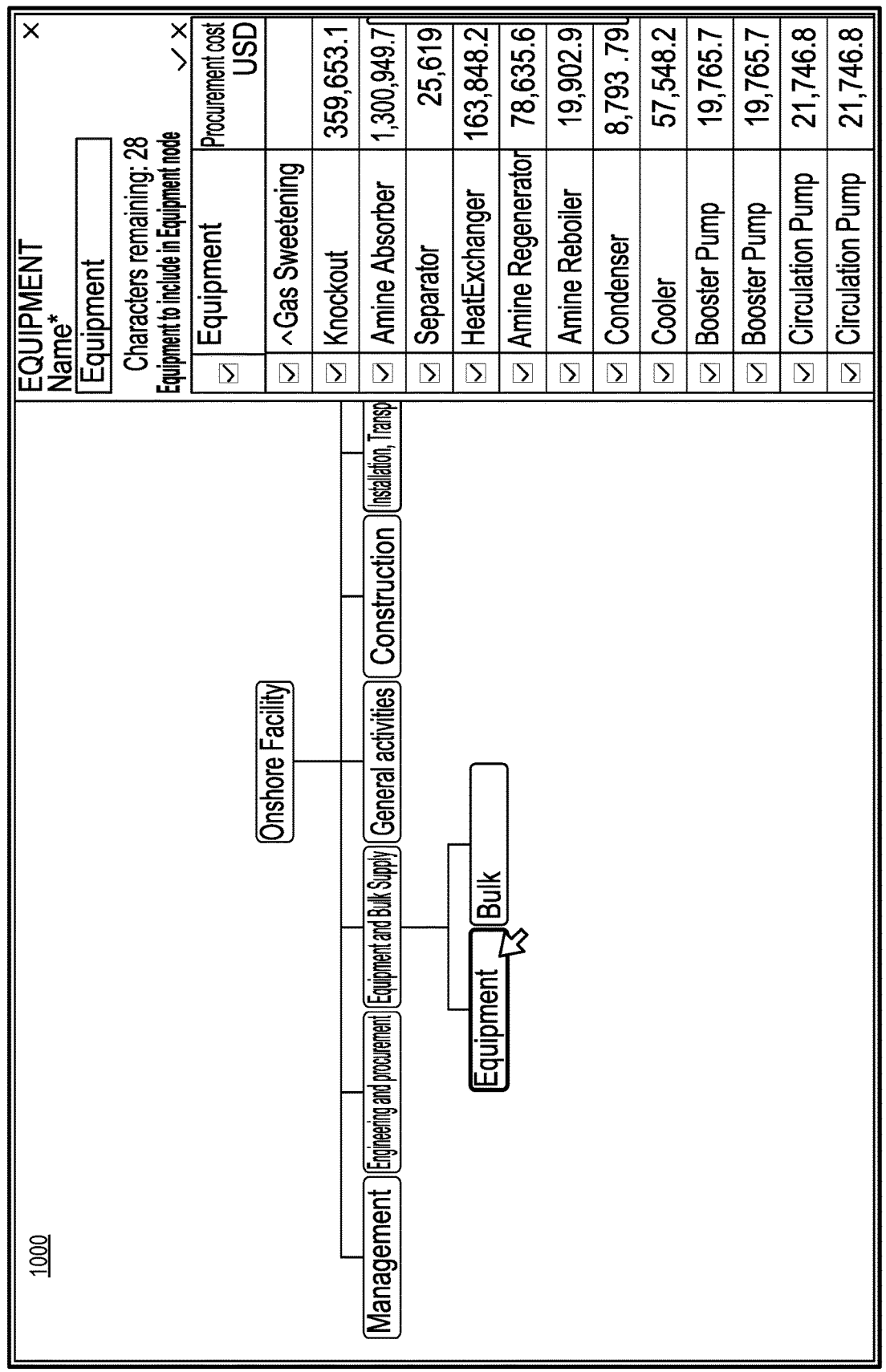
FIG. 10 illustrates an example of a graphical user interface.

FIG. 10 shows an example GUI 1000 that includes various features for generation of a work breakdown structure and associated procured equipment (e.g., from an equipment list). A work breakdown structure (WBS) for a facility concept represents the work to be performed to deliver an agreed scope of the facility project within an agreed time and budget. As an example, a WBS can be used to take into account a construction strategy, procurement strategy, and contracting strategy that is decided to meet the project objectives.

A WBS can be linked to estimation logic, which can provide for determination of cost and duration of the activities and, for example, to generate a Gantt chart, which may be used to manually specify sequencing of activities. Populating a WBS with the SAB, PBS, and location means that the proper default values and breakdowns are used to calculate the resources (classified using the COR) and thereby determine the cost and duration of an activity.

Figure 11:
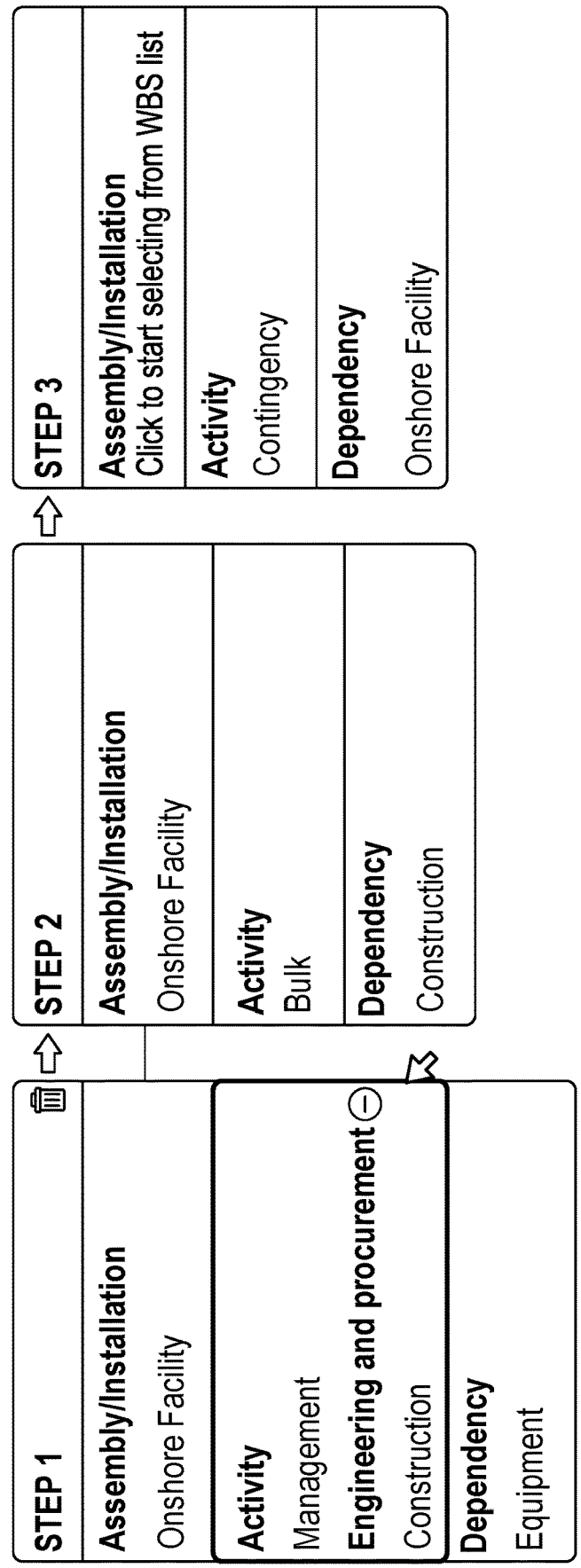
FIG. 11 illustrates examples of graphical user interfaces.

FIG. 11 shows an example GUI 1100 for generation of cost logic steps. Such a GUI may be used to implement estimation logic for determines as to cost and duration of activities from a WBS. A framework may consider a series of steps, which are executed in sequence to reach an end result. Each step may be calculated individually and a roll up of cost computation performed after each step. Such an approach enables a step to have a dependency on the results of a preceding step.

As an example, a dependency can be an equipment supply activity where activities calculated can be rendered to a GUI along with context for the cost and duration logic. In the example GUIs of FIGS. 6 to 11, the project relates to an onshore facility; noting that on-shore and/or off-shore facilities may be handled.

FIG. 12 shows an example of a GUI 1200 that includes features for logic editing for construction of a facilities. Such a GUI may be utilized in a workflow following use of the GUI 1100 of FIG. 11. For example, the GUI 1200 may be part of a fourth step that sets up defaults for cost and duration estimation. As shown in the example of FIG. 12, a user can select an activity in an activity section to open up an edit cost logic dialog box, where default estimation logic is shown and where adjustments may be made.

FIG. 13 shows an example of a GUI 1300 that can be part of a workflow, particularly for running a calculation to estimate cost and duration of activities. As shown, the GUI 1300 can include various drop-down menus with items that may be associated with costs, durations, etc.

Figure 14:
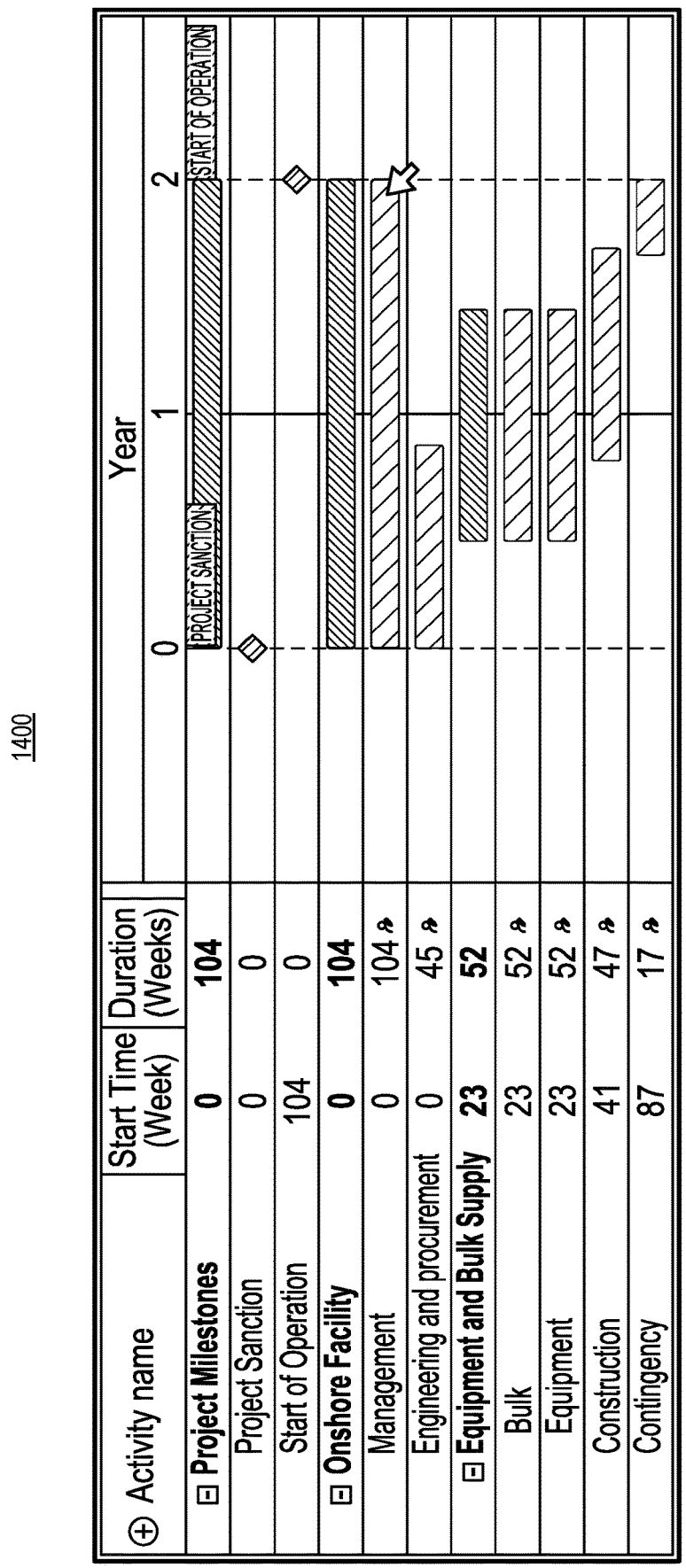
FIG. 14 illustrates an example of a graphical user interface.

FIG. 14 shows an example of a GUI 1400 that can be part of a workflow, particularly for sequencing activities to obtain an overall project duration. As an example, a workflow can include, following the definition of the cost and the duration for activities, sequencing of activities to establish an overall duration estimate for a facility project. For example, such a task can aim to fit the project activities between project milestones, or else re-negotiate those milestones with project stakeholders. As an example, a GUI may include one or more graphics for representing swimlanes (e.g., with respect to time, etc.).

As an example, a FDS can provide support for a workflow as outlined in the GUIs 1000, 1100, 1200 and 1300, which can relate to tasks, such as tasks two to five of a workflow involving the GUIs 900, 1000, 1100, 1200, 1300 and 1400 (e.g., a six-task workflow).

As an example, a FDS can provide for linking the definition of scope via a major equipment list to project cost and duration.

Figure 15:
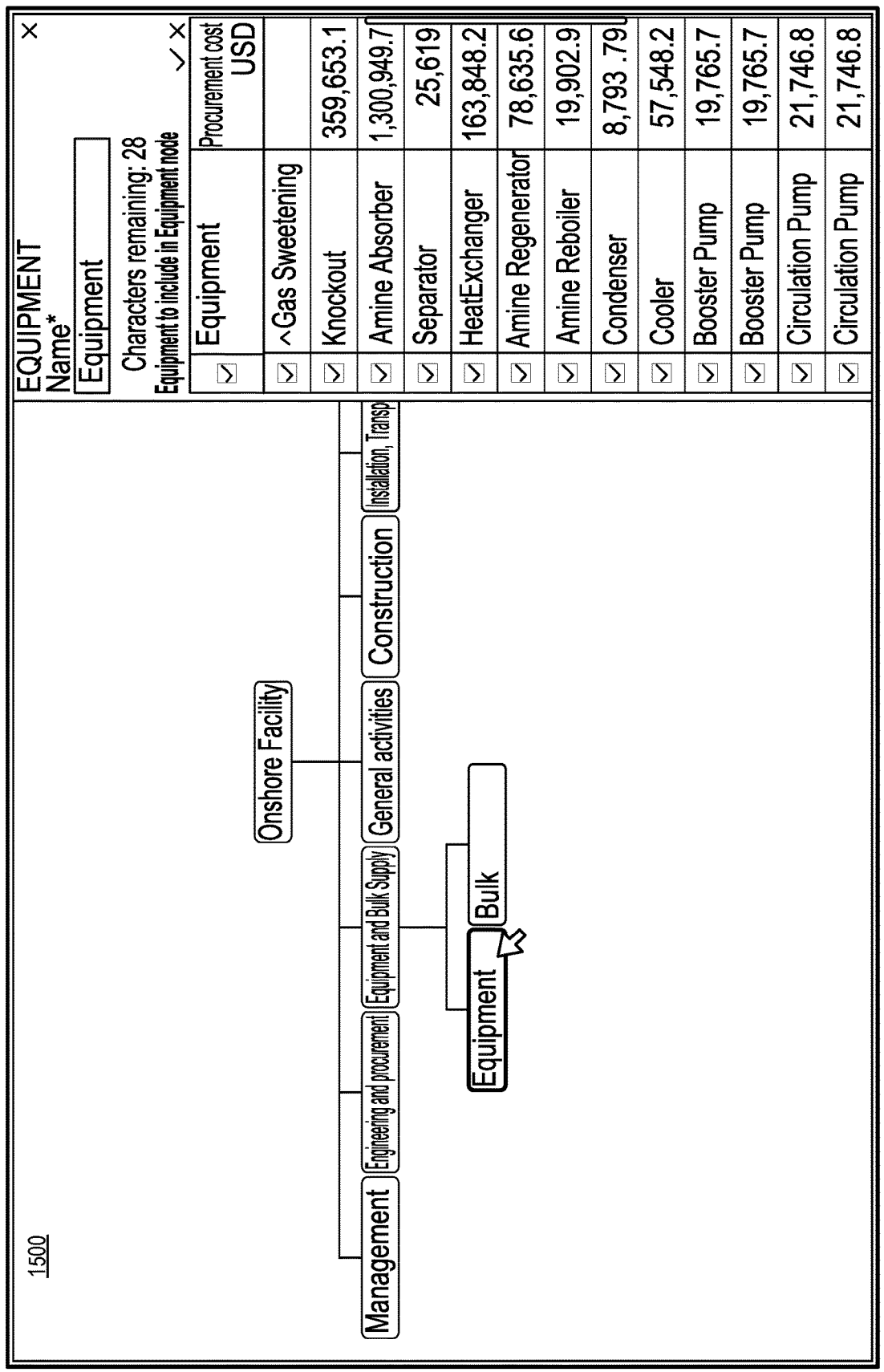
FIG. 15 illustrates an example of a graphical user interface.

FIG. 15 shows an example of a GUI 1500 that can provide for generating a WBS and associating it with a procured equipment (e.g., from an equipment list). As mentioned, a WBS for a facility concept represents the work to deliver an agreed scope of the facility project within an agreed time and budget where the WBS can be used to take into account construction strategy, procurement strategy, and contracting strategy to meet the project objectives. In the example of FIG. 15, the GUI 1500 provides flexibility in the way a WBS can be built; noting that a FDS can provide a standard hierarchy of activities and activity types, for example, following the ISO 19008 standard. The ISO 19008 is a multi-faceted standard that can identify activities in a WBS using a multi-faceted standard cost coding system (SCCS), which can be used to exchange data in a standardized way with other organizations.

The SCCS takes into account: physical breakdown structure (PBS), particularly the type of installation, assembly or infrastructure being built; standard activity breakdown (SAB), specifically the type of activity; and code of resources (COR), which provide for specifying resources for each activity.

The International Organization of Standardization (ISO) acknowledged the use of ISO 19008:2016. The ISO Standards Maintenance Portal provides a detailed summary of physical breakdown structure, activity types and code of resources. Activity types, description, and codes may be used in an unmodified form.

As an example, a WBS can be linked to estimation logic, which can be used to determine cost and duration of activities and to generate a Gantt chart, which may be used to specify sequencing of activities. Populating a WBS with the SAB, PBS, and location means that the proper default values and breakdowns are used to calculate the resources (classified using the COR) and thereby determine the cost and duration of an activity.

Figure 16:
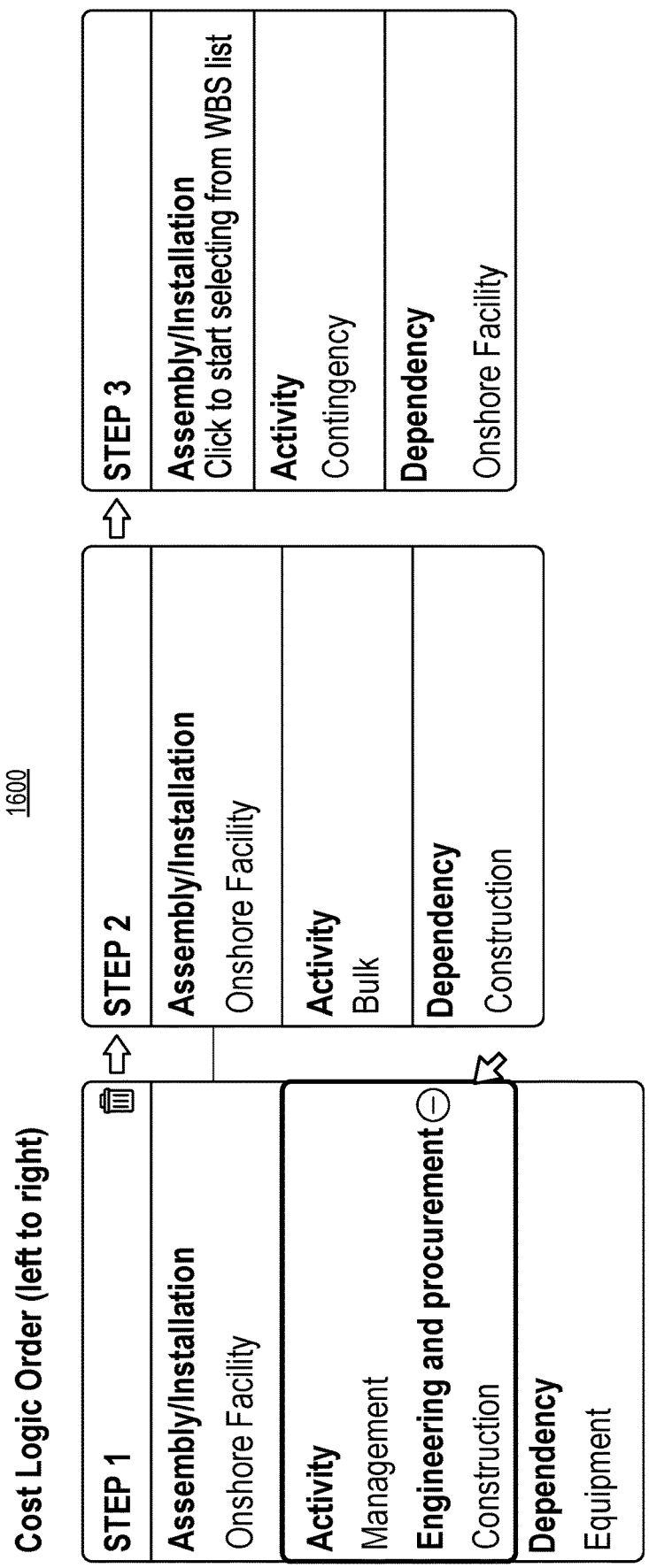
FIG. 16 illustrates examples of graphical user interfaces.

FIG. 16 shows an example GUI 1600 for generating cost logic steps, shown as including steps 1, 2 and 3. As an example, estimation logic can be used to determine cost and duration of activities from a WBS. As an example, a workflow can include a series of steps executed in a sequence to reach an end result. As such a workflow progresses, each step may be calculated individually where a roll up of cost is performed after each step. Such an approach enables a step to have a dependency on the results of a preceding step.

Estimation logic can enforce rules when performing the calculation. For example, consider a rule that makes it impossible to calculate the cost of a parent activity using the estimation logic and a rule that makes it impossible to manually specify duration of a parent activity, because duration of the parent activity depends on the sequencing which is done in the Gantt chart.

As an example, an individual cost logic step can include three different sections: assembly/installation, activity, and dependency. As to assembly/installation, it can provide context to cost and duration calculation which can involve adding one or more activities from a WBS, which is part of a physical breakdown structure (PBS). Adding a PBS activity here means that the default values for the activities that are being calculated are specific to a certain assembly and installation. As an example, a GUI such as the GUI 1600 can provide for limiting addition to one assembly and installation in this section. As an example, if the section is left blank, the cost and duration logic defaults are not allocated to the activities being calculated, but may still be manually specified.

As to activity, this section provides for placing activities for which to calculate cost and duration in the context of a particular assembly and installation. This section can accept multiple activities, each of which may be calculated individually.

As to dependency, this section can specify an activity from a WBS. The dependency section can accept multiple activities, which can be summed and used together as the dependency when calculating the activities in the activity section.

In the example GUI 1600, the steps show dependencies of equipment, construction, and onshore facility for various activities. As explained, activities can be selected from a WBS. As shown under step 3 of the GUI 1600, an activity may be a contingency activity. In the example GUI 1600, the dependency is the equipment supply activity, and the activities calculated are shown in the central section and the context for the cost and duration logic is an onshore facility.

FIG. 17 shows an example GUI 1700 for editing cost logic for construction, which may be a fourth task of a six task workflow. The GUI 1700 can be utilized to set up proper defaults for cost estimation, appropriate for the assembly/installation being estimated. In the example GUI 1700, a user can select an activity in the activity section to open up the edit cost logic dialog box, where the default estimation logic is shown and where adjustments can be made.

As an example, estimation logic can include a header that provides for specifying activity type as from a standard activity breakdown (SAB) and for specifying location of an activity, as may be configured via a WBS GUI. A header can also provide for selection of a cost estimation methodology. As an example, features can provide for selection of "all inclusive" or "bulks and labor". As to "all inclusive", it can be utilized where a total activity cost is fixed and the cost breakdown of the activity is varied to produce different costs and quantities of resources. As to "bulks and labor", it can be utilized when the costs of bulks and labor are fixed. Other resource costs, such as land-based plant and equipment (hired equipment) can be additional costs that may be added to bulks and labor and which might change the total activity cost. In both cases, an activity cost breakdown can be provided, already adjusted for the assembly/installation, activity type, and activity location. The two approaches can be coherent with each other, such that if one is adjusted, the other is also updated.

FIG. 18 shows an example GUI 1800 for cost inputs. Cost and duration can both be computed based on cost inputs. The results of an activity calculation will be different, depending on what is selected.

As to cost factors, when editing a cost factors, this increases the capital available for an activity beyond what is specified in the cost inputs. As to a location factor, it can be a user defined multiplier, applied to the total cost of the activity, to account for change in cost due to location. It may be set to 1.0 by default, because the default value for the percentage of dependency already includes the adjustment for the location. As to an escalation factor, it can be a user defined multiplier, applied to the total cost of the activity to account for changes is technical, economic, and market conditions over time. It may be set to 1.0 by default, because the default value for percentage of dependency already represents prices in the money of today.

As to an activity cost breakdown, it can be a breakdown of total activity cost into resources required for an activity. It can be the same, regardless of which cost methodology is used. Categories of resources available may be determined according to the code of resources (COR) section of the ISO 19008 standard, and descriptions are available when various icons are selected within an activity cost breakdown.

As to labor cost parameters, these can be informative as to what parameters are input to the default cost settings for percentage of dependency as a reference. These parameters can be updated after calculation. Labor cost parameters can include, for example: cost per resource hour, productivity factor and resource hours.

As to cost per resource hour, this is the average cost per resource hour for the resource category and is an input to calculating the duration of the activity from the cost, for example, for direct labor, engineering personnel, vessel cost for marine operations, or an all-inclusive rate. It can have a default value, which can be adjusted by the labor rate multiplier.

As to productivity factor, it is a multiplier which defines how many resource hours the work takes at a location, compared to the USA gulf coast. It is not used as part of the calculation of duration based on cost, since an assumption about productivity for the location is already included in the percentage of dependency value. The effect of a change to productivity, compared to the assumed value is that the capital required to complete an activity change. However, the activity cost may not be updated automatically. When the cost is calculated from the duration, the productivity factor is an input to the calculation of cost.

As to resource hours, it can be the number of resource hours which can be paid for with the available capital. This number can be a result of the calculation of duration from cost and can be rendered using a GUI to enable the results of the calculation to be validated.

As an example, a work pattern may be specified. For example, consider a work pattern that can be used to determine duration of an activity based on a pre-defined category of resources that varies by activity type (e.g., some form of labor). Parameter for a work pattern can include: average number of resources (e.g., number of resources working simultaneously to complete the activity); working days/week (e.g., how many working days there are in a week for the activity); number of shifts (e.g., how many shifts there are in a day, with each shift containing the same average number of resources); hours per shift (e.g., how long each shift is (hours per shift×number of shifts should not be greater than 24 hours, because shifts are assumed to not overlap)); labor rate multiplier (e.g., a user defined multiplier, which is applied to the cost per resource hour as part of the activity cost and duration calculation); and efficiency. As to efficiency, it may be a user defined modifier, which can be applied to alter the productivity factor to account for changes in efficiency that might happen, for example, because of the handover between shifts (revised productivity=default productivity/efficiency). As an example, productivity may not be used when calculating the duration from the cost; however, the productivity can be an input to the calculation when calculating cost from duration.

FIG. 19 shows an example GUI 1900 for running a computation to estimate cost and duration of activities. As shown in the example GUI 1900, a search feature may be utilized to cause a search engine to find a particular entry. In the example GUI 1900, each item in the left column can include an associated cost and duration, noting that for the example onshore facility, cost is over $100 million with a duration of 104 weeks (e.g., two years). As to contingency, it is shown to be over $27 million with a duration of 17 weeks. As explained, such values can depend on scope, where scope can be ascertained via one or more simulations, which can include simulations of equipment and interactions of equipment with fluid (e.g., fluid separation, fluid pumping, fluid burning, etc.).

As an example, a FDS may include utilization of energy balances. For example, cost may include and/or be recast as energy where energy is accounted for using one or more life-cycle analysis, C2C, etc., techniques. In such an approach, various types of carbon may be taken into account, which can include embedded carbon. As an example, one or more greenhouse gases (GHGs) may be taken into account. As such, while cost is indicated as part of a triple constraint, it may include and/or be replaced with another metric that has a direct physical meaning.

As an example, computation calculation of total activity cost, resource hours, duration, and productivity factor can be consistent between different techniques (e.g., "all inclusive"

and "bulks and labor"). An activity cost breakdown can also be coherent between different techniques.

Figure 20:
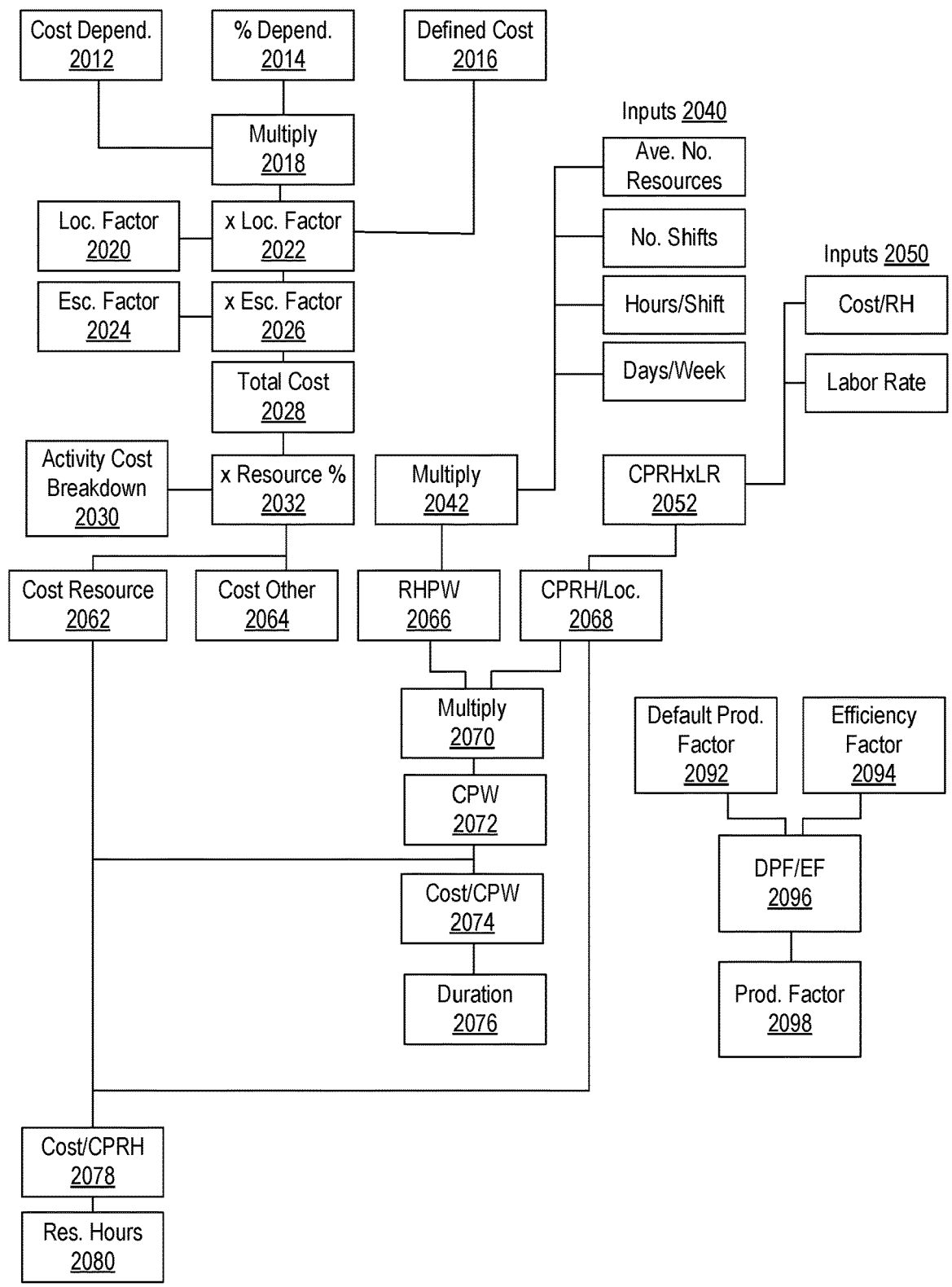
FIG. 20 illustrates an example of a method.

FIG. 20 shows an example of a method 2000 for an "all inclusive" approach that includes various logical operations. As explained, a FDS can respond to inputs from a number of users to generate real-time output for a selected technique or techniques. For example, through interactions with one or more GUIs, a FDS may perform one or more actions of the method 2000 to generate real-time output for an "all inclusive" approach that can then be available to users of a team or teams.

As shown, the example method 2000 can include performing various actions, which may include receiving data as may be provided via one or more data sources, one or more graphical user interfaces (GUIs), etc. In the example of FIG. 20, the method 2000 includes a cost of dependency block 2012, a percent of dependency block 2014 (e.g., all inclusive), and a user defined cost block 2016 (e.g., all inclusive). As shown, a multiplication block 2018 can provide for determining a product of cost of dependency and percent of dependency; another multiplication block 2022 can provide for determining a product of output of the block 2018, a user defined cost, and a location factor per a block 2020; and yet another multiplication block 2026 can provide for determining a product of output of the block 2022 and an escalation factor per a block 2024. As an example, output of the block 2026 may be a total activity cost, per a block 2028.

In the example method 2000, in a multiplication block 2032, the total activity cost may be multiplied by a resource percent, which may be provided via an activity cost breakdown block 2030 where output of the block 2032 may be directed to a cost of resource for duration computation block 2062 and a cost of other resources block 2064.

In the example method 2000, another branch involves inputs 2040 such as, for example, average number of resources, number of shifts, hours per shift and working days per week, which may be utilized by a multiplication block 2042. As shown, output of the block 2042 can provide resource hours per week (RHPW) per a block 2066. In yet another branch, inputs 2050 can include cost per resource hour (CPRH) and labor rate (LR), which may be multiplied in a multiplication block 2052 where a CPRH per location may be determined per a block 2068.

In the example of FIG. 20, output from multiple branches may be combined in a multiplication block 2070, which may determine a cost per week (CPW) per a block 2072. In such an example, output of the block 2062 may be utilized in a division block 2074 to divide cost of resources used for duration by cost per week, which may provide an output of duration (e.g., weeks) that can be funded with available capital per a block 2076. Further, the method 2000 may include directing output of the block 2062 and the block 2068 to a block 2078 to divide cost of resources for duration by cost per resource hour to generate a number of resource hours per a block 2080.

FIG. 20 also shows an example process for determining a productivity factor, which may be determined by receiving a default productivity factor per a block 2092 and an efficiency factor per a block 2094 and then dividing the default productivity factor (DPF) by the efficiency factor (EF) per a block 2096 to output a productivity factor per a block 2098. In such an approach, a productivity factor can depend on efficiency.

Figure 21:
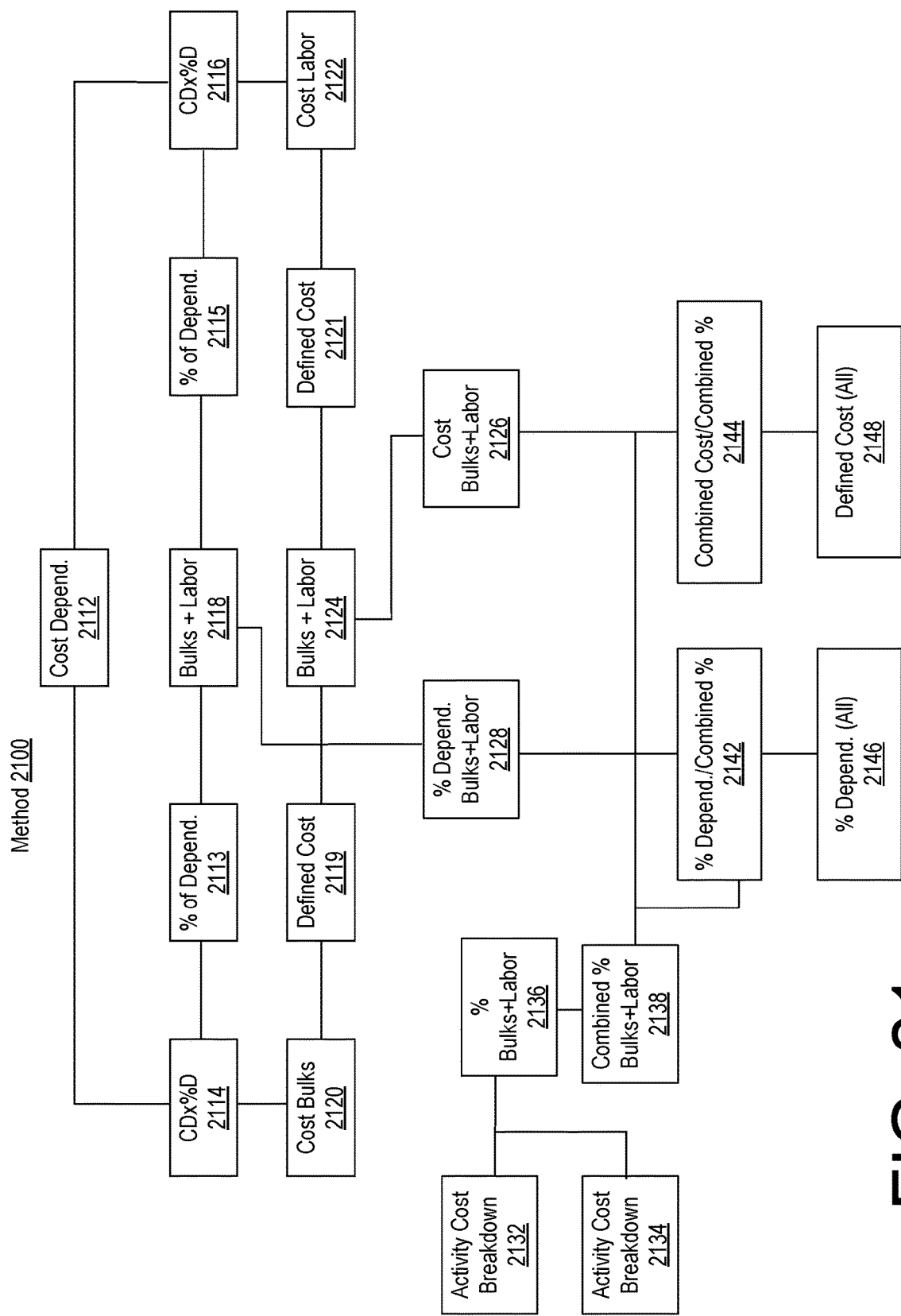
FIG. 21 illustrates an example of a method.

FIG. 21 shows an example of a method 2100 for a "bulks and labor" approach that includes various logical operations. Logic blocks of the method 2100 show where outputs from the "bulks and labor" approach can be used as inputs to the calculation of total activity cost and the duration, for example, as in the "all inclusive" method 2000 of FIG. 20.

As shown in the example of FIG. 21, the method 2100 can include a cost dependency block 2112 that can provide output to multiplication blocks 2114 and 2116 that can also receive output from a percent of dependency (bulks) block 2113 and a percent of dependency (labor) block 2115, which may also provide output to a bulks plus labor block 2118. As shown, the multiplication block 2114 can provide output as to cost of bulks per a block 2120 and the multiplication block 2116 can provide output as to cost of labor per a block 2122, which may be utilized for a duration computation, where the blocks 2120 and 2122 further depend on a defined cost as to bulks per a block 2119 and a defined cost as to labor per a block 2121, respectively. As shown, outputs of the blocks 2119 and 2121 may be combined in a block 2124 that adds these costs.

In the example of FIG. 21, output of the block 2118 can be provided to a block 2128 for determination of a combined percent of dependency of bulks and labor and output of the block 2124 can be provided to a block 2126 for determination of a combined cost of bulks and labor. The block 2128 can provide output to a block 2142 and the block 2126 can provide output to a block 2144 where such outputs can be combined with information from a branch that involves utilization of an activity cost breakdown for bulks per a block 2132 and an activity cost breakdown for labor per a block 2134, which may be utilized to determine a sum of a percent of bulks and labor per a block 2136. Output of the block 2136 may be directed to a block 2138 to determine a combined percentage of bulks and labor from the activity cost breakdowns for bulks and labor. As shown, output of the block 2138 can be directed to the blocks 2142 and 2144 where the block 2142 may divide the combined percentage of dependency of bulks and labor by the combined percentage of bulks and labor from the activity cost breakdowns to output a percentage of dependency (e.g., all inclusive) per a block 2146 and where the block 2144 may divide the combined cost of bulks and labor by the combined percentage of bulks and labor from the activity cost breakdowns to output a user defined cost (e.g., all inclusive) per a block 2148.

Figure 22:
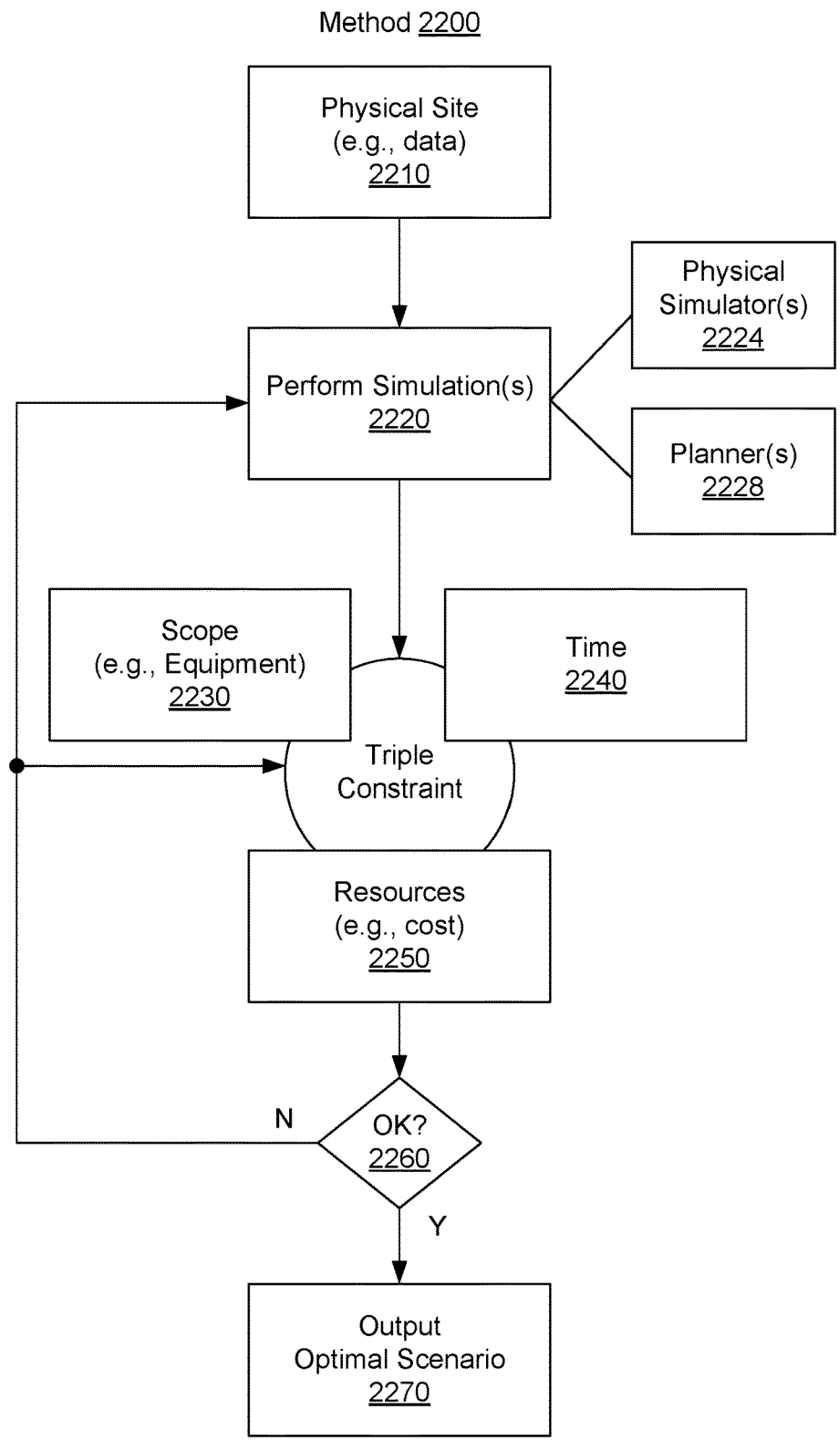
FIG. 22 illustrates an example of a method.

FIG. 22 shows an example of a method 2200 that includes a site block 2210 for providing field data and optionally other data for a field site, a simulation block 2220 for performing one or more simulations using at least a portion of the field data for the field site where simulations may include use of one or more physical simulators 2224 and/or use of one or more planners 2228 (e.g., PDDL problem solving planners, etc.), a triple constraint cycle that includes a scope block 2230, a time block 2240 and a resource block 2250 (e.g., cost block) to output one or more scenarios for the field site, a decision block 2260 that decides if an optimal scenario has been generated, and an output block 2270 for outputting the optimal scenario. As shown, the decision block 2260 includes a yes branch (Y) and a no branch (N) where the yes branch leads to the output block 2270 and where the no branch can lead to the simulation block 2220 and/or to one or more of the blocks 2230, 2240 and 2250 of the triple constraint cycle.

As an example, the method 2200 may provide for expedited scenario generation using holistic trade-offs of project time, cost and scope using flexible estimation logic (see, e.g., the methods 2000, 2100, etc.). The method 2200 can provide a means of balancing scope, time and cost considerations via a collaborative workflow, whereby if one of these aspects of a triple constraint is altered, a FDS can provide for visibility of a trade-off against one or more other aspects. Such an approach enables a better starting point for projects, increases the quality of decision making at early project stages and therefore the chance of project success within the agreed time and budget.

As explained, a method may be implemented using a FDS that can provide for ease of scenario generation according to the triple constraints of scope, time and cost. A FDS can expedite scenario generation and arrival at an optimal scenario. As explained, a FDS can access one or more frameworks to perform one or more tasks, which may be in a coordinated manner. For example, simulations may be performed where results are stored and where an assessment of results may be utilized for scenario generation and/or scenario modification, optionally with or without performing one or more additional simulations. As an example, simulations can include generating realizations where a sampling process may be utilized to select a realization and/or a simulation result. As an example, a method can include re-sampling, optionally using a different sampling technique to generate a new equipment list and/or to modify an existing equipment list. As explained, a FDS can provide for focusing scenarios to arrive at an optimal scenario.

Figure 23:
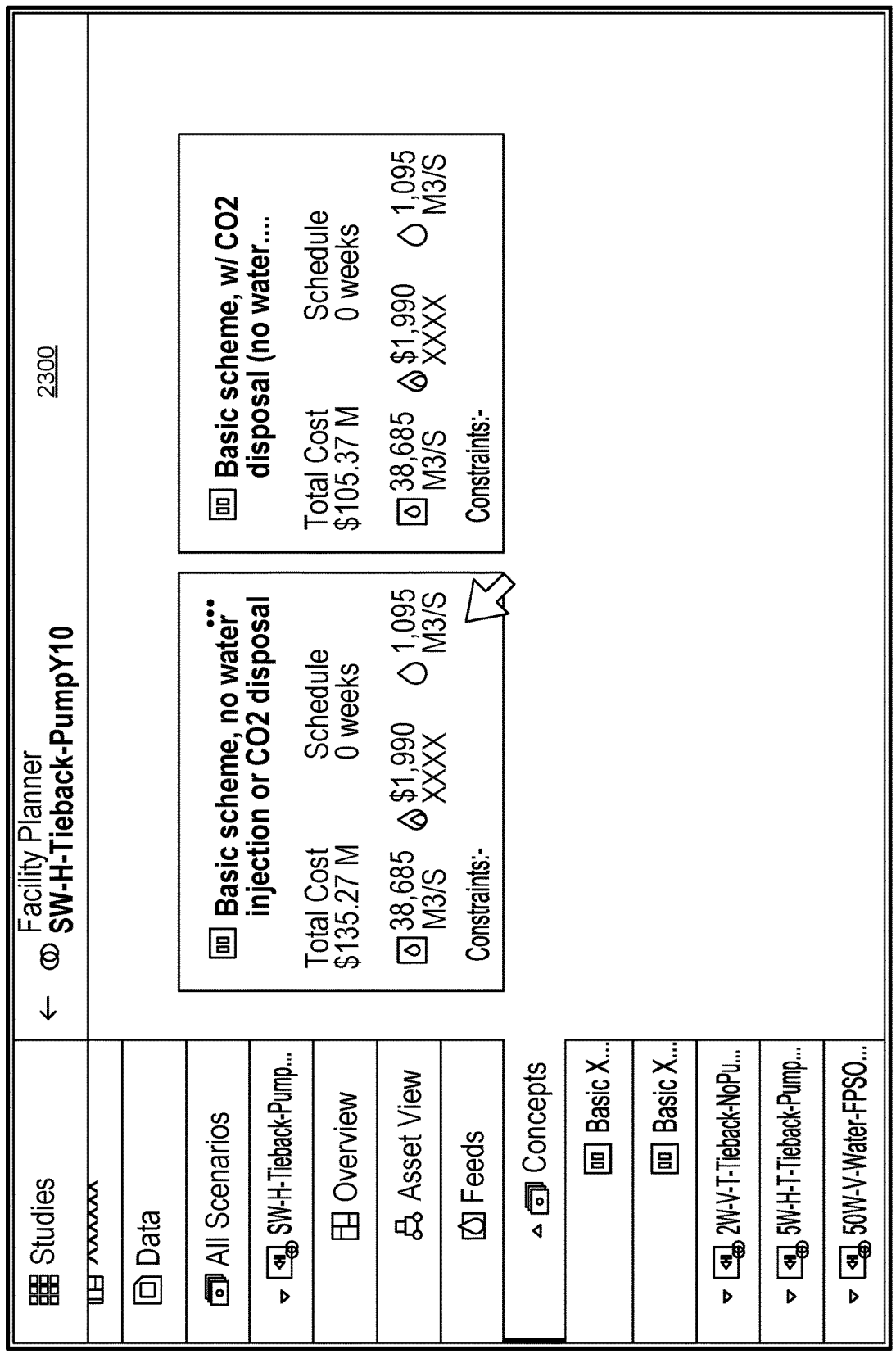
FIG. 23 illustrates an example of a graphical user interface.

FIG. 23 shows an example of a GUI 2300 where two scenarios are generated, one without water injection and without CO2 disposal and one with CO2 disposal. As shown, the total costs can differ where production of oil, water and gas remains the same for both scenarios, which may be determined, for example, via simulation of fluid flow using a reservoir simulator. For example, a reservoir simulator may be utilized to determine a production rate or production rates for fluid of a reservoir, which may be utilized as a constraint in an optimization problem.

Figure 24:
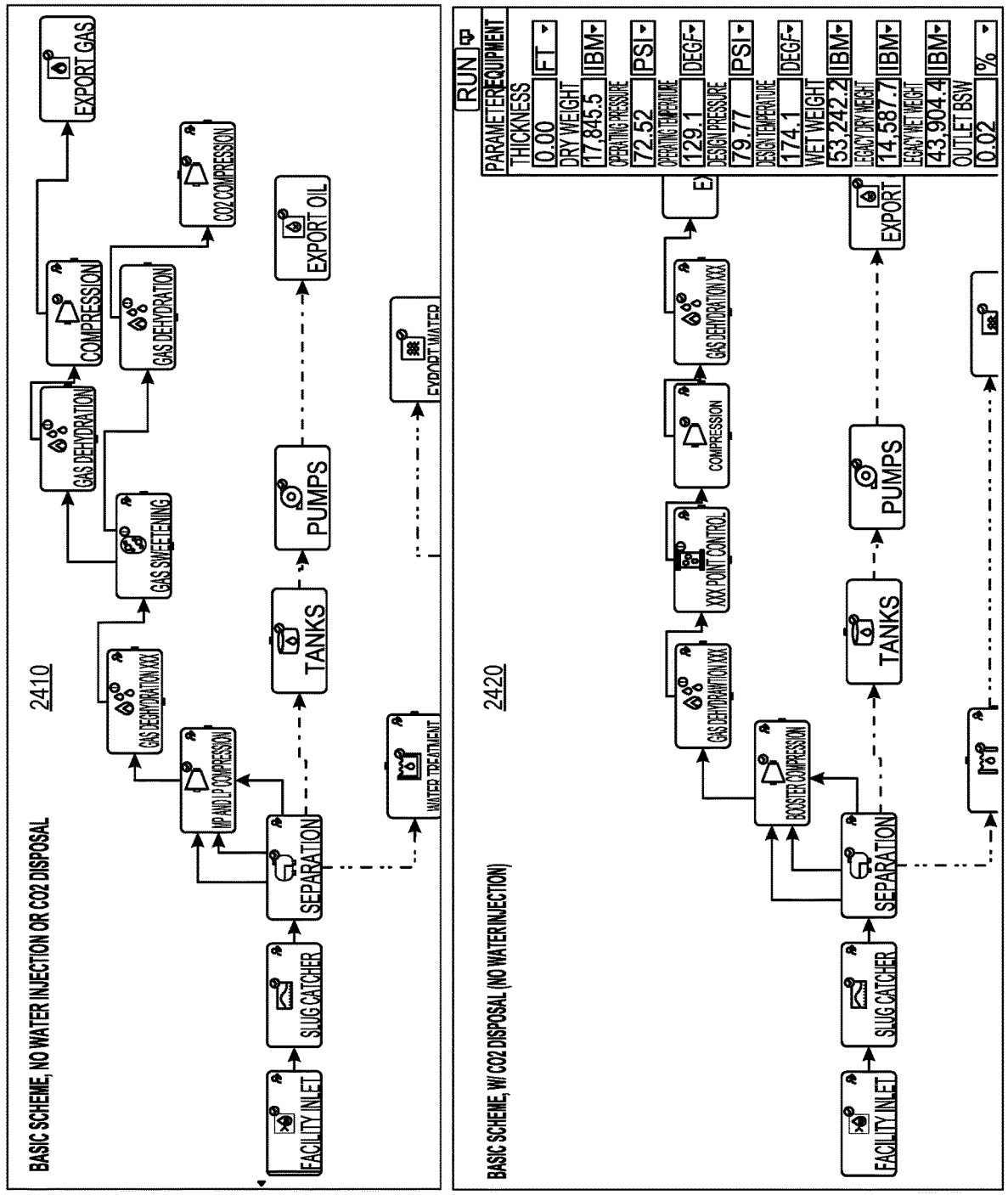
FIG. 24 illustrates examples of graphical user interfaces.

FIG. 24 shows example GUIs 2410 and 2420 that include various equipment for the scenarios of FIG. 23. As shown, various pieces of equipment can be linked to provide for fluid handling, fluid transport, fluid processing, etc. As shown, the equipment differs for the two scenarios, as may be determined via simulations that provide for generation of equipment lists. The GUI 2410 corresponds to a scenario where no water injection or CO2 disposal occur; whereas, the GUI 2420 corresponds to a scenario where CO2 disposal occurs without water injection.

As to a project, a FDS may handle small or large projects. As an example, a small project may be a single well pad with a separator and a vent. As to a larger project, it may include a number of wells (see, e.g., FIG. 2, etc.). As an example, a project may include oil and gas processing, which may include one or more refineries. In various examples, fluid produced will include hydrocarbons along with gas and/or water such that equipment will include one or more separators. As explained, equipment can include pipelines, separators, storage tanks, trucks, railcars, vents, flares, etc. As mentioned, equipment may include artificial lift equipment. As to gas lift, consider one or more compressors that may be included to compress gas separated from produced fluid for injection into a well to assist production. As to use of electric submersible pumps, a field site may include one or more generators that generate electricity to power such pumps, which may be gas turbine generators, wind generators, geothermal generators, solar power generators, etc.

In the examples of FIG. 23 and FIG. 24, the handling of CO2 may be taken into account. For example, a project may consider sequestration of CO2 and/or use of carbon credits of a regulatory and market system, which may include concepts of C2C.

Figure 25:
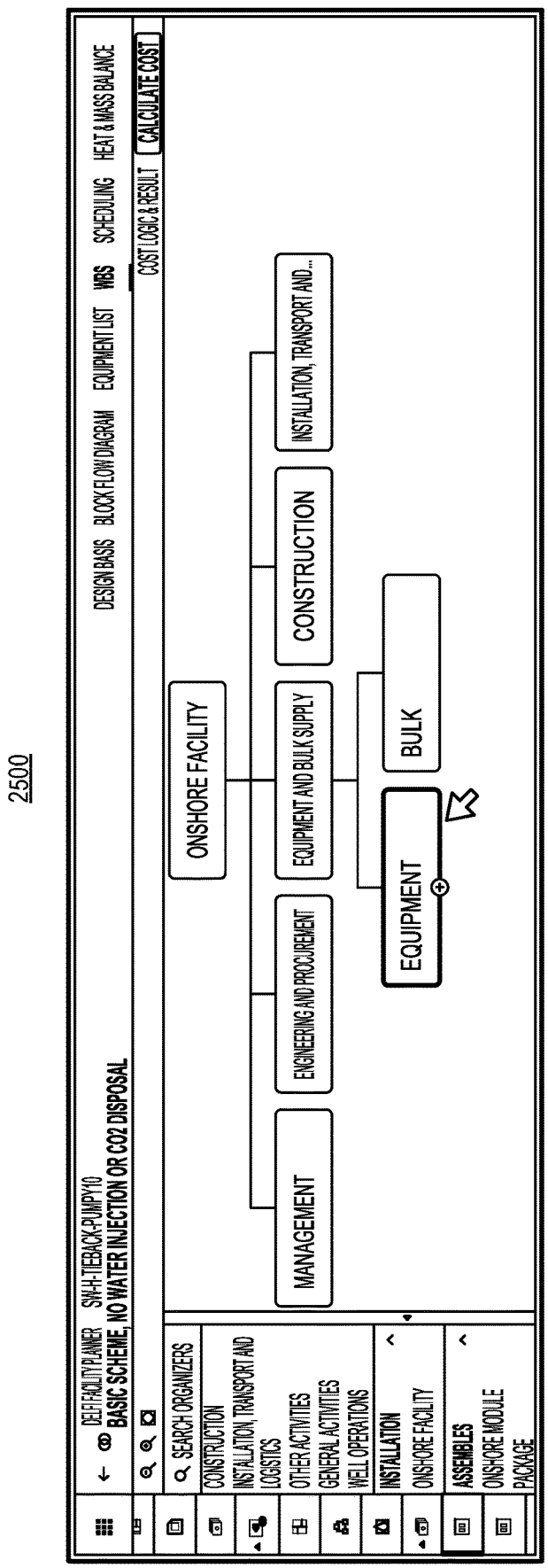
FIG. 25 illustrates an example of a graphical user interface.

FIG. 25 shows an example GUI 2500 as to a WBS for one of the scenarios of FIG. 23. As shown, various blocks can be arranged and selected. For example, an equipment block may be selected that relates to equipment, which, as mentioned, may be generated through performing one or more simulations for a field site.

Figure 26:
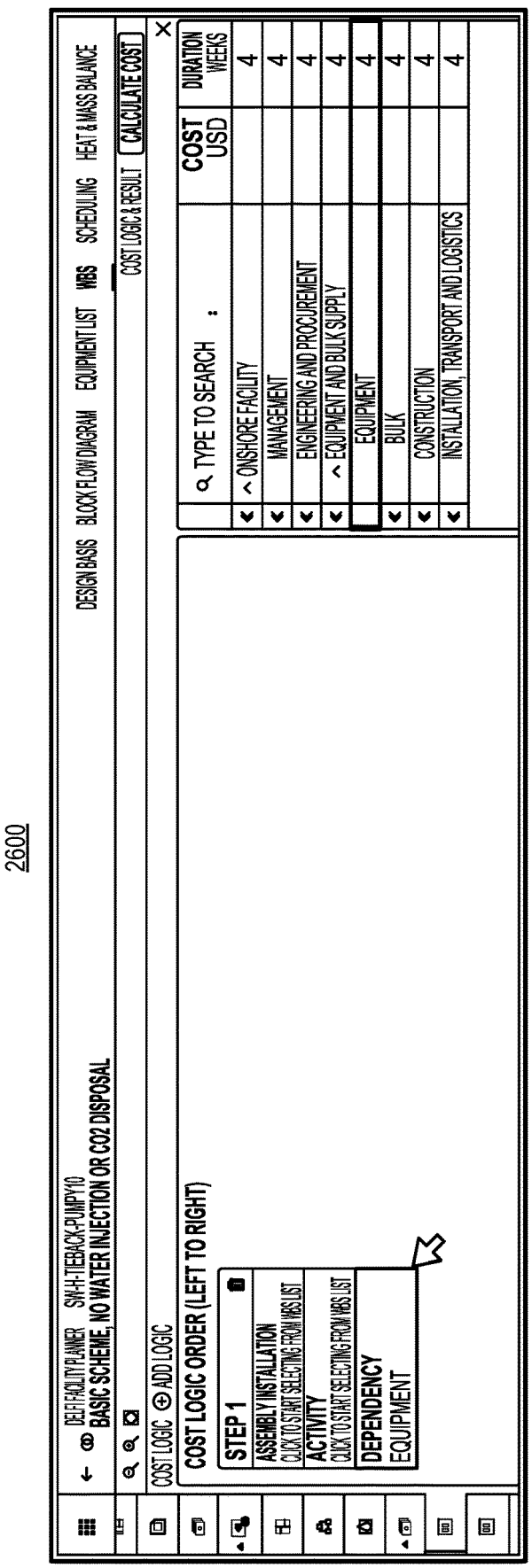
FIG. 26 illustrates an example of a graphical user interface.

FIG. 26 shows an example GUI 2600 as to one of the scenarios of FIG. 23, where cost logic for a WBS can be reviewed, entered, edited, selected, etc. As shown, in a first step, dependency can be selected for equipment where a corresponding graphic can be generated and rendered that shows cost and/or duration associated with the equipment.

FIG. 27 shows an example GUI 2700 for editing logic for construction associated with equipment of a project where the GUI 2700 can be part of an activities process associated with a WBS.

Figure 28:
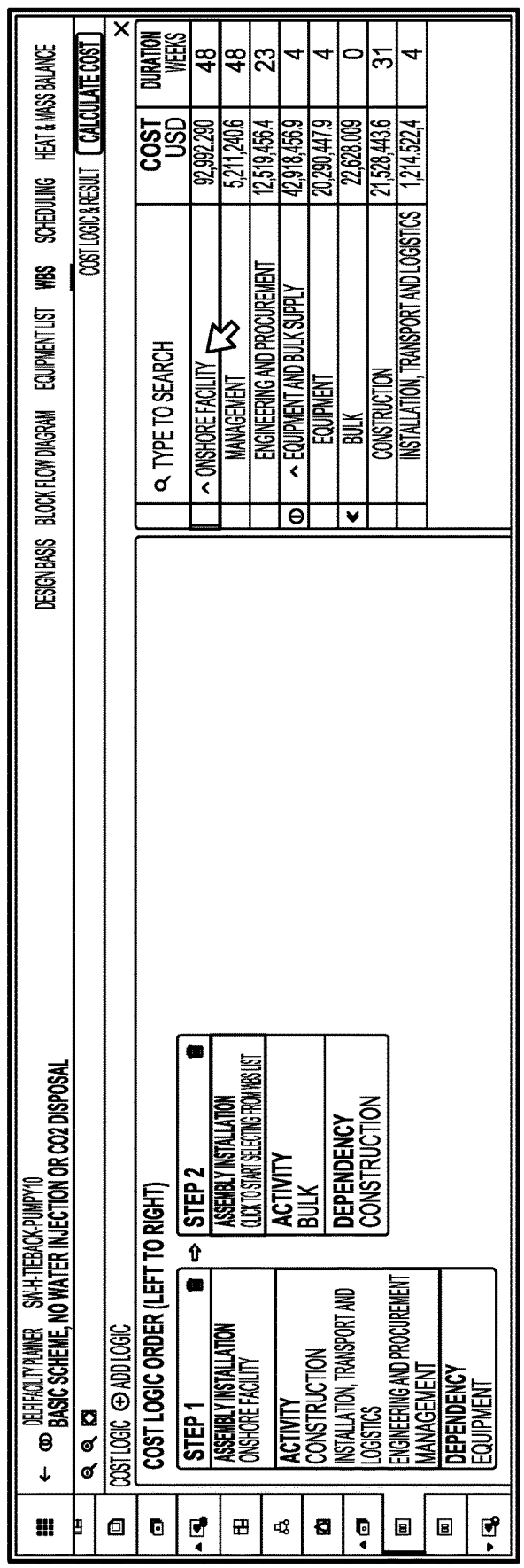
FIG. 28 illustrates an example of a graphical user interface.

FIG. 28 shows an example GUI 2800 for one of the scenarios of FIG. 23 where, as the workflow progresses to step 2, a FDS can render updated information to the GUI 2800 as indicated in a right side graphic. As shown, costs and durations can be updated responsive to inputs such that a user can be aware of various aspects of a triple constraint problem. Such an approach can provide immediate feedback to a user to more readily allow the user to comprehend how a triple constraint problem is evolving for a scenario or scenarios. As an example, a GUI may render graphics for multiple scenarios such that a user may switch between scenarios to more expeditiously arrive at an optimal scenario. As an example, a FDS can provide feedback to a user, which may include one or more recommendations, particularly where a performance indicator may be subject to be beneficially increased and/or detrimentally decreased.

Figure 29:
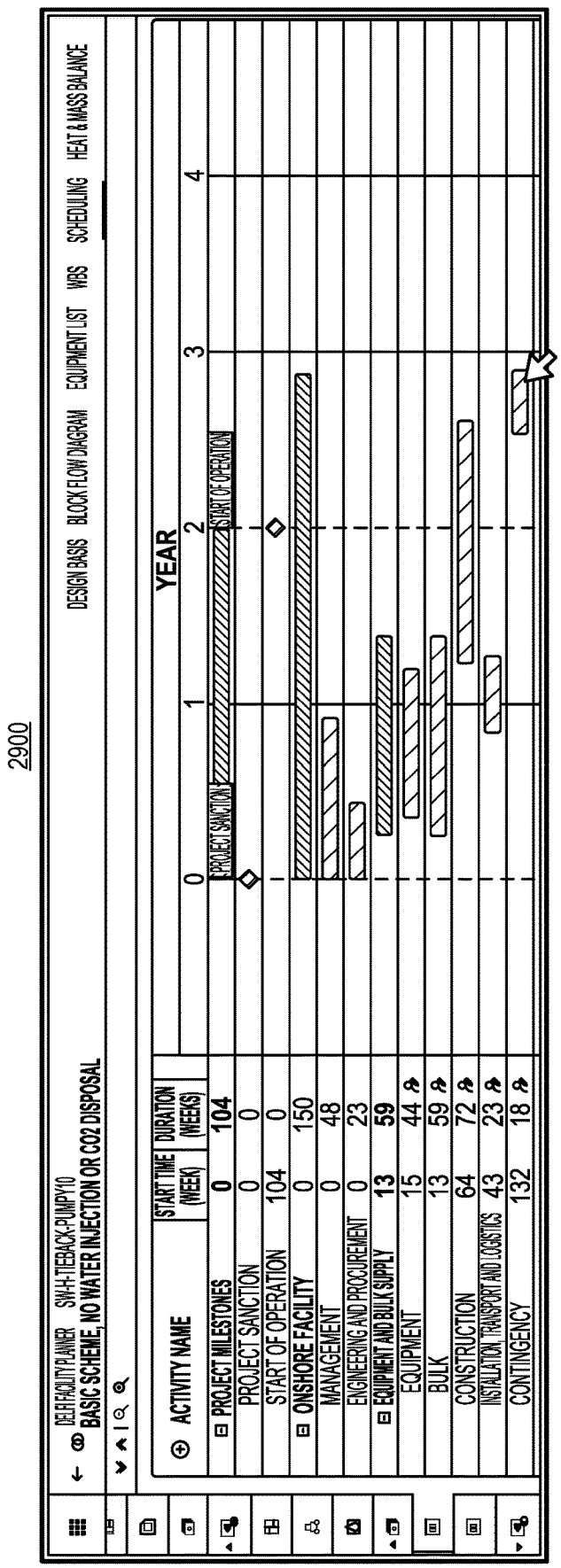
FIG. 29 illustrates an example of a graphical user interface.

FIG. 29 shows an example GUI 2900 for scheduling one of the scenarios of FIG. 23 where contingency may be taken into account and edited or revised. As shown in various GUIs, a FDS can provide for a workflow that includes components for design, block flow diagram generation, equipment list generation, WBS generation, scheduling and balance computations (e.g., heat balance, mass balance, etc.).

Figure 30:
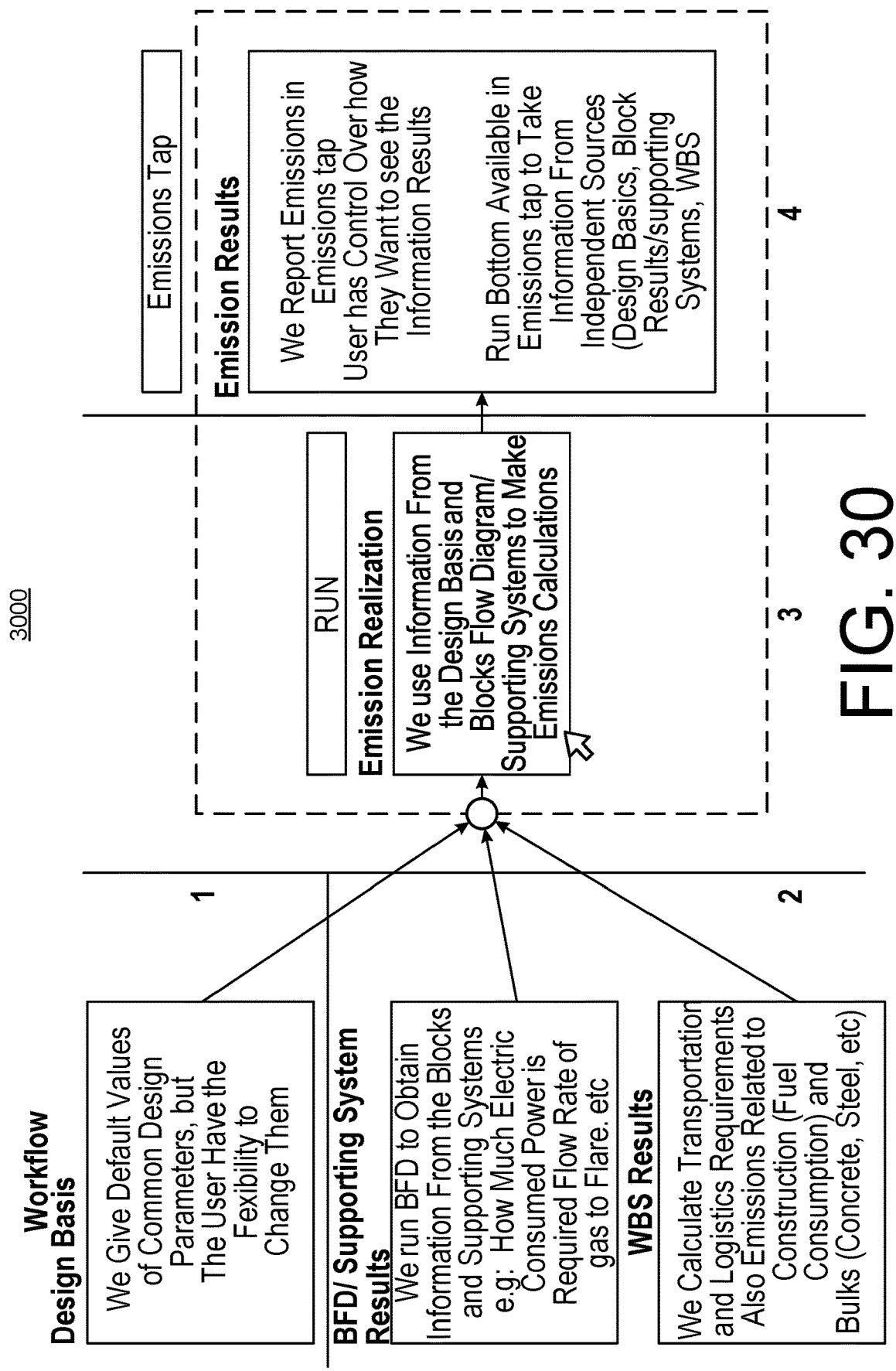
FIG. 30 illustrates an example of a graphical user interface.

FIG. 30 shows an example GUI 3000 for a workflow that accounts for emissions. As shown, emissions can be integrated into a design basis and a supporting system along with one or more WBSs. A FDS can provide for performing a run for emission realization to generate emission results.

A FDS can account for GHGs and provide a preliminary estimation of total equivalent carbon dioxide emissions, based on facility production profiles, technology selection and design choices. To provide direction on ways to reduce emissions in a process facility and what is the integrated impact on capital, schedule and operating cost, a FDS can provide insights of the major sources of emissions which may be classified as follows:

Scope 1: Emissions directly linked to the burning of hydrocarbons for the generation of electricity, emergency, and disposal of fuels or source of heating medium during the operations of the facility. They can be sub-classified into: combustion (e.g., generation of heat, power, electricity, etc.); flaring/incineration (e.g., combustion of undesirable gas, etc.); cold vents (e.g., process streams that release undesirable gas directly to atmosphere, etc.); and fugitive emissions (e.g., unintentional release of gas due to open vents, leaks, etc.).

Scope 2: Emissions that are indirect emissions from the generation of purchased energy consumed by a process facility. For example, consider electricity imported from the grid to an onshore/offshore process facility.

Scope 2 emissions can also include purchase of heating and cooling medium and steam.

Scope 3: Emissions from other indirect emissions not included in Scope 2. A few examples are emissions from fuel burning by employee vehicles traveling to and from work, business travel, disposal fees for waste or wastewater, emissions associated with capital goods associated with OPEX (purchase of chemicals, 3rd party services), drilling campaigns, and use of sold products; and/or emissions associated with building the process facilities which are associated with work break down structure (WBS), fabricating the required equipment or modules, and logistics associated to bring equipment or modules to site.

As explained, diverse teams may generally be utilized to perform emissions calculation using spreadsheet files, which can be time consuming with input data that demands manual input. A FDS can be integrated with a framework (e.g., FDPLAN) to perform a preliminary design of equipment sizing based on given production profiles and inlet streams composition and conditions to automatically generate a computation of total electric consumed power, fuel gas required, flare capacity, details composition and conditions of minor streams that could be directed to cold vents, flare, or incineration.

As an example, a FDS can provide a holistic and integrated approach where variables are used to come up with an overall calculation of Scope 1, 2, and 3 emissions which integrate production profiles, WBS and schedule over the life of the field with a simple run of a button without the interaction of multiple complicated spreadsheets.

A FDS can automatically combine and integrates multiple user design decisions, reservoir informed data, equipment technologies, bespoken preliminary equipment sizing, rigorous thermodynamic calculation of stream properties, schedule, and WBS to generate Scope 1, 2, and 3 emissions over the life of a field.

Computations can be based on a bottom-up approach which particularly differentiates from other estimating tools that use a bottom-down approach based on parametric inputs such as CO2 emissions/oil produced.

Referring again to FIG. 30, interrelationships are shown between multiple realizations of different results calculations and inputs to a FDS. A FDS can take input data from a basis of design page (e.g., GUI), take results from a block flow diagram (e.g., GUI) and supporting systems after performing calculation logic and take information of scheduled activities (e.g., time and emissions factors of activities) and perform calculation of emissions for one point in time (currently available) or multiple calculations for the overall life of the field of the process facility (future development).

Figure 31:
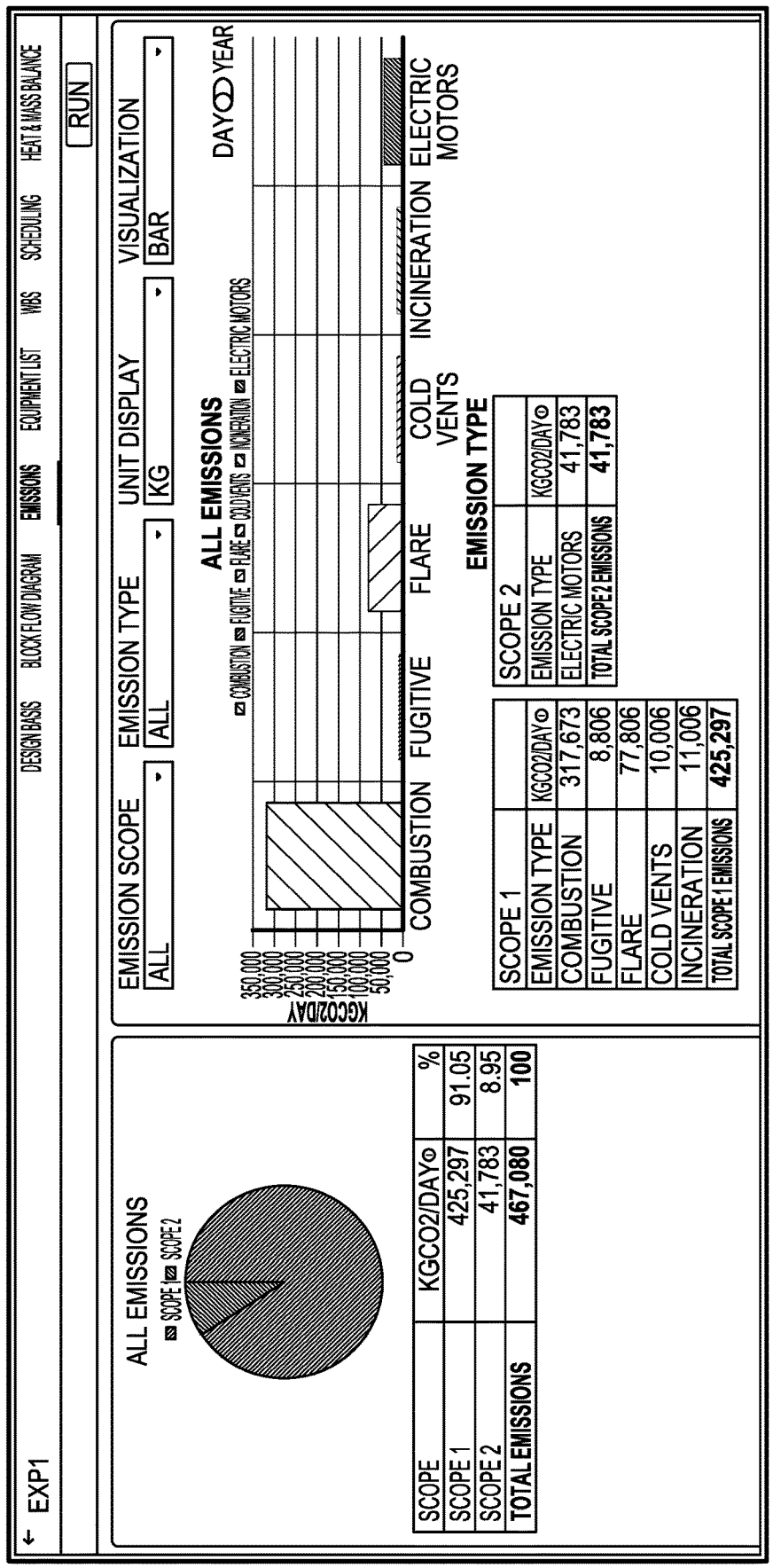
FIG. 31 illustrates an example of a graphical user interface.

FIG. 31 shows an example GUI 3100 that includes graphics that render results of emissions computations. As an example, the GUI 3100 can be extendible, for example, with various optional tools, graphics, etc. As an example, the GUI 3100 may be operable in combination with one or more data sources such as, for example, satellite data sources, which may provide for live or dated observations of emissions form one or more facilities. As an example, the GUI 3100 can provide for emission per streams or equipment that generate different types of emissions.

Figure 32:
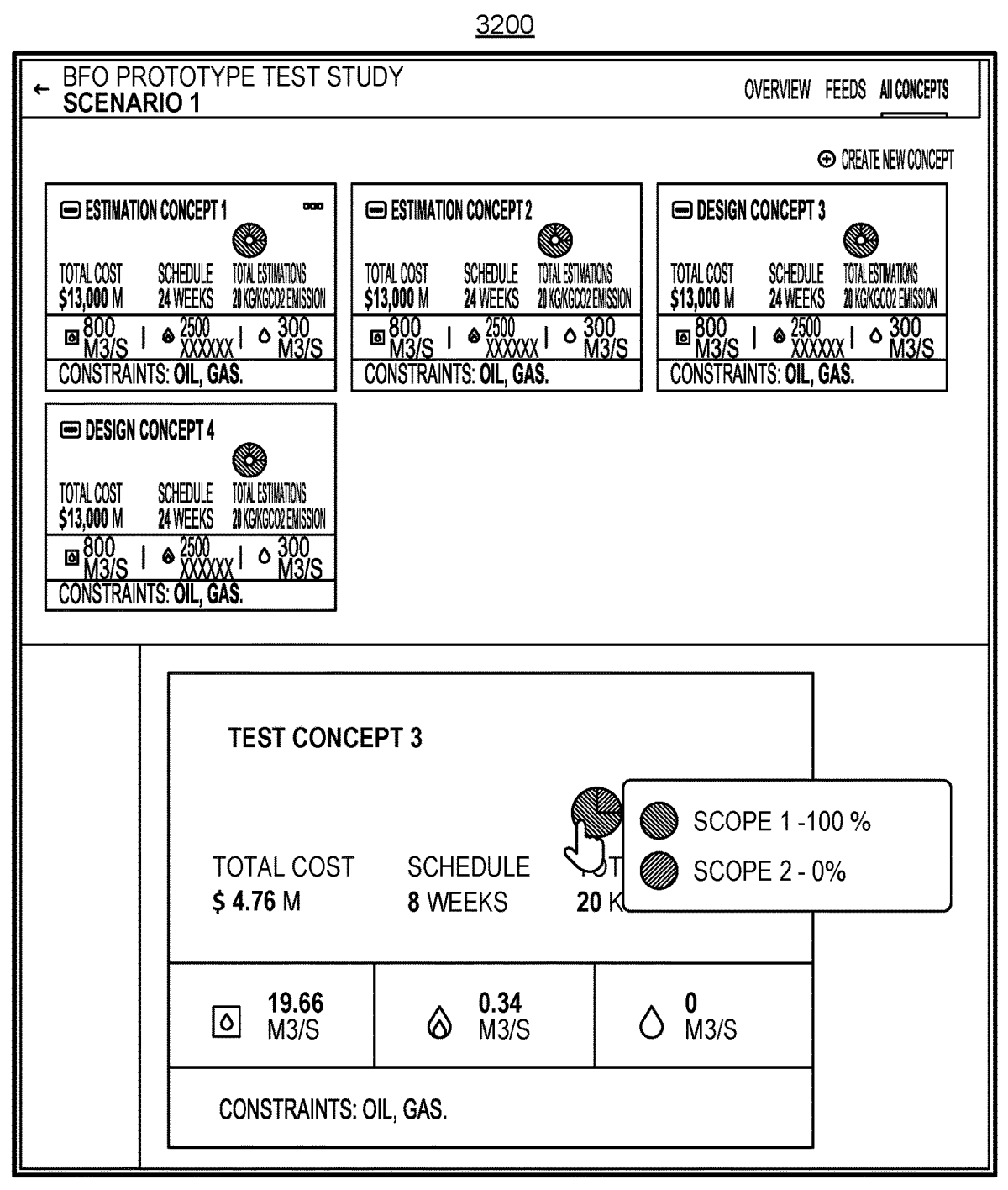

FIG. 32 shows an example GUI 3200 that can provide scenario information, which may include breakdowns as to various concepts and/or designs. For example, a FDS can provide for comparing different concepts by technology selection choices that could influence in the reduction of emissions to quickly make a comparison in a concept card with emissions, CAPEX results, and OPEX results. In the GUI 3200, graphics provide for type of emission and total emission of each concept.

Figure 33:
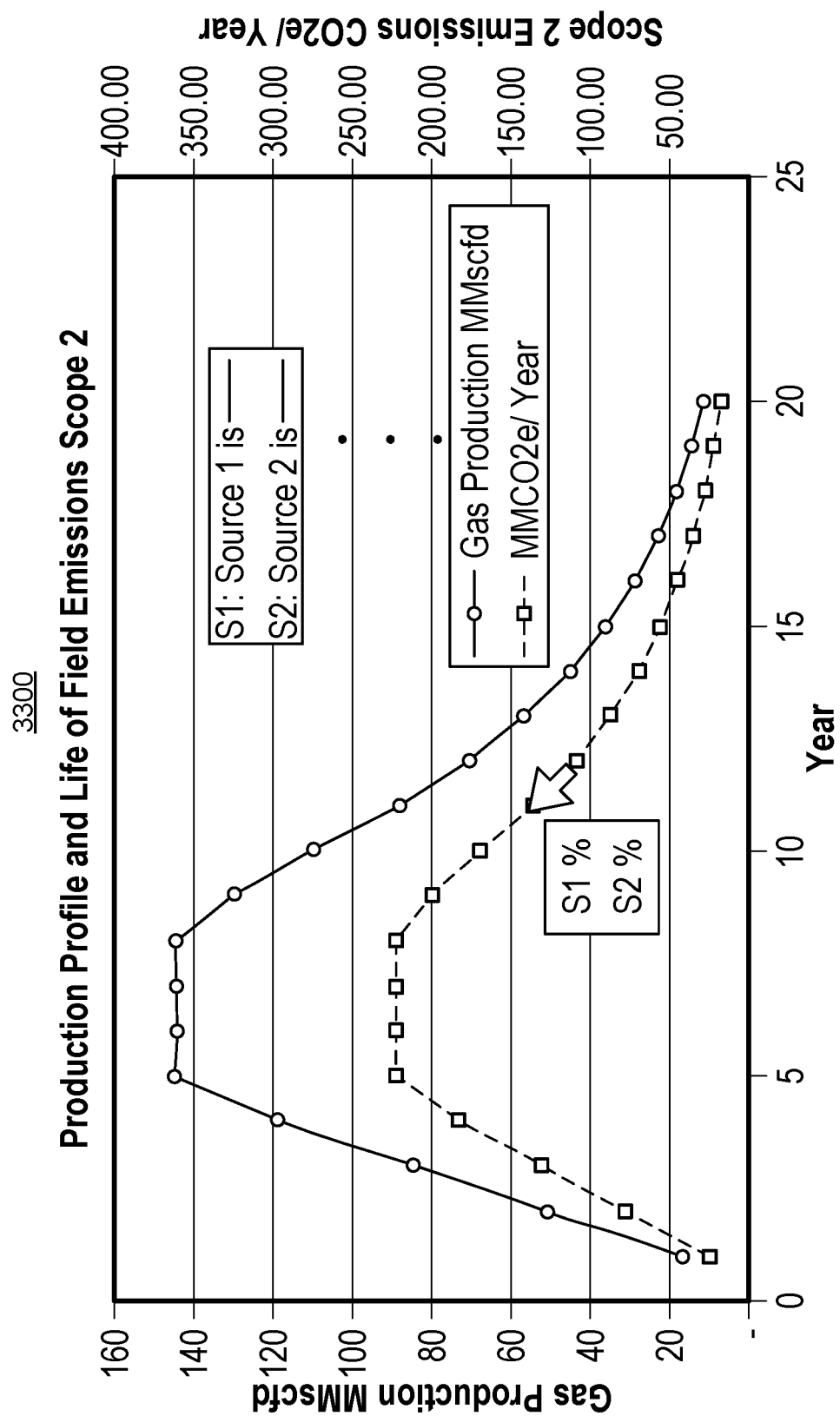
FIG. 33 illustrates an example of a graphical user interface.

FIG. 33 shows an example GUI 3300 of a plot of gas production versus year where CO2 emissions can be predicted for one or more scenarios. As an example, a FDS can call for simulation with respect to specific times (e.g., peak production). As an example, a FDS may call for performing a particular simulation multiple times over a life of a field to generate an emission profile. From the life of the field, parametric indicators can be available for a user to compare with external data (e.g., 1.5 MMCO2/MMscfd produced). Hence, as explained, a FDS can provide for life-cycle analysis and optionally C2C analysis. Emission calculations over the life of a field may be automatically generated, for example, using a process block flow diagram GUI, etc. As an example, emissions may be computed for a span of time that extends beyond a production life of a field.

As explained, a FDS can provide for an automated life of the field emissions calculations, which may cover construction of the facilities, operations, maintenance to decommissioning, or cease of production.

As an example, a method can include various actions, which may include: input basis of design data; build flow diagram and supporting systems; automatically calculate required consumption of power demand, fuel requirement, heating medium requirements and streams thermodynamic properties; calculate Scope 1 and Scope 2 emissions based on power supply source; calculate fugitive emissions; calculate incineration emissions; calculate cold vented emissions; calculate flare emissions; calculate electrostatic power units; emissions results FDS and integration with a framework (e.g., FDPLAN framework, etc.); calculate fabrication equipment, bulks or modules emissions; calculate transport and logistics related with construction and operations; calculate transport and logistics related with product handling; and calculate emission due to drilling events.

FIG. 34 shows a series of example GUIs 3400 as to input basis of design data. In the basis of design GUIs 3400, a user can set up the basis for the emissions calculations by providing information on the power supply source, for example, imported from the grid, generated on site or both. If "both" is selected, a FDS can automatically calculate electricity emissions intensity factor, noting flexibility for the user to override or adjust the calculation. As an example, a FDS can provide for availability and Global Warming Potential (GWP) factors, which may be user inputs with defaults provided by a FDS. As an example, electricity emissions intensity factor and GWP may be set to defaults. As an example, fugitive emissions may be estimated as a percentage of the inlet feed gas where a value is taken from production profiles automatically.

Figure 35:
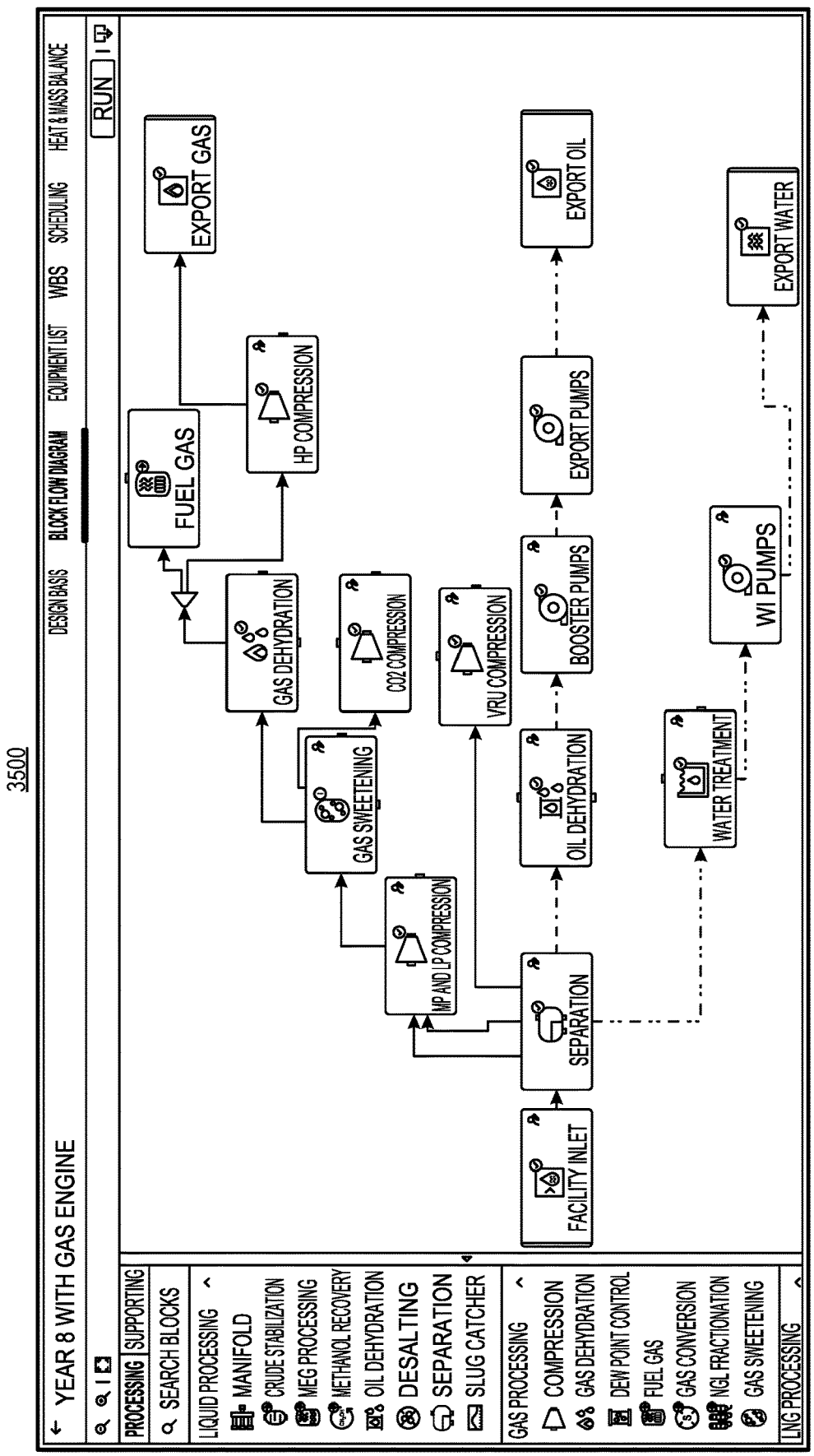
FIG. 35 illustrates an example of a graphical user interface.

FIG. 35 shows an example GUI 3500 for building a flow diagram and supporting systems using an FDS. As shown, the GUI 3500 can provide for constructing a network diagram of functional units that are linked for purposes of one or more types of assessments. As explained, such a network diagram may be utilized as a basis for performing one or more types of simulations, which may include, for example, simulations as to transport of fluid, disposal of fluid, processing of fluid, etc. In the example of FIG. 35, outputs may include export gas, export oil and export water. As explained, a heat and/or mass balance may be performed for one or more activities associated with equipment of a network diagram. As shown, the GUI 3500 includes a heat and mass balance graphic that may be actuated as part of a workflow to determine one or more heat and/or mass balances. As to types of equipment, the GUI 3500 shows some examples, such as, compressors, pumps, etc.; noting that a compressor may be a type of pump. As explained, power to operate one or more pieces of equipment may come from one or more sources, which may include one or more local and/or one or more remote sources. The GUI 3500 also shows various examples of liquid processing and various examples of gas processing; noting that examples of other processing may be included (see, e.g., LNG processing, etc.).

Figure 36:
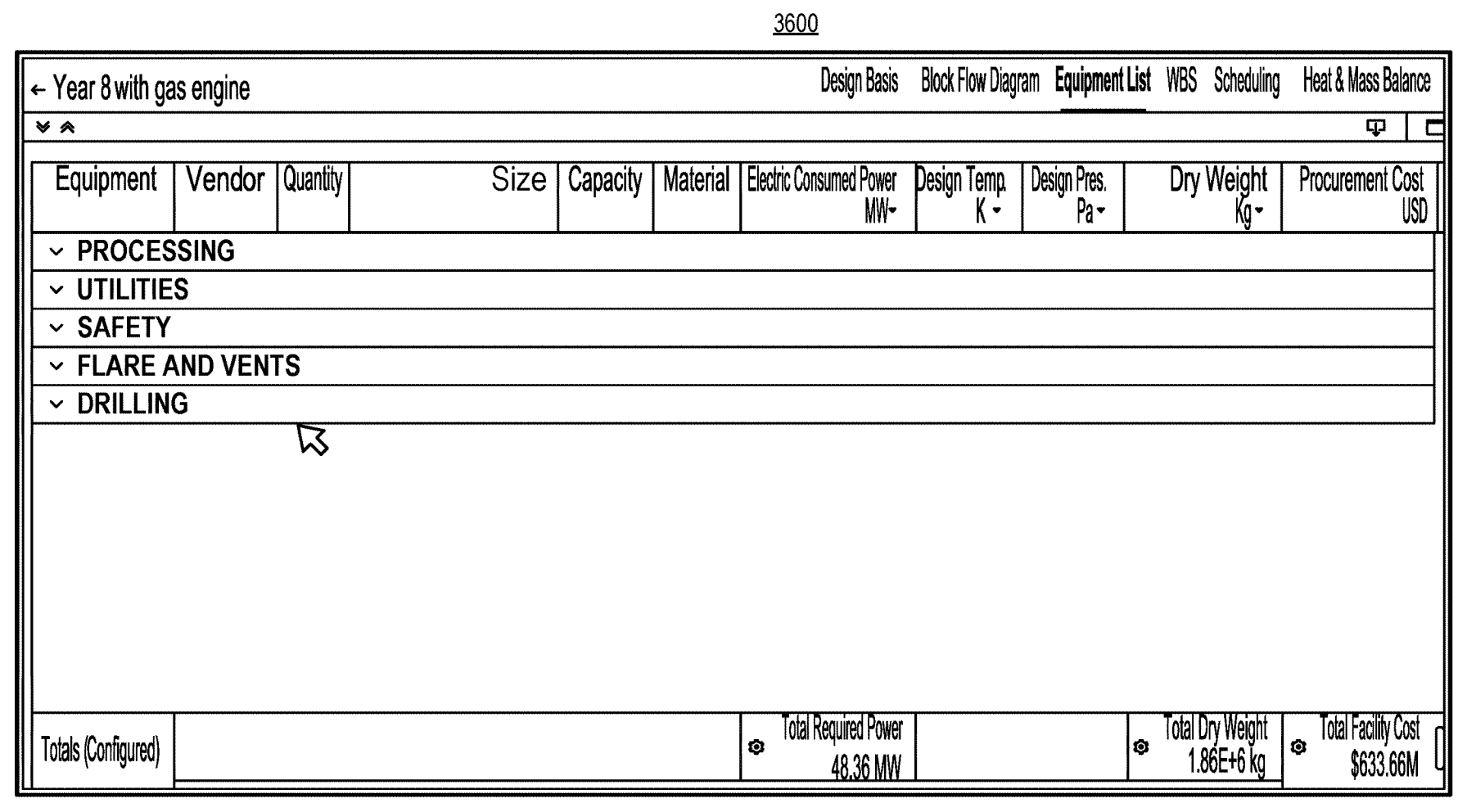

FIG. 36 shows an example GUI 3600 for generation of an equipment list for various processing, utilities, safety, flare, and vent and drilling where each category can include a drop down for specifics. As explained, such equipment can be part of a facility design, whether to be built, being built, or already built. As an approach may provide for new design and/or re-design, which may aim to reduce emissions or otherwise shift emissions from one type to another, optionally including one or more disposal, sequestration, etc., technologies. As mentioned, a FDS can provide for time-based simulations such that accumulations, total savings, etc., can be taken into account. As an example, a particular site may be more adept at handling emissions than another site due to one or more factors, which may be geographic, geologic, weather-based, etc. As an example, a FDS can account for such factors to provide for optimal design, operations, etc.

As to automatically calculating required consumption of power demand, fuel requirement, heating medium requirements and streams thermodynamic properties, a FDS can automatically calculate total power demand of a facility based on electric motors connected in the facility and supporting systems. As an example, a user can select different alternative drivers such as gas turbines, gas engines, and diesel engines which results can also be shared automatically to emissions entity for further calculation.

Gas turbine, gas engines, and diesel engines capacities and models can be integrated into a FDS and/or be otherwise accessible. As an example, a FDS may automatically select required equipment to meet total power demand of a facility where derating factors may be applied to accommodate efficiency of these machines due to ambient temperature and latitude (e.g., location specifics, weather data, etc.). As an example, a FDS can provide for classifying power generation into classes such as utilities, safety, and drilling.

As an example, a FDS can performer an automatic calculation of heat and mass balance of individual streams (e.g., including minor streams) using VMG thermodynamic simulation service, by replicating the behavior of equipment, valve, compressor or pump and performing a series of pressure-enthalpy (PH) isenthalpic flash, pressure-temperature (PT) isothermal flash or pressure-entropy (PS) isentropic flash depending on the type of logic embedded in each process block. Such calculations can generate required data to process stream information for emissions calculation, such as: flowrate, pressure, temperature, caloric value, composition, density, molecular weight, etc.

As an example, through using total power demand and streams properties generated by a FDS, the FDS can calculate emissions due to combustion.

As an example, a FDS can, based on heaters automatically allocated in different process block, compute a total heating medium duty where it may be translated into energy consumption required for burners. As an example, a fuel burned to generate the required duty can be automatically selected and used to calculate the emissions due to combustion. As an example, various stream properties may be automatically generated by a FDS.

As to computing Scope 1 and Scope 2 emissions based on power supply source, depending on user decision of power supply source in basis of design, total power demand can be divided accordingly. For example, if a user states that 80% of power is imported from the grid and 20% generated onsite, then the logic can split automatically the total power demand calculated. In such an example, 20% of the total power demand will be calculated following the combustion emission calculation as explained above and it will be reported as Scope 1 combustion emissions. On the other hand, the 80% of the total power demand will be multiplied by the Electricity Intensity Emission Factor (e.g., as calculated in design basis) and it will be reported as Scope 1 electric motors emissions.

As to calculation of fugitive emissions, a FDS can takes the percentage plant inlet that a user input in a basis of design and, using thermodynamic streams properties of the inlet stream to the facility inlet, estimate MW and density. In such an approach, mass flowrate of $CO_2$ and methane can be estimated. As an example, mass flowrate of methane can be multiplied by global warming potential (e.g., from basis of design) and then the $CO_2$ equivalent per day or per annum can be reported as fugitive emissions in the emissions tap.

As to calculation of incineration emissions, a FDS can consider incineration emissions as process streams that are required to be safely disposed of, by burning them. As an example, a FDS can make a decision if a stream would to be: cold vented, incinerated, re-injected in a disposal well and/or recovered using a vapor recovery unit (e.g., and put it back to process). Such decisions may depend on user choices when building a flow diagram. If it is decided to incinerate a stream, the content can be sent to a gas conversion unit. As an example, a FDS can calculate stream thermodynamic properties and then performs calculation logic (e.g., for flare incinerator, etc.). Results of the calculation may be indicated as Scope 1, incineration.

In an example where a user selects re-injected in a disposal well or recovered using a vapor recovery unit, then emissions for incineration may be ignored (e.g., not taken into an account). As an example, a concept card can give a comparison as to trade-off between additional CAPEX for including re-injection compression scheme or vapor recovery units versus the emission obtained if not adding additional equipment.

As to calculating cold vented emissions, a FDS can generate graphics that allow a user to select streams that will be cold vented at a process block level. Sometimes these streams are called "minor stream", which may not be available to a user in the block flow diagram; however, a user can input decisions on what do with the stream in the parameter tap of a process block. A FDS can provide for calculating stream thermodynamic properties and then converting the mass flow rate of methane into $CO_2$ equivalent, for example, using the GWP from basis of design. A FDS can sum up $CO_2$ mass flowrate with $CO_2$ equivalent and reports total $CO_2$ equivalent mass per day or per annum. As an example, a FDS can perform various computations read cold vents streams in a BFD and supporting systems. As an example, results may be reported as Scope 1, cold vents in an emissions GUI.

As to calculating flare emissions, flare emission are a type of combustion emissions. As an example, a FDS can provide for sizing and estimation of flare load automatically, for example, using logic based on a designing case of depressurization load. After the mass flowrate of flare load is estimated and stream properties are generated, then calculations for one or more flare incinerators can be performed. The results may be displayed in an emission GUI, for example, as Scope 1, flare emissions.

As to emissions results and integration with a framework such as the FDPLAN framework, a FDS can provide a dedicated emission tap that can be rendered to show results of one or more simulations (see, e.g., FIG. 31 and FIG. 32). In such an example, a user can use information to make comparisons between concepts and determine the best trade-off between CAPEX additional investment and emission generation. In addition, results of emissions can be displayed in days or per year and under an integrated case with a framework such as the FDPLAN framework where such results can be passed over to calculate emission tax and overall economic analysis of different scenarios and concepts.

As an example, multiple time steps of emissions calculations can be done over the life of a field which can generate an emission profile. As shown in the GUI 3300 of FIG. 33, knowledge of estimated emissions with respect to time can provide for improved selection of equipment, operation of equipment, design, re-design, etc. A FDS may show results of emission calculations over the life of field automatically generated from a process block flow diagram.

As explained, a FDS can incorporate WBSs and connect to scheduling, where, for example, emission calculations can be expanded to estimate Scope 3 emissions over the life of a field.

As an example, a FDS can calculate fabrication equipment, bulks, or modules emissions. For example, using various sources of publicly available data, indicators of CO2 equivalent emission per ton of equipment or bulks may be accessed. In such an example, a FDS can estimate equipment and bulks weights, and then by multiplying those factors by weight and using the already built-in scheduling functionally, obtain CO2 equivalent emission per time required to build the related equipment or bulks. A similar association can be performed for modules or packages. As to multiplying by weight, as appropriate, one or more other quantities may be utilized, additionally or alternatively (e.g., distance for cables or volume for cement).

As an example, a FDS can calculate transport and logistics related with construction and operations. For example, consider cranes, trucks, diggers, personnel transportation, etc. As an example, a FDS can use a WBS and scheduling functionality where the time required for building a facility (or a portion thereof) and the type of machinery associated with a specific construction activity can be automatically calculated. In such an example, type of fuel associated with each type of vehicle or transport may be utilized. As an example, a FDS may access publicly data available for estimates of emissions factors based on fuel type (kgCO2/liter of fuel consumed). Using such information in an integrated way, a FDS can estimate the Scope 3, transportation, and logistic emissions for construction or operations. As an example, such an approach can be extended to OPEX calculations for activities associated with day-to-day transportation to support operations and maintenance.

As to equipment or module transportation to site logistics, consider type of transportation as being a truck (small equipment), barge or ship (larger modules or several types of equipment) or air transportation. As an example, a FDS may access public data for emissions factors based on type of fuel and, using a WBS and activities associated with logistics, emission factors can be multiplied by time of transportation required and distance from fabrication yard to site, which may be estimated using one or more GIS applications. Such information can be utilized in an integrated way such that a FDS is able to estimate Scope 3, transportation, and logistic emissions for construction or operations.

As to calculation of transport and logistics related with product handling, a FDS can account for how products are handled at a facility, which can be incorporated into emissions calculations. For example, if oil production is dispatched via trucks, by knowing the type of fuel(s), how many miles per day is required and emission factors for this type of vehicle or transport, a FDS can provide emissions estimations for transportation and logistics as to product handling. As an example, frequency can be automatically calculated by a FDS by calculating the storage time and offload capacity. Such an approach can be applied to floating storage units, LNG cargos, LNG trucks, hydrogen trucks, hydrogen cargos, waste disposal trucks, etc. As an example, a FDS can estimate such types of emissions under Scope 3, transportation, and logistic emissions for product handling.

As to calculation of emission due to drilling events, consider a FDS that can consume data from one or more drilling related frameworks (e.g., the DRILLPLAN framework, the DRILLOPS framework, etc.). By knowing the time required of drilling activity and how many drilling rigs are required, an automated calculation can be performed. As an example, a WBS can also be used for assigned drilling tasks as an activity with cost and schedule associated. Assuming the type of fuels that a drilling rig will use, a FDS can then estimate emissions. As an example, a drilling rig may be powered by diesel engines, gas turbine or gas engines. By selecting drilling power generation in one or more supporting systems of a planning framework, a user can enter the maximum power capacity required such that emissions can be estimated and reported as Scope 3, drilling rig combustion emissions.

As an example, if power is required from the grid, then total power demand may be multiplied by the Electricity Intensity Emission Factor (e.g., as may be calculated in design basis GUI) such that it can be reported as Scope 3, drilling rig electric motor emissions.

As explained with respect to the GUI 600 of FIG. 6, various scenarios can be compared using graphics, values, etc. such that an optimal scenario can be generated and selected as explained with respect to the method 2200 of FIG. 22.

As an example, a FDS may provide for redirecting a user, optionally automatically, to one or more GUIs where a user may interact with the FDS using one or more graphical controls. As an example, equipment may be updated, revised, etc. For example, consider sourcing of equipment from a different source, which may result in different performance, different cost, different installation, different delivery, etc. As an example, equipment may be sourced according to one or more regulations, one or more types of risks, one or more physical factors, etc.

As explained, a FDS can provide for integration of scope, time and cost in an expeditious manner. As an example, a FDS may implement one or more types of scenario analysis techniques. For example, given three constraints and various performance indicators, a FDS may provide for making trade-offs between performance indicators while maintaining compliance with the three constraints (e.g., triple constraint). As an example, a Pareto technique may be utilized. As an example, Pareto efficiency or Pareto optimality may be implemented in a situation where no individual or preference criterion can be made better off without making at least one individual or preference criterion worse off. As an example, given a set of choices and a way of valuing them, a Pareto front (or Pareto set or Pareto frontier) may be implemented as to the set of choices that are Pareto-efficient. Such an approach can help focus attention to the set of choices that are Pareto-efficient where a user may make trade-offs within this set, rather than considering the full range of each parameter.

As explained, a FDS can integrate various tools for ease of balancing constraints of a triple constraint problem. As an example, a FDS can be integrated with or otherwise operatively coupled to one or more simulators, solvers, etc. As an example, a FDS may be utilized for ongoing operations. For example, if a change occurs in behavior at a field site, a FDS can automatically receive field data and generate an optimal scenario for moving forward at the field site. For example, consider replacement of equipment, reconfiguring a fluid handling network, etc. In such an example, a FDS may be integrated with a planner (e.g., PDDL planner, etc.) where the planner can include an execution component that can monitor actual operation that may deviate from a plan. In such an example, re-planning may be required from time to time, which may trigger a reassessment using a FDS to determine whether a more optimal solution (e.g., scenario) may exist. For example, consider utilizing different equipment, different energy sources, changing from flaring of gas to storage of gas, implementation of renewable energy, etc.

As an example, a FDS can be implemented at least in part using a cloud platform (e.g., AZURE, Microsoft Corporation, Redmond, Washington). As explained, a FDS can leverage one or more computational frameworks, which may be accessible or hosted using a framework environment (e.g., DELFI environment). As an example, a FDS may utilize an application programming interface (API) structure such as an open API structure to facilitate interactions.

FIG. 37 shows an example of a method 3700 and an example of a system 3790. In the example of FIG. 37, the method can include a generation block 3710 for generating equipment specifications for a facility project at a field site by simulating physical phenomena using one or more computational simulators; a generation block 3720 for, using the equipment specifications and a computational facility planner system, generating a work breakdown structure for the facility project, where the work breakdown structure represents activities to be performed to deliver a defined scope of the facility project within a defined time; a render block 3730 for rendering a graphical user interface to a display that includes graphical controls for dependencies of the activities and equipment characterized by the equipment specifications; an update block 3740 for, responsive to input received via one or more of the graphical controls, automatically updating at least durations of the activities. As an example, the method 3700 may include a generation block for, based at least in part on the updating, generating an optimal scenario for the facility project. As an example, the update block 3740 may include updating one or more of cost, duration and emissions of activities. As an example, various computations can be reversible, for example, a cost to duration computation can be reversible and may be run as duration to cost.

In the example of FIG. 37, the system 3790 includes one or more information storage devices 3791, one or more computers 3792, one or more networks 3795 and instructions 3796. As to the one or more computers 3792, each computer may include one or more processors (e.g., or processing cores) 3793 and a memory 3794 for storing the instructions 3796, for example, executable by at least one of the one or more processors. As an example, a computer may include one or more network interfaces (e.g., wired or wireless), one or more graphics cards, a display interface (e.g., wired or wireless), etc.

The method 3700 is shown along with various computer-readable media blocks 3711, 3721, 3731 and 3741 (e.g., CRM blocks). Such blocks may be utilized to perform one or more actions of the method 3700. For example, consider the system 3790 of FIG. 37 and the instructions 3796, which may include instructions of one or more of the CRM blocks 3711, 3721, 3731 and 3741.

As an example, one or more machine learning techniques may be utilized to enhance process operations, a process operations environment, a communications framework, etc. As explained, various types of information can be generated via operations where such information may be utilized for training one or more types of machine learning models to generate one or more trained machine learning models, which may be deployed within one or more frameworks, environments, etc.

As to types of machine learning models, consider one or more of a support vector machine (SVM) model, a k-nearest neighbors (KNN) model, an ensemble classifier model, a neural network (NN) model, etc. As an example, a machine learning model can be a deep learning model (e.g., deep Boltzmann machine, deep belief network, convolutional neural network, stacked auto-encoder, etc.), an ensemble model (e.g., random forest, gradient boosting machine, bootstrapped aggregation, AdaBoost, stacked generalization, gradient boosted regression tree, etc.), a neural network model (e.g., radial basis function network, perceptron, back-propagation, Hopfield network, etc.), a regularization model (e.g., ridge regression, least absolute shrinkage and selection operator, elastic net, least angle regression), a rule system model (e.g., cubist, one rule, zero rule, repeated incremental pruning to produce error reduction), a regression model (e.g., linear regression, ordinary least squares regression, stepwise regression, multivariate adaptive regression splines, locally estimated scatterplot smoothing, logistic regression, etc.), a Bayesian model (e.g., naïve Bayes, average on-dependence estimators, Bayesian belief network, Gaussian naïve Bayes, multinomial naïve Bayes, Bayesian network), a decision tree model (e.g., classification and regression tree, iterative dichotomiser 3, C4.5, C5.0, chi-squared automatic interaction detection, decision stump, conditional decision tree, M5), a dimensionality reduction model (e.g., principal component analysis, partial least squares regression, Sammon mapping, multidimensional scaling, projection pursuit, principal component regression, partial least squares discriminant analysis, mixture discriminant analysis, quadratic discriminant analysis, regularized discriminant analysis, flexible discriminant analysis, linear discriminant analysis, etc.), an instance model (e.g., k-nearest neighbor, learning vector quantization, self-organizing map, locally weighted learning, etc.), a clustering model (e.g., k-means, k-medians, expectation maximization, hierarchical clustering, etc.), etc.

As an example, a machine model may be built using a computational framework with a library, a toolbox, etc., such as, for example, those of the MATLAB framework (MathWorks, Inc., Natick, Massachusetts). The MATLAB framework includes a toolbox that provides supervised and unsupervised machine learning algorithms, including support vector machines (SVMs), boosted and bagged decision trees, k-nearest neighbor (KNN), k-means, k-medoids, hierarchical clustering, Gaussian mixture models, and hidden Markov models. Another MATLAB framework toolbox is the Deep Learning Toolbox (DLT), which provides a framework for designing and implementing deep neural networks with algorithms, pretrained models, and apps. The DLT provides convolutional neural networks (ConvNets, CNNs) and long short-term memory (LSTM) networks to perform classification and regression on image, time-series, and text data. The DLT includes features to build network architectures such as generative adversarial networks (GANs) and Siamese networks using custom training loops, shared weights, and automatic differentiation. The DLT provides for model exchange various other frameworks.

As an example, the TENSORFLOW framework (Google LLC, Mountain View, CA) may be implemented, which is an open source software library for dataflow programming that includes a symbolic math library, which can be implemented for machine learning applications that can include neural networks. As an example, the CAFFE framework may be implemented, which is a DL framework developed by Berkeley AI Research (BAIR) (University of California, Berkeley, California). As another example, consider the SCIKIT platform (e.g., scikit-learn), which utilizes the PYTHON programming language. As an example, a framework such as the APOLLO AI framework may be utilized (APOLLO.AI GmbH, Germany). As an example, a framework such as the PYTORCH framework may be utilized (Facebook AI Research Lab (FAIR), Facebook, Inc., Menlo Park, California).

As an example, a training method can include various actions that can operate on a dataset to train a ML model. As an example, a dataset can be split into training data and test data where test data can provide for evaluation. A method can include cross-validation of parameters and best parameters, which can be provided for model training.

The TENSORFLOW framework can run on multiple CPUs and GPUs (with optional CUDA (NVIDIA Corp., Santa Clara, California) and SYCL (The Khronos Group Inc., Beaverton, Oregon) extensions for general-purpose computing on graphics processing units (GPUs)). TENSORFLOW is available on 64-bit LINUX, MACOS (Apple Inc., Cupertino, California), WINDOWS (Microsoft Corp., Redmond, Washington), and mobile computing platforms including ANDROID (Google LLC, Mountain View, California) and IOS (Apple Inc.) operating system based platforms.

TENSORFLOW computations can be expressed as stateful dataflow graphs; noting that the name TENSORFLOW derives from the operations that such neural networks perform on multidimensional data arrays. Such arrays can be referred to as "tensors".

As an example, a device may utilize TENSORFLOW LITE (TFL) or another type of lightweight framework. TFL is a set of tools that enables on-device machine learning where models may run on mobile, embedded, and IoT devices. TFL is optimized for on-device machine learning, by addressing latency (no round-trip to a server), privacy (no personal data leaves the device), connectivity (Internet connectivity is demanded), size (reduced model and binary size) and power consumption (e.g., efficient inference and a lack of network connections). TFL provides multiple platform support, covering ANDROID and iOS devices, embedded LINUX, and microcontrollers. TFL provides diverse language support, which includes JAVA, SWIFT, Objective-C, C++, and PYTHON. TFL provides high performance, with hardware acceleration and model optimization. Machine learning tasks may include, for example, image classification, regression, prediction, object detection, pose estimation, question answering, text classification, etc., on multiple platforms.

As an example, a method can include generating equipment specifications for a facility project at a field site by simulating physical phenomena using one or more computational simulators; using the equipment specifications and a computational facility planner system, generating a work breakdown structure for the facility project, where the work breakdown structure represents activities to be performed to deliver a defined scope of the facility project within a defined time; rendering a graphical user interface to a display that includes graphical controls for dependencies of the activities and equipment characterized by the equipment specifications; responsive to input received via one or more of the graphical controls, automatically updating at least durations of the activities; and, based at least in part on the updating, generating an optimal scenario for the facility project. In such an example, the facility project can be or include an oil and gas project for handling fluid produced by a reservoir of the field site.

As an example, equipment can include at least one separator for separating fluids produced from a reservoir of the field site.

As an example, a work breakdown structure may further account for a defined cost. For example, a defined cost can accounts for energy content of fluid produced from a reservoir of the field site and energy consumed for operation of at least a portion of the equipment. In such an example, defined cost can account for energy consumed for construction for the facility project.

As an example, an optimal scenario can be a solution to a triple constraint problem. As mentioned, a method can include solving a planning problem using a planning framework, which may provide a digital plan suitable for execution in the field and/or for simulation of one or more operations, physical phenomena, etc.

As an example, a facility project can account for emissions. For example, emissions can account for carbon emissions associated with operation of equipment at a field site and/or emissions can account for carbon emissions of fluid produced from a reservoir of a field site.

As an example, an optimal scenario can adhere to lifecycle analysis factors and/or an optimal scenario can adhere to cradle-to-cradle analysis factors.

As an example, a method can include rendering scheduling graphical controls to a display. For example, consider, responsive to input received via a scheduling graphical controls, adjusting at least one duration of at least one activity. In such an example, a method can include, responsive to the adjusting, determining a total time for a facility project, comparing the total duration to a defined time, and, based on the total time exceeding the defined time, rendering a recommendation to revise one or more of the activities of a work breakdown structure.

As an example, a method can include implementing a computational planning framework that solves a planning problem based on a work breakdown structure to generate a timeline for activities of a facility project. In such an example, the computational planning framework may utilize a planning domain definition language planner. As an example, a method can include comparing a timeline for activities of a facilities project to a previously generated timeline for the facility project. In such an example, one or more opportunities for optimization may be identified, which may result in rendering of one or more recommendations, executing one or more simulations, etc.

As an example, a system can include a processor; a memory accessible to the processor; processor-executable instructions stored in the memory and executable by the processor to instruct the system to: generate equipment specifications for a facility project at a field site by simulating physical phenomena using one or more computational simulators; using the equipment specifications and a computational facility planner system, generate a work breakdown structure for the facility project, where the work breakdown structure represents activities to be performed to deliver a defined scope of the facility project within a defined time; render a graphical user interface to a display that includes graphical controls for dependencies of the activities and equipment characterized by the equipment specifications; responsive to input received via one or more of the graphical controls, automatically update at least durations of the activities; and, based at least in part on the update, generate an optimal scenario for the facility project.

As an example, one or more computer-readable media can include computer-executable instructions executable by a system to instruct the system to: generate equipment specifications for a facility project at a field site by simulating physical phenomena using one or more computational simulators; using the equipment specifications and a computational facility planner system, generate a work breakdown structure for the facility project, where the work breakdown structure represents activities to be performed to deliver a defined scope of the facility project within a defined time; render a graphical user interface to a display that includes graphical controls for dependencies of the activities and equipment characterized by the equipment specifications; responsive to input received via one or more of the graphical controls, automatically update at least durations of the activities; and, based at least in part on the update, generate an optimal scenario for the facility project.

As an example, a computer program product can include one or more computer-readable storage media that can include processor-executable instructions to instruct a computing system to perform one or more methods and/or one or more portions of a method.

Figure 38:
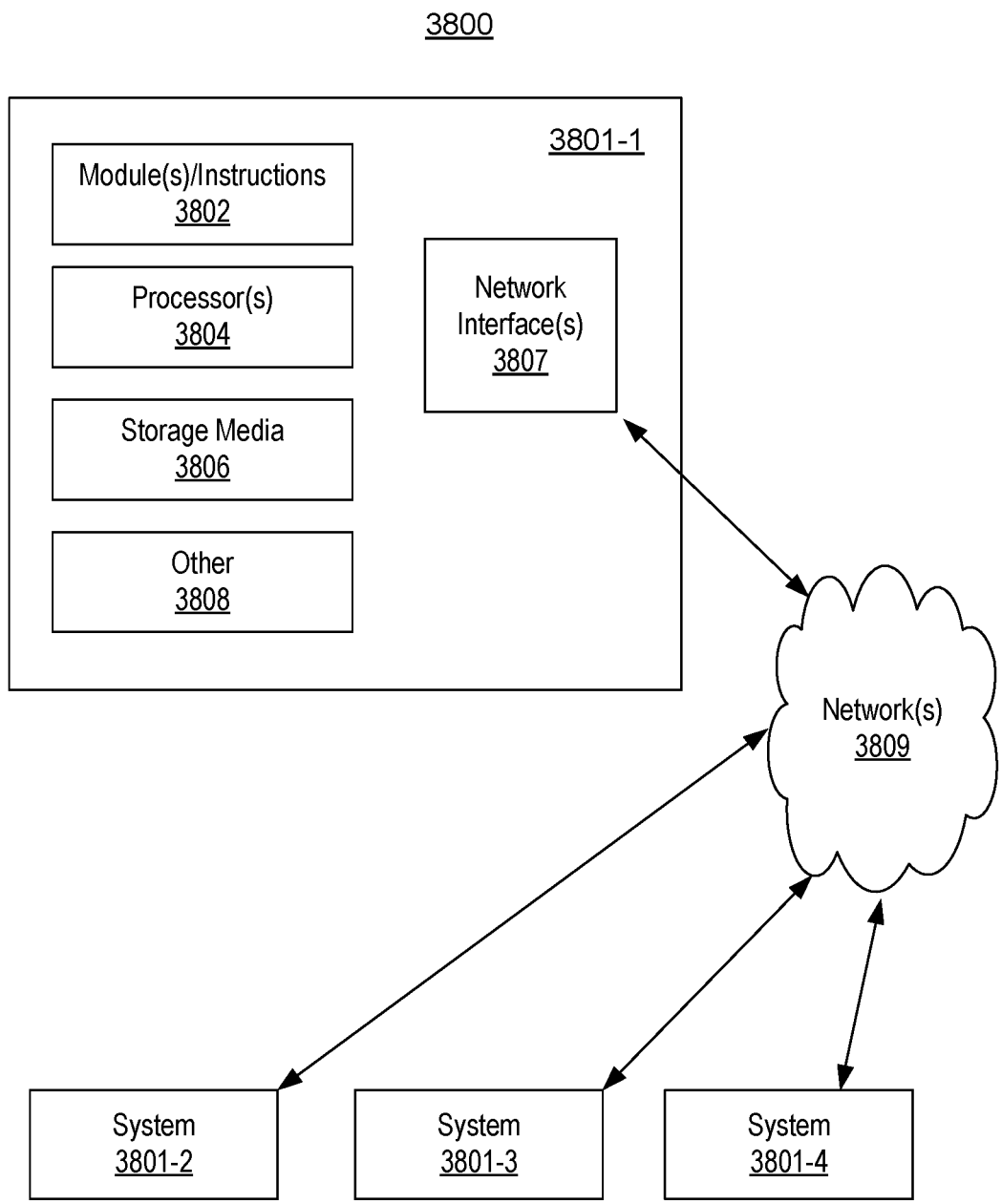
FIG. 38 illustrates examples of computer and network equipment.

In some embodiments, a method or methods may be executed by a computing system. FIG. 38 shows an example of a system 3800 that can include one or more computing systems 3801-1, 3801-2, 3801-3 and 3801-4, which may be operatively coupled via one or more networks 3809, which may include wired and/or wireless networks.

As an example, a system can include an individual computer system or an arrangement of distributed computer systems. In the example of FIG. 38, the computer system 3801-1 can include one or more modules 3802, which may be or include processor-executable instructions, for example, executable to perform various tasks (e.g., receiving information, requesting information, processing information, simulation, outputting information, etc.).

As an example, a module may be executed independently, or in coordination with, one or more processors 3804, which is (or are) operatively coupled to one or more storage media 3806 (e.g., via wire, wirelessly, etc.). As an example, one or more of the one or more processors 3804 can be operatively coupled to at least one of one or more network interface 3807. In such an example, the computer system 3801-1 can transmit and/or receive information, for example, via the one or more networks 3809 (e.g., consider one or more of the Internet, a private network, a cellular network, a satellite network, etc.). As shown, one or more other components 3808 can be included.

As an example, the computer system 3801-1 may receive from and/or transmit information to one or more other devices, which may be or include, for example, one or more of the computer systems 3801-2, etc. A device may be located in a physical location that differs from that of the computer system 3801-1. As an example, a location may be, for example, a processing facility location, a data center location (e.g., server farm, etc.), a rig location, a wellsite location, a downhole location, etc.

As an example, a processor may be or include a microprocessor, microcontroller, processor module or subsystem, programmable integrated circuit, programmable gate array, or another control or computing device.

As an example, the storage media 3806 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

FIG. 39 shows components of an example of a computing system 3900 and an example of a networked system 3910 with a network 3920. The system 3900 includes one or more processors 3902, memory and/or storage components 3904, one or more input and/or output devices 3906 and a bus 3908. In an example embodiment, instructions may be stored in one or more computer-readable media (e.g., memory/storage components 3904). Such instructions may be read by one or more processors (e.g., the processor(s) 3902) via a communication bus (e.g., the bus 3908), which may be wired or wireless. The one or more processors may execute such instructions to implement (wholly or in part) one or more attributes (e.g., as part of a method). A user may view output from and interact with a process via an I/O device (e.g., the device 3906). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 3910. The network system 3910 includes components 3922-1, 3922-2, 3922-3, ... 3922-N. For example, the components 3922-1 may include the processor(s) 3902 while the component(s) 3922-3 may include a memory accessible by the processor (s) 3902. Further, the component(s) 3922-2 may include an I/O device for display and optionally interaction with a method. A network 3920 may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH, satellite, etc.). As an example, a mobile device may include components such as a main processor, a memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method comprising:
    receiving a set of design parameters including at least one of equipment specifications or a process for a facility project at a field site;
    generating, by performing a plurality of simulations using the set of design parameters, a plurality of scenarios associated with the facility project, wherein each scenario included in the plurality of scenarios includes a respective work breakdown structure for the facility project, wherein each respective work breakdown structure represents activities to be performed to deliver a defined scope of the facility project within a defined time;
    rendering a framework graphical user interface to a display that comprises respective visual representations of the plurality of scenarios and a first graphical control for modifying the set of design parameters,
        wherein the set of design parameters further includes at least one of dependencies of the activities, equipment characterized by the equipment specifications, or bulks and labor for at least a portion of the dependencies;
    responsive to receiving input via the first graphical control, altering one or more design parameters included in the set of design parameters;
    dynamically updating the plurality of scenarios based on the altering of the one or more design parameters;
    determining, for each respective scenario included in the plurality of scenarios, a respective solution to a multi-variable problem of at least scope, cost, and duration, wherein determining a respective solution includes sequencing the activities based at least in part on determined activity costs and durations of the activities of the work breakdown structure to establish a respective overall duration estimate for the facility project, wherein an activity cost comprises a labor cost, and wherein a duration of a corresponding activity is determined using the labor cost,
    wherein the respective visual representations of the plurality of scenarios each include a respective spider chart that depicts a plurality of performance indicators associated with the respective solution to the multi-variable problem;
    generating, by comparing the respective solutions to the multi-variable problem, a recommendation for an optimal scenario included in the plurality of scenarios for the facility project and an associated facility project cost;
    rendering, to the display, the recommendation within the respective spider chart of the optimal scenario in the framework graphical user interface;
    responsive to receiving a selection of a second graphical control associated with the visual representation of the optimal scenario, modifying at least one of a scope, a cost, or a time associated with the optimal scenario;
    rendering, to the display, at least one button for executing the optimal scenario; and
    responsive to receiving selection of the at least one button, transmitting a command to field equipment to perform at least one field operation included in the work breakdown structure of the optimal scenario, wherein the field equipment includes at least one of drilling equipment, wireline equipment, or fracturing equipment.

2. The method of claim 1, wherein the facility project comprises an oil and gas project for handling fluid produced by a reservoir of the field site.

3. The method of claim 1, wherein the equipment comprises at least one separator for separating fluids produced from a reservoir of the field site.

4. The method of claim 1, wherein the work breakdown structure further accounts for a defined cost.

5. The method of claim 4, wherein the defined cost accounts for energy content of fluid produced from a reservoir of the field site and energy consumed for operation of at least a portion of the equipment.

6. The method of claim 5, wherein the defined cost accounts for energy consumed for construction for the facility project.

7. The method of claim 1, wherein the multi-variable problem accounts for emissions.

8. The method of claim 7, wherein the emissions account for carbon emissions associated with one or more of construction, operation and decommissioning of equipment at the field site.

9. The method of claim 7, wherein the emissions account for carbon emissions of fluid produced from a reservoir of the field site over a span of time.

10. The method of claim 1, wherein the optimal scenario adheres to life-cycle analysis factors.

11. The method of claim 1, wherein the optimal scenario adheres to cradle-to-cradle analysis factors.

12. The method of claim 1, further comprising rendering scheduling graphical controls to the display.

13. The method of claim 12, further comprising:
responsive to input received via one or more of the scheduling graphical controls, adjusting at least one of the durations of the activities.

14. The method of claim 13, further comprising:
responsive to the adjusting, determining the respective overall duration estimate for the facility project, comparing the respective overall duration estimate to the defined time, and, based on the respective overall duration estimate exceeding the defined time, rendering a recommendation to revise one or more of the activities of the work breakdown structure.

15. The method of claim 1, further comprising implementing a computational planning framework that solves a planning problem based on the work breakdown structure to generate a timeline for the activities of the facility project.

16. The method of claim 15, wherein the computational planning framework utilizes a planning domain definition language planner.

17. The method of claim 15, further comprising:
comparing the timeline for the activities of the facilities project to a previously generated timeline for the facility project.

18. A system comprising:
a processor;
a memory accessible to the processor;
processor-executable instructions stored in the memory and executable by the processor to instruct the system to:
receive a set of design parameters including at least one of equipment specifications or a process for a facility project at a field site;
generate, by performing a plurality of simulations using the set of design parameters, a plurality of scenarios associated with the facility project, wherein each scenario included in the plurality of scenarios includes a respective work breakdown structure for the facility project, wherein each respective work breakdown structure represents activities to be performed to deliver a defined scope of the facility project within a defined time;
render a framework graphical user interface to a display that comprises respective visual representations of the plurality of scenarios and a first graphical control for modifying the set of design parameters,
wherein the set of design parameters further includes at least one of dependencies of the activities, equipment characterized by the equipment specifications, or bulks and labor for at least a portion of the dependencies;
responsive to receiving input via the first graphical control, alter one or more design parameters included in the set of design parameters;
dynamically update the plurality of scenarios based on the altering of the one or more design parameters;
determine, for each respective scenario included in the plurality of scenarios, a respective solution to a multi-variable problem of at least scope, cost, and duration, wherein determining a respective solution includes sequencing the activities based at least in part on determined activity costs and durations of the activities of the work breakdown structure to establish a respective overall duration estimate for the facility project, wherein an activity cost comprises a labor cost, and wherein a duration of a corresponding activity is determined using the labor cost,
wherein the respective visual representations of the plurality of scenarios each include a respective spider chart that depicts a plurality of performance indicators associated with the respective solution to the multi-variable problem;
generate, by comparing respective solutions to the multi-variable problem, a recommendation for an optimal scenario included in the plurality of scenarios for the facility project and an associated facility project cost;
render, to the display, the recommendation within the respective spider chart of the optimal scenario in the framework graphical user interface;
responsive to receiving a selection of a second graphical control associated with the visual representation of the optimal scenario, modify at least one of a scope, a cost, or a time associated with the optimal scenario;
render, to the display, at least one button for executing the optimal scenario; and
responsive to receiving selection of the at least one button, transmit a command to field equipment to perform at least one field operation included in the work breakdown structure of the optimal scenario, wherein the field equipment includes at least one of drilling equipment, wireline equipment, or fracturing equipment.

19. One or more computer-readable media comprising computer- executable instructions executable by a system to instruct the system to:
receive a set of design parameters including at least one of equipment specifications or a process for a facility project at a field site;
generate, by performing a plurality of simulations using the set of design parameters, a plurality of scenarios associated with the facility project, wherein each scenario included in the plurality of scenarios includes a respective work breakdown structure for the facility project, wherein each respective work breakdown structure represents activities to be performed to deliver a defined scope of the facility project within a defined time;
render a framework graphical user interface to a display that comprises respective visual representations of the plurality of scenarios and a first graphical control for modifying the set of design parameters,
wherein the set of design parameters further includes at least one of dependencies of the activities, equipment characterized by the equipment specifications, or bulks and labor for at least a portion of the dependencies;

responsive to receiving input via the first graphical control, alter one or more design parameters included in the set of design parameters;

dynamically update the plurality of scenarios based on the altering of the one or more design parameters;

determine, for each respective scenario included in the plurality of scenarios, a respective solution to a multi-variable problem of at least scope, cost, and duration, wherein determining a respective solution includes sequencing the activities based at least in part on determined activity costs and durations of the activities of the work breakdown structure to establish a respective overall duration estimate for the facility project, wherein an activity cost comprises a labor cost, and wherein a duration of a corresponding activity is determined using the labor cost, wherein the respective visual representations of the plurality of scenarios each include a respective spider chart that depicts a plurality of performance indicators associated with the respective solution to the multi-variable problem;

generate, by comparing respective solutions to the multi-variable problem, a recommendation for an optimal scenario included in the plurality of scenarios for the facility project and an associated facility project cost;

render, to the display, the recommendation within the respective spider chart of the optimal scenario in the framework graphical user interface;

responsive to receiving a selection of a second graphical control associated with the visual representation of the optimal scenario, modify at least one of a scope, a cost, or a time associated with the optimal scenario;

render, to the display, at least one button for executing the optimal scenario; and responsive to receiving selection of the at least one button, transmit a command to field equipment to perform at least one field operation included in the work breakdown structure of the optimal scenario, wherein the field equipment includes at least one of drilling equipment, wireline equipment, or fracturing equipment.

* * * * *